United States Patent [19]
Matsumoto et al.

[11] Patent Number: 5,592,502
[45] Date of Patent: Jan. 7, 1997

[54] SEMICONDUCTOR LASER ELEMENT AND METHOD FOR ADJUSTING SELF-INDUCED OSCILLATION INTENSITY OF THE SAME

[75] Inventors: Mitsuhiro Matsumoto, Kashihara; Ken Ohbayashi, Tenri, both of Japan

[73] Assignee: Sharp Kabushiki Kaisha, Osaka, Japan

[21] Appl. No.: 327,452

[22] Filed: Oct. 21, 1994

[30] Foreign Application Priority Data

Oct. 22, 1993 [JP] Japan .................... 5-265121
Sep. 14, 1994 [JP] Japan .................... 6-220677

[51] Int. Cl.⁶ .................................. H01S 3/18
[52] U.S. Cl. .................................. 372/45; 372/46
[58] Field of Search .................................. 372/45, 46

[56] References Cited

U.S. PATENT DOCUMENTS

| | | | |
|---|---|---|---|
| 4,757,510 | 7/1988 | Kaneno et al. | 372/45 |
| 4,941,146 | 7/1990 | Kobayashi | 372/46 |
| 5,111,470 | 5/1992 | Hosoba et al. | |
| 5,355,384 | 10/1994 | Inoue et al. | 372/45 |
| 5,386,429 | 1/1995 | Naito et al. | 372/46 |

FOREIGN PATENT DOCUMENTS

| | | | |
|---|---|---|---|
| 3-209897 | 9/1991 | Japan | 372/45 |
| 4-266079 | 9/1992 | Japan . | |

Primary Examiner—Rodney B. Bovernick
Assistant Examiner—Yisun Song
Attorney, Agent, or Firm—Morrison & Foerster LLP

[57] ABSTRACT

A semiconductor laser element includes: a semiconductor laminated structure for emitting a laser light, including an active layer interposed between a first cladding layer of a first-conductivity type and a second cladding layer of a second-conductivity type, the first cladding layer and the semiconductor layer having lower refractive indices than that of the active layer; and a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer, wherein the refractive index of the first cladding layer is larger than that of the second cladding layer in the semiconductor laminated structure, and the semiconductor laminated structure includes at least one semiconductor layer of the first-conductivity type having a lower refractive index than that of the first cladding layer, disposed between the first cladding layer and the active layer.

42 Claims, 23 Drawing Sheets

FIG. 20     *PRIOR ART*
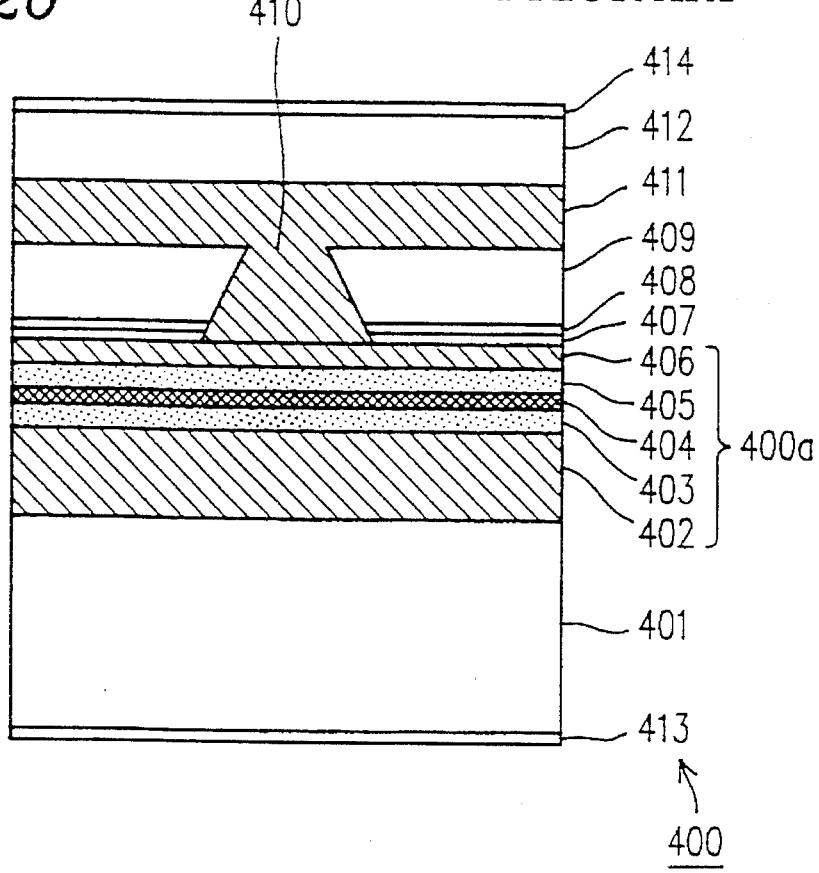
FIG. 21     *PRIOR ART*
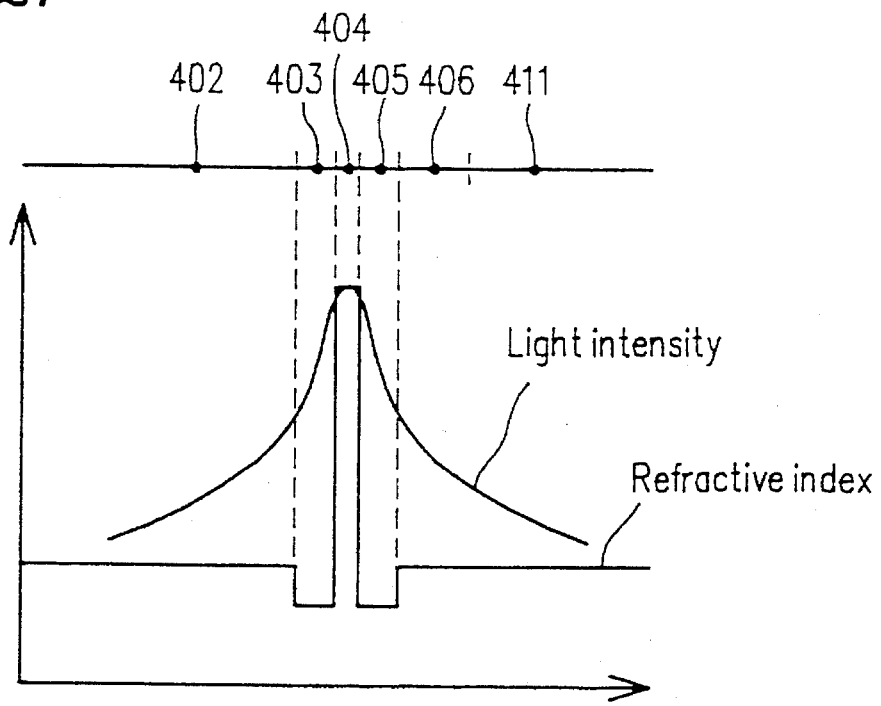

FIG. 36                     PRIOR ART
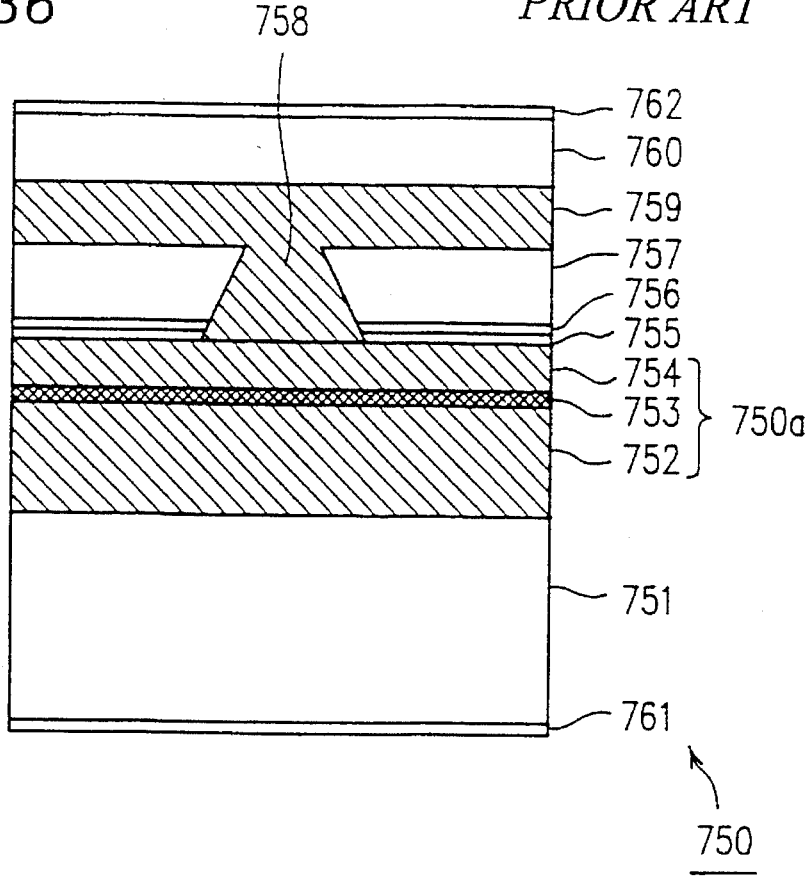
FIG. 37                     PRIOR ART
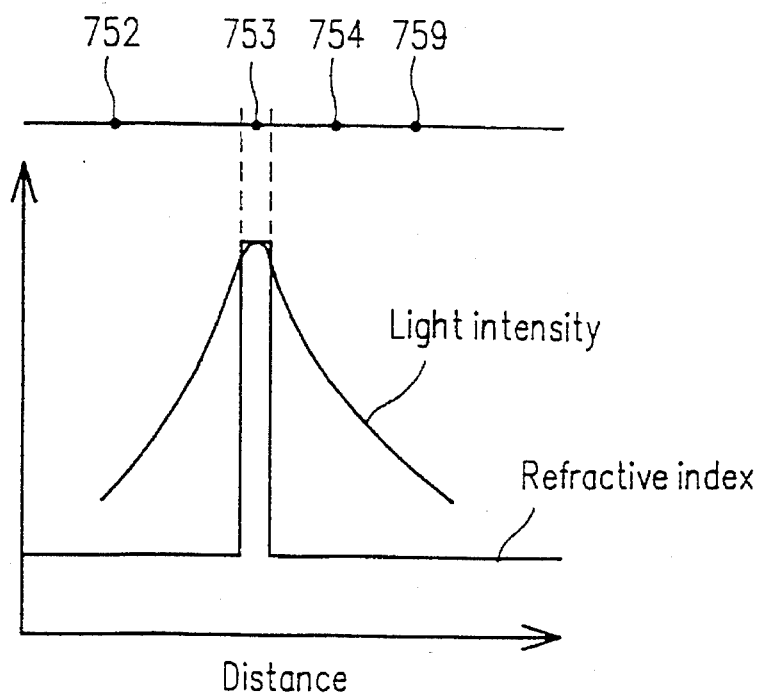

FIG. 40 *PRIOR ART*
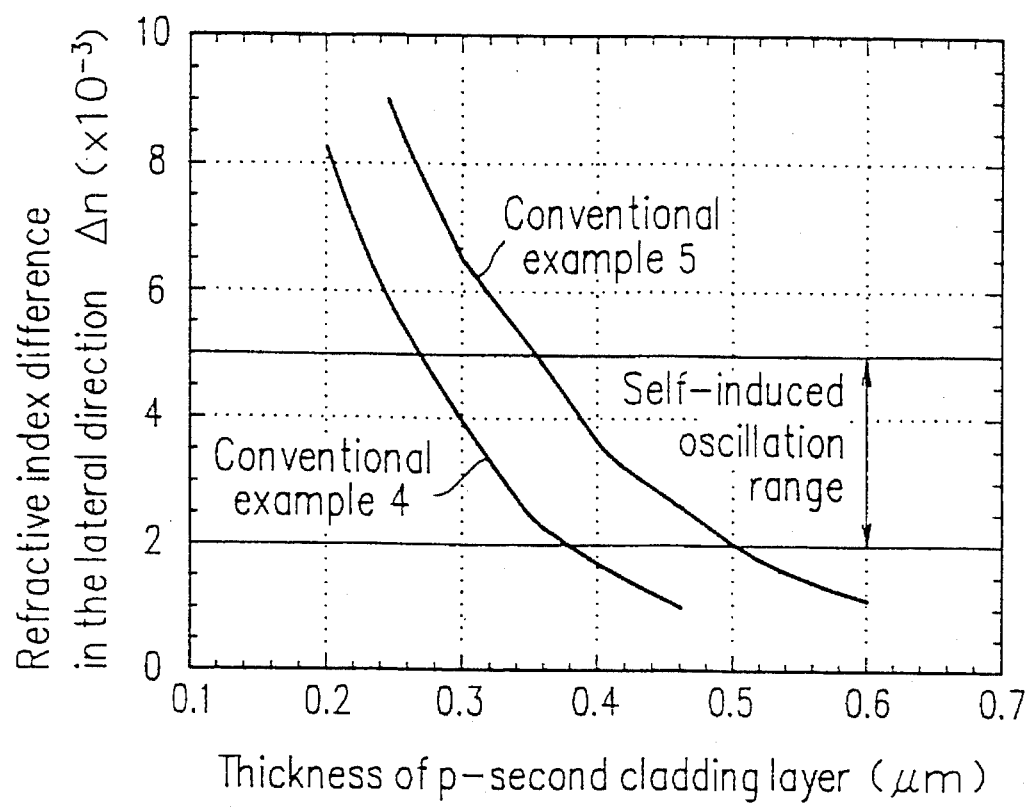
FIG. 41
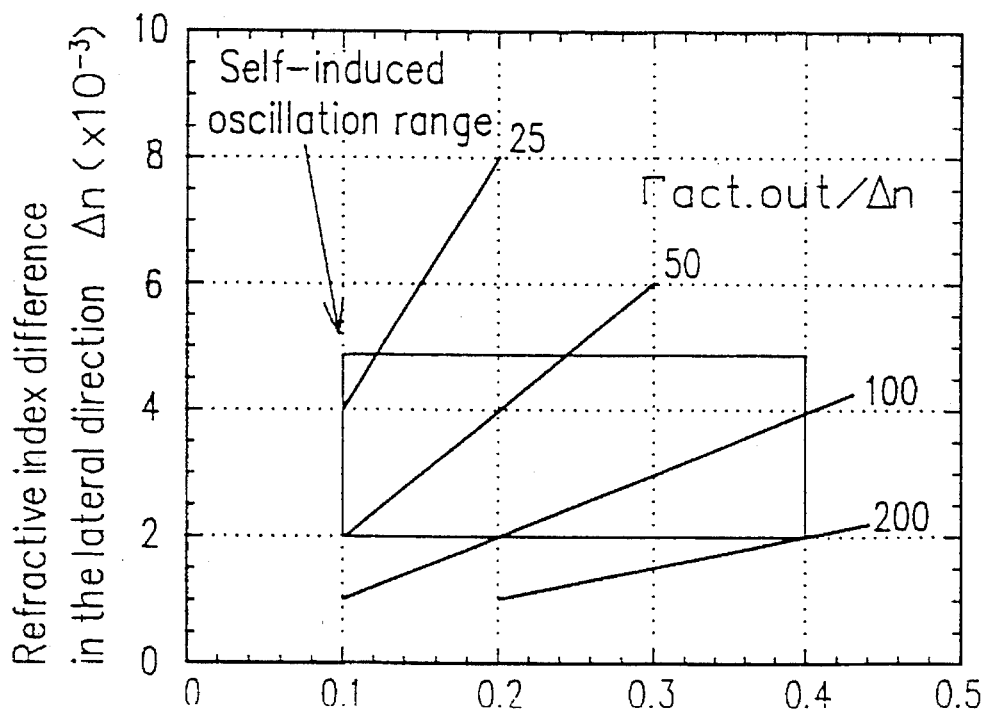

SEMICONDUCTOR LASER ELEMENT AND METHOD FOR ADJUSTING SELF-INDUCED OSCILLATION INTENSITY OF THE SAME

BACKGROUND OF THE INVENTION

1. Field of the Invention

The present invention relates to a semiconductor laser element and a method for adjusting self-induced oscillation intensity of the same. In particular, the present invention relates to an improvement of the electrical and optical characteristics of a high-power and a low-power semiconductor laser elements having a low noise characteristic used for optical disks and the like.

2. Description of the Related Art

Semiconductor lasers are widely used as light sources of optical disk apparatuses. In the case where a signal is recorded onto an optical disk, a high-power semiconductor laser having a light output of 30 mW or more is used. The high-power semiconductor laser is also used for reproducing the signals.

The high-power laser for recording and reproducing signals is required to have the following performance.

(1) First, noise induced by a return light from the optical disk or any other optical parts while the signals are reproduced is to be low.

(2) Second, ellipticity of light emitted from the laser element (emitted laser light) is to be small so as to enhance optical coupling efficiency with a collimator lens. The ellipticity of emitted laser light herein represents a ratio ($\theta\perp/\theta<$) of a half width $\theta\perp$ of a divergent angle (radiation angle) of the emitted laser light in a direction perpendicular to an active layer in a face perpendicular to a direction of length of resonator of the laser element to a half width $\theta<$ of a divergent angle (radiation angle) of the emitted laser light in a parallel direction to the active layer of the laser element. More specifically, the ellipticity ($\theta\perp/\theta<$) is 2.5 or less. The above half width $\theta\perp$ depends on the thickness of the active layer of the laser element and a composition ratio of a cladding layer. Since the value of the above $\theta\perp$ is within the range of 20° to 28°, $\theta<$ is required to be 11° or more.

(3) Third, a driving current and a driving voltage should be as low as possible so as to lower electric power consumed by the semiconductor laser element.

As for the noise of the laser element described in (1), since a conventional high-power laser has an oscillation longitudinal mode which is a single mode and has high coherence in terms of time, noise is likely to be induced by the return light. In order to avoid this problem, the following high-frequency superimposing method is adopted. The driving current is superimposed by a high-frequency signal during reproduction of the signal so as to alter the oscillation mode of the laser into a longitudinal multimode, thereby lowering the coherence of time. As a result, the effect of the return light is reduced.

However, the high-frequency superimposing method requires a high-frequency circuit. Therefore, there is a problem in miniaturizing a driving circuit and lowering the consumption power of the apparatus. Studies utilizing a self-induced oscillation phenomenon have been extensively pursued so that the noise can be reduced without using a high-frequency superimposing circuit (Reference: Singaku Giho OQE (Optical and Quantum Electronics) 88-5, Tanaka et al).

In the state of self-induced oscillation, although the laser is driven by a constant current, the intensity of the laser light is not constant but varied along with time in high-frequencies of 1 GHz or more. As described above, when the intensity of the emitted laser light is varied along with time, the width of the oscillation wavelength is increased and the oscillation spectrum is made to have a multimode, thereby lowering the coherence of the emitted laser light. As a result, the interference between the emitted laser light and its return light is restrained in order to reduce the noise.

Hereinafter, a structure of a conventional high-power semiconductor laser element which is designed so as to assure self-induced oscillation will be described.

Conventional Example 1

FIG. 13 is a cross-sectional view showing a structure of a conventional self-induced oscillation type high-power laser element (see Japanese Laid-Open Patent Publication No. 3-296290). In FIG. 13, the reference numeral 200 denotes a conventional self-induced oscillation type high-power laser element. In the laser element 200, a semiconductor laminated structure 200a for emitting laser light is formed on an n-GaAs substrate 201. The semiconductor laminated structure 200a includes an active layer 203 interposed between a first cladding layer 202 and a second cladding layer 204 having lower refractive indices than that of the active layer 203.

The active layer 203 consists of an undoped $Al_{0.13}Ga_{0.87}As$ layer having a thickness of 0.05 μm. The first cladding layer 202 and the second cladding layer 204 consist of an n-$Al_{0.5}Ga_{0.5}As$ layer having a thickness of 1.5 μm and a p-$Al_{0.5}Ga_{0.5}As$ layer having a thickness of 0.45 μm, respectively.

On the second cladding layer 204, a p-GaAs epitaxial growth promoting layer 205 having a thickness of 0.01 μm and a p-$Al_{0.6}Ga_{0.4}$ etching stop layer 206 (hereinafter, referred to simply as p-etching stop layer 206) having a thickness of 0.02 μm are successively formed. Furthermore, a current light confining layer 207 is formed on the p-etching stop layer 206. The current light confining layer 207 consists of an n-$Al_{0.1}Ga_{0.9}As$ layer having a thickness of 1.0 μm. On the middle portion of the second cladding layer 204, a stripe-shaped groove 208 having a width of 3.5 μm penetrating the current light confining layer 207, the p-etching stop layer 206 and the epitaxial growth promoting layer 205 to reach the second cladding layer 204 is formed.

On the current light confining layer 207 and the stripe-shaped groove 208, a p-$Al_{0.5}Ga_{0.5}As$ layer having a thickness of 2.0 μm is formed as a third cladding layer 209.

A strip-shaped semiconductor layer which consists of the p-$Al_{0.5}Ga_{0.5}As$ layer filling the stripe-shaped groove 208 and the current light confining layer 207 formed on the both sides thereof constitute a current light confining means for confining a laser driving current and a laser light within a region of the active layer 203 corresponding to the stripe-shaped groove 208.

On the third cladding layer 209, a p-GaAs contact layer 210 having a thickness of 5.0 μm is formed. A p-electrode 212 is formed on the contact layer 210, and an n-electrode 211 is formed on the back face of the n-GaAs substrate 201.

In the laser element 200, a length of the resonator is set at 375 μm. Moreover, an $Al_2O_3$ film (not shown) is formed on a light emitting end face so as to have a reflectance of 12%, and a multilayer film (not shown) which consists of the $Al_2O_3$ film and an Si film is formed on an end face on the side opposite to the light emitting end face so as to have a reflectance of 75%.

Next, a method for fabricating a semiconductor laser element will be described.

First, the n-$Al_{0.5}Ga_{0.5}As$ layer serving as the first cladding layer 202, the undoped $Al_{0.13}Ga_{0.87}As$ layer serving as the active layer 203, and the p-$Al_{0.5}Ga_{0.5}As$ layer serving as the second cladding layer 204 are grown on the n-GaAs substrate 201 in this order so as to have predetermined thicknesses, respectively. With this process, the semiconductor laminated structure 200a for emitting a laser light is formed.

Subsequently, the p-GaAs epitaxial growth promoting layer 205 and the p-etching stop layer 206 are formed on the second cladding layer 204 in this order. On the p-etching stop layer 206, the n-$Al_{0.5}Ga_{0.5}As$ layer is grown. Then, the stripe-shaped groove 208 is formed in a predetermined region so as to reach the p-GaAs layer 205 from the surface of the n-$Al_{0.5}Ga_{0.5}As$ layer.

Next, the third cladding layer 209 having a flat surface is formed by growing the p-$Al_{0.5}Ga_{0.5}As$ layer so as to fill the stripe-shaped groove 208 on the current light confining layer 207 while removing part of the p-GaAs layer 205 exposed in the stripe-shaped groove 208. Then, the p-GaAs contact layer 210 is formed on the third cladding layer 209. Thereafter, the n-electrode 211 and the p-electrode 212 are formed on the back face of the n-GaAs substrate 201 and the p-GaAs contact layer 210, respectively.

After the resonator end faces are formed by the cleavage of wafer and the like, the $Al_2O_3$ film is formed on the light emitting end face, and the multi layer film which consists of the $Al_2O_3$ film and the Si film is formed on the end face of the opposite side thereto. Then, a laser chip is cleaved from the wafer by a predetermined process. The laser chip (semiconductor laser element) is mounted in a package, for example, by using a soldering material, thereby completing an optical device.

FIG. 14 shows the refractive index profile and the light intensity profile in a layer thickness direction inside the stripe-shaped groove 208 of the semiconductor laser element 200 as described above.

The refractive index of the active layer 203 is higher than those of the cladding layers 204 and 202 sandwiching the active layer 203. The light intensity profile, which corresponds to the refractive index profile, has the peak (maximum value) in the region of the active layer 203. In the semiconductor laser element 200, the half width $\theta\perp$ of the radiation angle of the emitted laser light in the direction perpendicular to the active layer in the face perpendicular to the direction of resonator length (hereinafter, referred to as the radiation angle in the perpendicular direction) is 25°.

Hayashi et al. proved that the self-induced oscillation is likely to be caused in the case where the difference (equivalent refractive index difference) $\Delta n$ between the equivalent refractive index (inner equivalent refractive index) in the thickness direction inside the stripe-shaped groove 208 and the equivalent refractive index (outer equivalent refractive index) in the thickness direction outside the stripe-shaped groove 208 is within the range of $1\times10^{-3}$ to $5\times10^{-3}$ (Reference: Hayashi et al. OQE84-30).

Moreover, Tanaka et al. shows that the self-induced oscillation is likely to be caused in the case where the equivalent refractive index difference $\Delta n$ is within the range of $1\times10^{-3}$ to $3\times10^{-3}$ (Reference: Tanaka et al. OQE88-5).

The inventor experimentally verifies that the self-induced oscillation is likely to be caused in the case where the equivalent refractive index difference n is within the range of $1\times10^{-3}$ to $4\times10^{-3}$. The inventor further verifies that the self-induced oscillation is also likely to be caused in the case where a coefficient representing a rate of light confined in the active layer in the thickness direction outside the stripe-shaped groove (hereinafter, referred to as $\Gamma act.out$) is within the range of 0.12 to 0.30. The coefficient $\Gamma act.out$ represents the rate of the amount of light distributed in the thickness direction outside the stripe-shaped groove in the active layer to the total amount of light distributed in the thickness direction outside the stripe-shaped groove of the laser element.

FIG. 15 shows the relationship between the thickness of the p-second cladding layer 204 and the equivalent refractive index difference $\Delta n$. In the laser element 200 shown in FIG. 13, since the thickness of the p-second cladding layer 204 is 0.45 μm, the equivalent refractive index difference $\Delta n$ is $2.5\times10^{-3}$ as shown in FIG. 15. Thus, in the element, the equivalent refractive index difference $\Delta n$ is within the range allowing the self-induced oscillation.

FIG. 16 shows the relationship between the thickness of the p-second cladding layer 204 and the coefficient $\Gamma act.out$. In the laser element 200, the thickness of the p-second cladding layer 204 is 0.45 μm, the coefficient $\Gamma act.out$ is obtained to be 0.13 from FIG. 16. Therefore, in the laser element 200, the coefficient $\Gamma act.out$ is also within the range allowing the self-induced oscillation.

As described above, the semiconductor laser element 200 shown in FIG. 13 has a structure allowing the self-induced oscillation as indicated by the equivalent refractive index difference $\Delta n$ and the-coefficient $\Gamma act.out$. Therefore, since the self-induced oscillation is assured in the laser element 200, the noise for the return light is reduced.

FIG. 17 shows the relationship between the coefficient $\Gamma act.out$ and the half width $\theta<$ of the radiation angle of the emitted laser light parallel to the active layer (hereinafter, referred to as radiation angle in the horizontal direction). In the laser element 200 shown in FIG. 13, the half width $\theta<$ corresponding to a value of the coefficient $\Gamma act.out$ (=0.13) is, as shown in FIG. 17, 9.7°. Since the equivalent refractive index difference $\Delta n$ is reduced and therefore the amount of light confined in the horizontal direction is decreased, it is considered that the half width $\theta<$ is reduced.

Conventional Example 2

FIG. 18 is a cross-sectional view showing a conventional semiconductor laser element having an asymmetrical cladding layer structure (see Japanese Laid-Open Patent Publication No. 2-113586). In FIG. 18, the reference numeral 300 denotes a conventional semiconductor laser element. The laser element 300 is widely different from the conventional semiconductor laser element 200 shown in FIG. 13 in that in an asymmetrical cladding layer structure, the refractive index of an n-first cladding layer 302 of the substrate side is higher than that of the p-second cladding layer 304 of the light absorbing layer side. In FIG. 18, components 301 to 312 constituting the semiconductor laser element 300 correspond to the components 201 to 212 in the semiconductor laser element 200 shown in FIG. 13, respectively.

More specifically, an n-GaAs substrate is used as a substrate 300 in the semiconductor laser element 300. A first cladding layer 302 and a second cladding layer 304 consist of an n-$Al_{0.5}Ga_{0.5}As$ layer having a thickness of 2.0 μm and a p-$Al_{0.55}Ga_{0.45}As$ layer having a thickness of 0.30 μm, respectively. An active layer 303 consists of an undoped $Al_{0.13}Ga_{0.87}As$ layer having a thickness of 0.055 μm.

The first and second cladding layers 302 and 304 and the active layer 303 constitute a semiconductor laminated structure 300a for emitting the laser light. On the second cladding layer 302, a p-GaAs epitaxial growth promoting layer 305 having a thickness of 0.01 μm, a p-$Al_{0.6}Ga_{0.4}As$ etching stop layer 306 having a thickness of 0.02 μm, and an n-$Al_{0.1}Ga_{0.9}As$ current light confining layer 307 having a thickness of 1.0 μm are formed in this order.

On a predetermined region of the second cladding layer 304, a stripe-shaped groove 308 having a width of 3.5 μm penetrating from the surface of the n-current light confining layer 307 to the surface of the second cladding layer 304 is formed. On the stripe-shaped groove 308 and the n-current light confining layer 307, a third cladding layer 309 having a thickness of 2.0 μm which is made of p-$Al_{0.55}Ga_{0.45}As$ is formed. A p-electrode 312 is formed on a p-GaAs contact layer 310 having a thickness of 5.0 μm formed on the third cladding layer 309. An n-electrode 311 is formed on the back face of the substrate 301.

A length of the resonator of the laser element 300 is 375 μm. An $Al_2O_3$ film and an Si film are formed on a light emitting end face and an end face opposite thereto so as to have reflectances of 12% and 75%, respectively.

The fabrication method of the laser element 300 is the same as that of the laser element 200 shown in FIG. 13.

FIG. 19 shows the refractive index profile and the light intensity profile in the thickness direction inside the stripe-shaped groove 308 of the laser element 300. In this element 300, since the refractive index of the n-first cladding layer 302 on the substrate side is higher than that of the p-second cladding layer 304 on the side of the light absorbing layer, the light is distributed so that the light is less exuded in the light absorbing layer side than in the substrate side corresponding to the refractive index.

In this case, the thickness of the n-first cladding layer 302 is set at 2.0 μm so that the light is not absorbed in the n-GaAs substrate 301. Furthermore, the thickness of the active layer 303 is set at 0.055 μm which is larger than that of the active layer of the laser element 200 (see FIG. 13) so that the half width θ⊥ of the radiation angle in a vertical direction is set at 25°.

In the semiconductor laser element 300, the thickness of the p-second cladding layer 304 is set at 0.3 μm, whereby the equivalent refractive index difference Δn becomes $2.5 \times 10^{-3}$ as shown in FIG. 15. The coefficient Γact.out is obtained at 0.105 in FIG. 16. In this structure, although the equivalent refractive index difference Δn is within the range where the self-induced oscillation is assured, the coefficient Γact.out is out of the range where the self-induced oscillation is assured. Therefore, with these values, the self-induced oscillation hardly occurs. The half width θ< of the radiation angle in the horizontal direction corresponding to the coefficient Γact.out is, as shown in FIG. 17, 8.8 °.

Conventional Example 3

FIG. 20 is a cross-sectional view showing a conventional semiconductor laser element disclosed in Japanese Laid-Open Patent Publication No. 2-12885. In FIG. 20, the reference numeral 400 denotes a conventional semiconductor laser element. The laser element 400 is widely different from the conventional semiconductor laser element 200 shown in FIG. 13 and the conventional semiconductor laser element 300 shown in FIG. 14 in the following points. Semiconductor layers 403 and 405 having lower refractive indices than those of a first and a second cladding layers 402 and 406 are interposed between an active layer 404 and the first cladding layer 402, and between an active layer 404 and the second cladding layer 406, respectively.

More specifically, an n-GaAs substrate is used as a substrate 401 in the semiconductor laser element 400. The first cladding layer 402 and the second cladding layer 406 consist of an n-$Al_{0.5}Ga_{0.5}As$ layer having a thickness of 1.9 μm and a p-$Al_{0.5}Ga_{0.5}As$ layer having a thickness of 0.45 μm, respectively. An active layer 404 consists of an undoped $Al_{0.13}Ga_{0.87}As$ layer having a thickness of 0.07 μm.

A first low refractive index layer 403 having a thickness of 0.1 μm which is made of n-$Al_{0.55}Ga_{0.45}As$ is interposed between the active layer 404 and the first cladding layer 402. A second low refractive index layer 405 having a thickness of 0.1 μm which consists of p-$Al_{0.55}Ga_{0.45}As$ is interposed between the active layer 404 and the second cladding layer 406.

A semiconductor laminated structure 400a for emitting the laser light consists of the first and the second cladding layers 402 and 406, the active layer 404 and the first and the second low refractive index layers 403 and 405. On the second cladding layer 406, a p-GaAs epitaxial growth promoting layer 407 having a thickness of 0.01 μm, a p-$Al_{0.6}Ga_{0.4}As$ etching stop layer 408 having a thickness of 0.02 μm, and an n-$Al_{0.1}Ga_{0.9}As$ current light confining layer 409 having a thickness of 1.0 μm are formed.

On a predetermined region of the second cladding layer 406, a stripe-shaped groove 410 having a width of 3.5 μm penetrating from the surface of the n-current light confining layer 409 to the surface of the second cladding layer 406 is formed. A third cladding layer 411 having a thickness of 2.0 μm which consists of p-$Al_{0.5}Ga_{0.5}As$ is formed on the stripe-shaped groove 410 and the n-current light confining layer 409. A p-GaAs contact layer 412 having a thickness of 5.0 μm is formed on the third cladding layer 411, and a p-electrode 414 is formed on the p-GaAs contact layer 412. An n-electrode 413 is formed on the back face of the substrate 401.

A length of the resonator of the element is 375 μm. An $Al_2O_3$ film and an Si film are formed on a light emitting end face and an end face opposite thereto so as to have reflectances of 12% and 75%, respectively.

The fabrication method of the laser element 400 is different from those of the laser elements 200 and 300 in that the first and the second low refractive index layers are formed before and after the growth of the active layer 404 in the production process of the semiconductor laminated structure 400a.

FIG. 21 shows the refractive index profile and the light intensity profile in the thickness direction inside the stripe-shaped groove 410 of the laser element 400. In the element 400, since the active layer 404 is interposed between the n-first low refractive index layer 403 and the p-second low refractive index layer 405, the light is confined in the active layer 404 so as to have a relatively acute peak therein while being distributed so as to be widely exuded in the cladding layers 406 and 402 sandwiching these layers.

In the laser element 400, a thickness of the n-first cladding layer 402 is set at 2.0 μm so that light is not absorbed by the n-GaAs substrate 401. The thickness of the active layer 404 is set at 0.07 μm which is larger than that of the active layer of the semiconductor laser element 200 shown in FIG. 13 by 0.05 μm so that the half width θ⊥ of the radiation angle in the vertical direction is set at 25°.

In the element 400, the thickness of the p-second cladding layer 405 is set at 0.45 μm, whereby the equivalent refractive index difference Δn is $2.5 \times 10^{-3}$ and the coefficient Γact.out is 0.197, as shown in FIGS. 15 and 16. Since both of the values Δn and Γact.out are within the range where the self-induced oscillation is assured, the self-induced oscillation occurs. The half width θ< of the radiation angle in the horizontal direction corresponding to the coefficient Γact.out is, as shown in FIG. 17, 13.3°.

Hereinafter, other conventional semiconductor lasers will be described.

Semiconductor lasers having a wavelength band of 780 nm are widely used as light sources of disk apparatuses such as Compact Disks (CD's), Mini Disks (MD's), and Magneto-Optical (MO) disk apparatuses. These semiconductor disks are required to have the following performances (4) and (5) as described above in the requirements (1) and (3).

(4) The noise induced by the return light from the optical disk and other optical parts while the signals are reproduced is to be low.

(5) The consumption power is restrained by keeping the driving current and the driving voltage at levels as low as possible.

As for the reduction of noise of the laser return light described in the above (4), the use of the self-induced oscillation phenomenon of the semiconductor laser is widely studied (Reference: Hayashi et al. OQE 84-30, Tanaka et al. OQE 88-5). In the state of the self-induced oscillation, although the laser is driven with a constant current, the light intensity of the emitted light is not constant and therefore varied along with time in high-frequency of about 1 GHz. If the intensity of the laser light is varied along with time, the width of oscillation wavelength is increased and the oscillation spectrum is altered to be in multi-mode. As a result, the coherence of the laser light is lowered. Therefore, the interference between the emitted light and the return light is reduced, thereby lowering the noise.

Conventional Example 4

FIG. 36 shows a structure of a low-power semiconductor laser element for reproduction of signals only. In FIG. 36, the reference numeral 750 denotes the semiconductor laser element. This element adopts the structure described in the above Patent Application (see Japanese Laid-Open Patent Publication No. 3-296290). Components 751 to 762 in FIG. 36 constituting the semiconductor laser element 750 correspond to the components 201 to 212 of the semiconductor laser element 200 shown in FIG. 13, respectively.

More specifically, an n-GaAs substrate is used as a substrate 751 in the semiconductor laser element 750. A first cladding layer 752 and a second cladding layer 754 consist of an n-$Al_{0.5}Ga_{0.5}As$ layer having a thickness of 1.0 μm and a p-$Al_{0.5}Ga_{0.5}As$ layer having a thickness of 0.35 μm, respectively. An active layer 753 consists of an undoped $Al_{0.14}Ga_{0.86}As$ layer having a thickness of 0.08 μm.

A semiconductor laminated structure 750a is constituted by the first and second cladding layers 752 and 754 and the active layer 753. On the second cladding layer 752, a p-GaAs epitaxial growth promoting layer 755 having a thickness of 0.01 μm, a p-$Al_{0.6}Ga_{0.4}As$ etching stop layer 756 having a thickness of 0.02 μm, and an n-$Al_{0.1}Ga_{0.9}As$ current light confining layer 757 having a thickness of 1.0 μm are formed in this order.

On a predetermined region of the second cladding layer 754, a stripe-shaped groove 758 having a width of 3.5 μm penetrating from the surface of the n-current light confining layer 757 to the surface of the second cladding layer 754 is formed. A third cladding layer 759 having a thickness of 2.0 μm which consists of p-$Al_{0.5}Ga_{0.5}As$ is formed on the stripe-shaped groove 758 and the n-current light confining layer 757. On the third cladding layer 759, a p-GaAs contact layer 760 having a thickness of 5.0 μm is formed. On the p-GaAs contact layer 760 and on the back face of the substrate 751, a p-electrode 762 and an n-electrode 761 are formed, respectively.

The length of the resonator of the semiconductor laser element 750 is 200 μm. An $Al_2O_3$ film is formed on a light emitting end face so as to have a reflectance of 30%.

In the case where the semiconductor laser element 750 is driven with an output of 3 mW, the driving current and the driving voltage are 50 mA and 1.9 V, respectively.

FIG. 37 shows the refractive index profile in the thickness direction inside the stripe-shaped groove 758 of the semiconductor laser element 750 having the above-described structure. The light intensity is distributed so that light is confined in the active layer 753 in order to have the peak therein.

As mentioned above, Hayashi et al. proved that the self-induced oscillation is likely to occur in the case where the equivalent refractive index difference Δn is within the range of $1 \times 10^{-3}$ to $5 \times 10^{-3}$. The inventors found the following as to the self-induced oscillation of the semiconductor laser element, based on their experiments.

In the case where the equivalent refractive index difference Δn is within the range of $2 \times 10^{-3}$ to $5 \times 10^{-3}$ and the coefficient Γact.out representing the rate of the light confined in the active layer in the thickness direction outside the stripe-shaped groove is within the range of 0.10 to 0.40, the self-induced oscillation is likely to occur. Moreover, the intensity of self-induced oscillation is proportional to the ratio Γact.out/Δn. Therefore, the stronger the intensity of self-induced oscillation becomes, the more the noise of return light can be restrained. In particular, in the case where the ratio Γact.out/Δn is 50 or more, the intensity of self-induced oscillation is increased and therefore the noise of the return light can be sufficiently restrained.

FIG. 41 shows the relationship between Δn and Γact.out to indicate the range of self-induced oscillation and the ratio Γact.out/Δn. As is understood from FIG. 41, in order to sufficiently reduce the noise, it is sufficient to set Δn and Γact.out within the range allowing the self-induced oscillation and to set the ratio Γact.out/Δn at a value as large as possible, i.e., 50 or more.

FIG. 40 shows the relationship between the thickness of the p-second cladding layer and the equivalent refractive index difference Δn in the semiconductor laser element 750 shown in FIG. 36. In the laser element 750, the thickness of the p-second cladding layer 754 is 0.35 μm. In this case, the equivalent refractive index difference Δn is $2.5 \times 10^{-3}$ as shown in FIG. 40. Since Γact.out of the semiconductor laser element 750 is 0.26, the ratio Γact.out/Δn is 100. Therefore, as shown in FIG. 41, the obtained values are included within the range allowing self-induced oscillation and the ratio Γact.out/Δn is a relatively large value, i.e., more than 50, the noise can be sufficiently reduced in the laser element 750 having this structure.

Conventional Example 5

Next, a structure of a high-power laser element allowing a signal to be written will be briefly described.

Although the structure of the high-power laser element is the same as that of the laser element 750 shown in FIG. 36, the thickness of each layer is different.

More specifically, the thicknesses of the n-first cladding layer 752, the active layer 753, and the p-second cladding layer 754 are 2.0 µm, 0.05 µm and 0.50 µm, respectively. The length of the resonator of the laser element is 375 µm. An $Al_2O_3$ film and an Si film are formed on a light emitting end face and an end face opposite thereto so as to have reflectances of 12% and 75%, respectively.

In the case where the semiconductor laser element of Conventional Example 5 is driven with an output of 30 mW, the driving current and the driving voltage are 130 mA and 2.0 V, respectively.

In this laser element, the equivalent refractive index difference $\Delta n$ and the coefficient $\Gamma act.out$ are obtained to be $2.0 \times 10^{-3}$ and 0.13, respectively. These values are within the range allowing the self-induced oscillation shown in FIG. 41. Furthermore, the ratio $\Gamma act.out/\Delta n$ is 65. Since the ratio $\Gamma act.out/\Delta n$ is more than 50, i.e., a relatively large value, the noise can be sufficiently reduced.

Problem 1

In the laser element 200 having the structure of Conventional Example 1, if the equivalent refractive index difference $\Delta n$ is set at a small value such as about $2.5 \times 10^{-3}$ in order to cause the self-induced oscillation, the half width $\theta<$ of the radiation angle in the horizontal direction is 9.7°. In this case, since the half width $\theta\perp$ of the radiation angle in the vertical direction is 25°, the ellipticity of the emitted light is increased to be 2.5 or more. As a result, the optical coupling efficiency with the lens is lowered. Thus, the laser element 200 does not meet the requirement for performance described in the above (2).

The laser element 200 further has the following problems. FIG. 22 shows the relationship between the thickness of the p-second cladding layer 204 and an unavailable current flowing outside the stripe-shaped portion, that is, on the both sides of the stripe-shaped groove 208. FIG. 23 shows the relationship between the thickness of the p-second cladding layer 204 and the resistance in the p-second cladding layer 204.

In order to set the equivalent refractive index difference $\Delta n$ at about $2.5 \times 10^{-3}$ the thickness of the p-second cladding layer 204 should be increased to 0.45 µm. In this case, since the current more widely spreads to the region outside the stripe-shaped portion, the unavailable current flowing into the region outside the stripe-shaped portion is increased. Moreover, since the current flows through the p-second cladding layer 204, the resistance of the element increases as the p-second cladding layer 204 becomes thicker.

In the high-power laser element operated in a normal single mode, the thickness of the p-second cladding layer 204 is about 0.25 µm. However, if the thickness is increased to 0.45 µm, the unavailable current is increased by 8 mA as shown in FIG. 22. As shown in FIG. 23 the resistance of the element increases by 2.9 Ω.

As described above, since the unavailable current increases as the p-second cladding layer 204 becomes thicker, a large driving current is required and the resistance of the element is increased. As a result of this, the driving voltage becomes large. Thus, the element fails to meet the requirement of characteristic described in (3) above.

Problem 2

In the laser element 300 having a structure of Conventional Example 2, in the case where the equivalent refractive index difference $\Delta n$ is set at about $2.5 \times 10^{-3}$ in order to cause the self-induced oscillation, the thickness of the p-second cladding layer 304 is small as compared with that of the laser element 200 of Conventional Example 1. The thickness of the second cladding layer 304 is 0.3 µm in the laser element 300. With such a thickness, the problem of the increase in the driving current and the driving voltage is not caused. Thus, the laser element 300 satisfies the requirement of performance described in (3) above.

With this thickness, however, the light confining coefficient $\Gamma act.out$ of the active layer outside the stripe-shaped portion is lowered. Therefore, it is difficult to cause the self-induced oscillation. In other words, the laser element 300 does not satisfy the requirement described in (1) above. Furthermore, since the radiation angle $\theta<$ in the horizontal direction is small, i.e., 8.8° and therefore the optical coupling efficiency is small, the requirement described in (2) above is not also satisfied.

Problem 3

In the laser element 400 shown in FIG. 20, the light confining coefficient $\Gamma act.out$ of the active layer outside the stripe-shaped portion is large enough to cause the self-induced oscillation, as shown in FIG. 15.

For the reason described below, the radiation angle in the horizontal direction can be improved.

The degree of the light confined in the horizontal direction depends on the equivalent refractive index difference $\Delta n$ and the light absorption outside the stripe-shaped portion. A light absorption coefficient $\alpha$ out of the outside of the stripe-shaped portion can be classified into a light absorption coefficient $\alpha g.out$ of a transmitting light in the current light confining layer and a light absorption coefficient $\alpha act.out$ of the active layer outside the stripe-shaped portion. The light absorption coefficients $\alpha out$ can be represent by the following equation.

$$\alpha out = \alpha.out + \alpha act.out$$

The coefficient $\alpha act.out$ represents the degree of absorbed light when the density of carriers injected into the active layer is lowered outside the stripe-shaped portion and therefore the laser light is absorbed.

The range of the equivalent refractive index difference $\Delta n$ of $1 \times 10^{-3}$ to $4 \times 10^{-3}$ in the case where the self-induced oscillation occurs is considerably small as compared with the equivalent refractive index difference $\Delta n$ ($=\sim 10^{-2}$) of a normal laser. If the equivalent refractive index difference $\Delta n$ becomes so small that the self-induced oscillation occurs, the degree of the light exuded toward the region outside the stripe-shaped portion is increased. As a result, the effect of light absorption of the active layer outside the stripe-shaped portion increases. Thus, the degree of the confined light is determined by the effect of light absorption.

Since $\alpha act.out$ increases with the increase in the coefficient $\Gamma act.out$, the degree of the confined light in the horizontal direction is increased and therefore the radiation angle in the horizontal direction is increased. As described above, with the equivalent refractive index difference $\Delta n$ in the region where the self-induced oscillation occurs, the half width $\theta<$ of the radiation angle in the horizontal direction increases as $\Gamma act.out$ increases as shown in FIG. 17.

Since $\Gamma act.out$ is set at 0.197 in Conventional Example 3, the half width $\theta<$ in the horizontal direction is obtained to be 13.3° which is larger than those of the laser elements of Conventional Examples 1 and 2.

As in Conventional Example 1, however, the thickness of the p-second cladding layer 406 should be set at a large value, 0.45 µm in Conventional Example 3. Therefore, as shown in FIGS. 22 and 23, the unavailable current and the resistance of element increase, resulting in increase in the driving current and the driving voltage. Thus, the requirement of performance described in the above (3) is not satisfied.

Problem 4

In the semiconductor laser element 750 (Conventional Example 4) shown in FIG. 36, the p-second cladding layer should have a thickness of 0.26 µm or more in order to cause the self-induced oscillation. In the semiconductor laser element of Conventional Example 5, the p-second cladding layer should have a thickness of 0.35 µm or more. Furthermore, in order to increase the intensity of self-induced oscillation, the equivalent refractive index difference $\Delta n$ should be reduced. Therefore, the thicknesses of the p-second cladding layers should be set at the values, which are greater than the above values, as large as possible.

However, if the p-second cladding layer is thickened, the amount of unavailable current flowing toward the region outside the stripe-shaped portion and the resistance of element are increased. Such an increase results in an increase in the power consumed by the laser. Therefore, the requirement of the performance described in (4) above is not satisfied.

Thus, the equivalent refractive index difference $\Delta n$ is required to be reduced without considerably increasing the thickness of the p-second cladding layer. For such a purpose, it is effective to restrain the light from exuding into the current light confining layer 757. The suppression of exudation of the light can be achieved by setting the refractive indices of the p-second cladding layers of Conventional Examples 4 and 5 at a smaller value than that of the n-first cladding layer.

In this case, however, the rate of the light confined in the active layer is reduced in the element as a whole. Thus, since the coefficient $\Gamma act.out$, that is, the rate of the light confined in the active layer outside the stripe-shaped groove is lowered, the ratio $\Gamma act.out/\Delta n$ is reduced. As a result, there arises a problem in that the intensity of self-induced oscillation is reduced and therefore the noise cannot be sufficiently reduced.

SUMMARY OF THE INVENTION

A semiconductor laser element according to the present invention includes:
- a semiconductor laminated structure for emitting a laser light, including an active layer interposed between a first cladding layer of a first-conductivity type and a second cladding layer of a second-conductivity type, the first cladding layer and the semiconductor layer having lower refractive indices than that of the active layer; and
- a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer, wherein the refractive index of the first cladding layer is larger than that of the second cladding layer in the semiconductor laminated structure, and the semiconductor laminated structure includes at least one semiconductor layer of the first-conductivity type having a lower refractive index than that of the first cladding layer, disposed between the first cladding layer and the active layer.

In one embodiment of the invention, an intermediate layer having a refractive index which is higher than that of the semiconductor layer of the first-conductivity type and is lower than that of the active layer is interposed between the active layer and the semiconductor layer of the first-conductivity type.

In another embodiment of the invention, a refractive index of the semiconductor layer of the first-conductivity type is lower than that of the second cladding layer, and an intermediate layer having a lower refractive index than that of the second cladding layer is interposed between the active layer and the second cladding layer.

In still another embodiment of the invention, a difference in equivalent refractive indices in a thickness direction between inside and outside of the stripe-shaped semiconductor layer is set to be within a range of $1\times10^{-3}$ to $4\times10^{-3}$ and a rate of light confined in the active layer in the thickness direction outside the stripe-shaped semiconductor layer is set to be within a range of 0.12 to 0.3.

In a method for adjusting self-induced oscillation intensity of the semiconductor laser according to the present invention, the adjustment is conducted by setting the difference in equivalent refractive indices in the thickness direction between inside and outside the stripe-shaped semiconductor layer and the rate of light confined in the active layer in the thickness direction outside the strip-shaped semiconductor layer at values within the predetermined ranges, respectively.

According to another aspect of the present invention, a semiconductor laser element includes:
- a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and
- a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer, wherein the refractive index of the first cladding layer is larger than that of the second cladding layer in the semiconductor laminated structure, and the semiconductor laminated structure includes at least one semiconductor layer of the second-conductivity type having a higher refractive index than that of the second cladding layer, disposed between the second cladding layer and the active layer.

In one embodiment of the present invention, a difference in equivalent refractive indices in a thickness direction between inside and outside the stripe-shaped semiconductor layer is set to be within a range of $1\times10^{-3}$ to $4\times10^{-3}$ and a rate of light confined in the active layer in the thickness direction outside the stripe-shaped semiconductor layer is set to be within a range of 0.12 to 0.3.

According to another aspect of the present invention, in a method for adjusting self-induced oscillation intensity of the semiconductor laser, the adjustment is conducted by setting the difference in equivalent refractive indices in the thickness direction between inside and outside the stripe-shaped semiconductor layer and the rate of light confined in the active layer in the thickness direction outside strip-shaped semiconductor layer at values within the predetermined ranges, respectively.

According to still another aspect of the present invention, a semiconductor laser element includes:

- a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and
- a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer,
- wherein the refractive index of the first cladding layer is larger than that of the second cladding layer in the semiconductor laminated structure, and the semiconductor laminated structure includes at least one semiconductor layer of the first-conductivity type having a lower refractive index than that of the first cladding layer, disposed between the first cladding layer and the active layer and includes at least one semiconductor layer of the second-conductivity type having a higher refractive index than that of the second cladding layer, disposed between the second cladding layer and the active layer.

According to still another aspect of the present invention, a semiconductor laser element includes:

- a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and
- a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer,
- wherein the first cladding layer includes a region having a refractive index lower than that of remaining region of the first cladding layer.

In one embodiment of the present invention, the first cladding layer includes a low refractive index layer having a refractive index lower than that of remaining region of the first cladding layer, disposed so as to be adjacent to the active layer.

In another embodiment of the present invention, the first cladding layer includes a low refractive index layer having a refractive index lower than that of remaining region of the first cladding layer disposed at a position predetermined distance away from the active layer.

In still another embodiment of the present invention, a difference ($\Delta n$) in equivalent refractive indices in a thickness direction between inside and outside the stripe-shaped semiconductor layer is set to be within a range of $2\times10^{-3}$ to $5\times10^{-3}$ a rate ($\Gamma$act. Out) of light confined in the active layer in the thickness direction outside the stripe-shaped semiconductor layer is set to be within a range of 0.1 to 0.4, and a ratio $\Gamma$act.out/$\Delta n$ is set at 50 or more.

According to still another aspect of the present invention, in a method for adjusting self-induced oscillation intensity of the semiconductor laser, the adjustment is conducted by setting the difference ($\Delta n$) in equivalent refractive indices in the thickness direction between inside and outside the stripe-shaped semiconductor layer and the rate ($\Gamma$act.out) of light confined in the active layer in the thickness direction outside the strip-shaped semiconductor layer at values within the predetermined ranges, respectively, and setting the ratio $\Gamma$act.out/$\Delta n$ at a predetermined value or more.

According to still another aspect of the present invention, a semiconductor laser element includes:

- a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and
- a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer,
- wherein the second cladding layer includes a region having a refractive index higher than that of remaining region of the second cladding layer.

In one embodiment of the present invention, the second cladding layer includes a high refractive index layer having a refractive index higher than that of remaining region of the second cladding layer, disposed so as to be adjacent to the active layer.

In another embodiment of the present invention, the second cladding layer includes a high refractive index layer having a refractive index higher than that of other region of the second cladding layer, disposed at a position predetermined distance away from the active layer.

In still another embodiment of the present invention, a difference ($\Delta n$) in equivalent refractive indices in a thickness direction between inside and outside the stripe-shaped semiconductor layer is set to be within a range of $2\times10^{-3}$ to $5\times10^{-3}$ a rate ($\Gamma$act.out) of light confined in the active layer in the thickness direction outside the stripe-shaped semiconductor layer is set to be within a range of 0.1 to 0.4, and a ratio $\Gamma$act.out/$\Delta n$ is set at 50 or more.

According to still another aspect of the present invention, in a method for adjusting self-induced oscillation intensity of the semiconductor laser, the adjustment is conducted by setting the difference ($\Delta n$) in equivalent refractive indices in the thickness direction between inside and outside the stripe-shaped semiconductor layer and the rate ($\Gamma$act.out) of light confined in the active layer in the thickness direction outside the strip-shaped semiconductor layer at values within the predetermined ranges, respectively, and setting the ratio $\Gamma$act.out/$\Delta n$ at a predetermined value or more.

According to another aspect of the present invention, a semiconductor laser element includes:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a stripe-shaped semiconductor layer of the second-conductivity type formed on a surface of the second cladding layer on a side opposite to the active layer, for confining a laser driving current and the laser light in a region of the active layer corresponding to the stripe-shaped semiconductor layer, wherein the first cladding layer includes a region having a refractive index lower than that of remaining region of the first cladding layer, and the second cladding layer includes a region having a refractive index higher than that of remaining region of the second cladding layer.

In the present invention, since the refractive index of a first cladding layer, i.e., a cladding layer of the substrate side is set so as to be larger than that of a second cladding layer, i.e., a cladding layer of the current light confining layer side, light is restrained from exuding into the current light confining layer. The equivalent refractive index difference can be set at a small value within the range assuring the self-induced oscillation of laser light.

Since a low refractive index layer having a refractive index lower than that of the first cladding layer is interposed between the first cladding layer and the active layer, the rate of the light distributed in the active layer is restrained from being lowered by setting the refractive index of the first cladding layer at a larger value than that of the second cladding layer. With this restraint, it is possible to set the rate of the light confined in the active layer outside the stripe-shaped groove at a value within the range where the self-induced oscillation is allowed and a half width of the radiation angle in the horizontal direction is 11° or more.

As a result, since the equivalent refractive index difference and the coefficient Γact.out are within the range where the self-induced oscillation is allowed, the self-induced oscillation can be performed for certain.

Moreover, since the thickness of the second cladding layer is kept at a small value, the unavailable power and the resistance in the cladding layer are small. Therefore, the laser element which needs a small driving current, driving voltage and consumption power can be realized.

Furthermore, since the half width of the radiation angle in the horizontal direction is 11° or more and therefore the ellipticity of the emitted light can be kept at 2.5 or less, the optical coupling efficiency with a collimator lens and the like can be prevented from being lowered.

In this invention, since the refractive index of the first cladding layer (the cladding layer of the substrate side) is set so as to be larger than that of the second cladding layer (the cladding layer of the current light confining layer side), the light is restrained from exuding into the current light confining layer. Therefore, it is possible to set the equivalent refractive index difference inside and outside the stripe-shaped groove at a small value within the range where the self-induced oscillation of laser light is possible, without increasing the thickness of the second cladding layer. Moreover, since a high refractive index layer having a higher refractive index than that of the second cladding layer is interposed between the second cladding layer and the active layer, the light intensity increases in the vicinity of the active layer of the second cladding layer side. As a result, the rate of the light distributed in the active layer is increased as compared with the case where the high refractive index layer is not placed between the second cladding layer and the active layer, thereby restraining the rate of the light confined in the active layer from being lowered by setting the refractive index of the first cladding layer at a value larger than that of the second cladding layer.

As in the same manner described above, it is possible to set the rate of the light confined in the active layer outside the stripe-shaped groove at a value within the range where the self-induced oscillation is allowed and a half width of radiation angle in the horizontal direction is 11° or more.

In the present invention, the equivalent refractive index difference an between inside and outside of the stripe-shaped groove and the rate (Γact.out) of light confined in the active layer outside the stripe-shaped groove are set at values in the predetermined ranges, respectively, thereby adjusting the intensity of self-induced oscillation. Therefore, the structure of an element, in which the self-induced oscillation is possible, can be realized for certain and with ease without need to increase the thickness of the second cladding layer, as well as keeping the ellipticity of the emitted laser light at a small value.

In the present invention, the refractive index of at least part of the first cladding layer (i.e., the cladding layer of the substrate side) in the vicinity of the active layer is set so as to be smaller than that of the other region of the first cladding layer. Since an interface, at which the refractive index becomes large, is formed in an optical path through which the light travels from the active layer toward the substrate side, the exudation of the light from the active layer into the first cladding layer is promoted. Thus, the amount of the light exuding into the first cladding layer is increased, thereby restraining the light from exuding into the current light confining layer of the second cladding layer side.

Moreover, the rate of the light confined in the active layer is effectively restrained from being lowered by providing the low refractive index layer in the vicinity of the active layer.

Therefore, it is possible to reduce the equivalent refractive index difference Δn as well as restrain the rate of the light confined in the active layer Γact.out from being lowered without setting the thickness of the p-second cladding layer at an extremely large value.

With this structure, it is possible to prevent the increase in the unavailable current and the resistance of the element caused with the increase in the thickness of the second cladding layer as well as to lower the noise by the self-induced oscillation. As a result, a self-induced oscillation type laser with low noise which consumes little power with the reduced driving current and driving voltage can be realized.

In the present invention, the refractive index of at least part of the second cladding layer (i.e., the cladding layer of the current light confining layer side) in the vicinity of the active layer is set so as to be larger than that of the other region of the second cladding layer. Since an interface, at which the refractive index becomes small, is formed in an optical path through which the light travels from the active layer toward the current light confining layer side, the light is restrained from exuding from the active layer into the current light confining layer.

Moreover, in the element of the present invention, since the a low refractive index region is included in the second cladding layer except for the above high refractive index region, the rate of the light confined in the active layer is restrained from being lowered.

Accordingly, it is possible to prevent the increase in the unavailable current and the resistance of element caused by the increase in the thickness of the second cladding layer as well as to reduce the noise by self-induced oscillation. Therefore, it is possible to realize the self-induced oscillation type laser with low noise which does not consume much power by reducing the driving current and the driving voltage.

In this invention, the difference (Δn) between the equivalent refractive indices inside and outside the stripe-shaped groove and the rate (Γact.out) of the light confined in the active layer are set at values in predetermined ranges, respectively, and the ratio Γact.out/Δn is set at a value larger than a predetermined value, thereby adjusting the intensity of self-induced oscillation. Therefore, it is possible to realize the structure of the element, in which the self-induced oscillation with high intensity is possible, for certain and with ease without increasing the thickness of the second cladding layer.

The present invention is achieved so as to solve the above problems, and makes possible the advantage of providing a high-power laser element capable of realizing all the following performances necessary to the high-power laser element used in an optical disk and the like and a method for adjusting the intensity of self-induced oscillation of the same.

The required performances are:

(1) The self-induced oscillation for lowering the noise is possible.

(2) It is possible to set the ellipticity of the emitted light at a small value ($\theta\perp/\theta<$ is 2.5 or less, more specifically, $\theta\perp$ is within the range of 20° to 28° and $\theta<$ is 11° or more).

(3) The driving current and the driving voltage are small.

The present invention also makes possible the advantage of providing a semiconductor laser element capable of reducing the equivalent refractive index difference Δn while keeping the thickness of the p-second cladding layer at a sufficiently small value, and further having sufficiently large intensity of self-induced oscillation to restrain the rate of light confined in the active layer from being lowered and a method for adjusting the intensity of self-induced oscillation of the same.

These and other advantages of the present invention will become apparent to those skilled in the art upon reading and understanding the following detailed description with reference to the accompanying figures.

BRIEF DESCRIPTION OF THE DRAWINGS

FIG. 20 is a cross-sectional view showing still another example of a structure of a conventional semiconductor laser element (Conventional Example 3).

FIG. 21 is a graph showing the refractive index profile and the light intensity profile in the thickness direction inside a stripe-shaped portion of the semiconductor laser element according to Conventional Example 3.

FIG. 36 is a cross-sectional view showing still another example of a structure of a conventional semiconductor laser element (Conventional Example 4).

FIG. 37 is a graph showing the refractive index profile and the light intensity profile in the thickness direction inside a stripe-shaped portion of the semiconductor laser element according to Conventional Example 4.

FIG. 40 is a graph showing the relationship between the refractive index difference in the horizontal direction and the thickness of the p-second cladding layer for the comparison of Conventional Examples 4 and 5.

FIG. 41 is a graph showing the relationship between the refractive index difference in the horizontal direction and the light confining coefficient of the active layer outside the stripe-shaped portion.

DESCRIPTION OF THE PREFERRED EMBODIMENTS

Hereinafter, the present invention will be described by way of illustrative examples, with reference to the accompanying drawings. The present invention is restricted by the examples described below.

EXAMPLE 1

Figure 1:
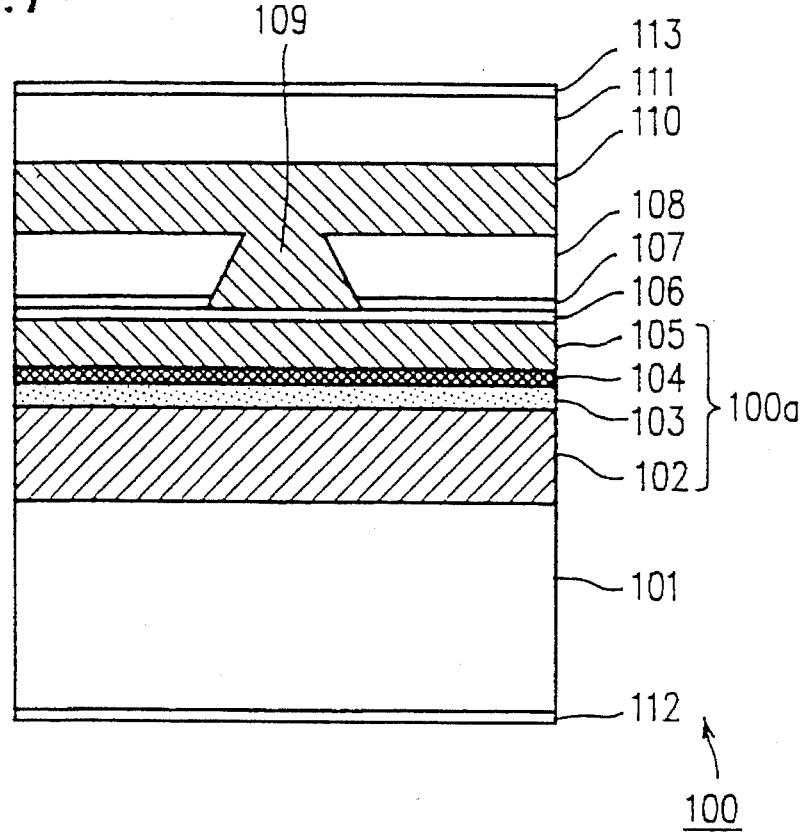
FIG. 1 is a cross-sectional view showing a structure of a semiconductor laser element according to a first example of the present invention.

FIG. 1 is a cross-sectional view of a self-induced oscillation type semiconductor laser element according to a first example of the present invention. The reference numeral 100 denotes a self-induced oscillation type high-power laser element of the first example. The laser element 100 includes an n-GaAs substrate 101 and a semiconductor laminated structure 100a for emitting a laser light formed on the n-GaAs substrate 101. The semiconductor laminated structure 100a includes a first cladding layer 102, a low refractive index layer 103, an active layer 104, and a second cladding layer 105 formed in this order. More specifically, the active layer 104 is interposed between the first cladding layer 102 and the second cladding layer 105 which have lower refractive indices than that of the active layer, and the low refractive index layer 103 is interposed between the active layer 104 and the first cladding layer 102.

The active layer 104 consists of an undoped $Al_{0.13}Ga_{0.87}As$ layer having a thickness of 0.065 μm. The first cladding layer 102 and the second cladding layer 105 consist of an n-$Al_{0.5}Ga_{0.5}As$ layer having a thickness of 1.9 μm and a p-$Al_{0.55}Ga_{0.45}As$ layer having a thickness of 0.30 μm, respectively. Therefore, the refractive index of the first cladding layer 102 is larger than that of the second cladding layer 105. The low refractive index layer 103 consists of an n-$Al_{0.55}Ga_{0.45}As$ layer having a thickness of 0.1 μm.

A p-GaAs epitaxial growth promoting layer 106 having a thickness of 0.003 μm, a p-$Al_{0.6}Ga_{0.4}As$ etching stop layer 107 having a thickness of 0.02 μm, and a light current confining layer 108 are successively formed on the second cladding layer 105. The current light confining layer 108 consists of an n-GaAs layer having a thickness of 0.6 μm. On the middle portion of the second cladding layer 105, a stripe-shaped groove 109 having a width of 3.5 μm penetrating the current light confining layer 108 and the p-etching stop layer 107 to reach the epitaxial growth promoting layer 106.

On the current light confining layer 108 and the stripe-shaped groove 109, a p-$Al_{0.55}Ga_{0.45}As$ layer having a thickness of 2.0 μm is formed and serves as a third cladding layer 110.

The stripe-shaped semiconductor layer which consists of a p-$Al_{0.55}Ga_{0.45}As$ layer filling the stripe-shaped groove 109 and the current light confining layer 108 formed on the both sides thereof constitute a current light confining means for confining the laser driving current and the laser light in the region of the active layer 104 corresponding to the stripe-shaped groove 109.

On the third cladding layer 110, a p-GaAs contact layer 111 having a thickness of 5.0 μm is formed. A p-electrode 113 and an n-electrode 112 are formed on the contact layer 111 and on the back face of the n-GaAs substrate 101, respectively.

The resonator of the laser element 100 has a length of 375 μm. An $Al_2O_3$ film (not shown) is formed on a light emitting end face so as to have a reflectance of 12%. A multilayer film (not shown) which consists of an $Al_2O_3$ film and an Si film is formed on an end face opposite to the light emitting end face so as to have a reflectance of 75%.

Next, a method for fabricating the laser element will be described.

First, the n-$Al_{0.5}Ga_{0.5}As$ layer serving as the first cladding layer 102, the n-$Al_{0.55}Ga_{0.45}As$ layer serving as the low refractive index layer 103, the undoped $Al_{0.13}Ga_{0.87}As$ layer serving as the active layer 104, and the p-$Al_{0.55}Ga_{0.45}$ layer serving as the second cladding layer 105 are grown on the n-GaAs substrate 101 in this order by an MOCVD method so as to have predetermined thicknesses, respectively. With this process, the semiconductor laminated structure 100a for emitting a laser light is formed.

Subsequently, the p-GaAs epitaxial growth promoting layer 106 and the p-etching stop layer 107, and the n-GaAs layer 108 are formed on the second cladding layer 105 in this order by the MOCVD method. Then, the stripe-shaped groove 109 is formed in a predetermined region of the semiconductor laminated structure 100a so as to reach the p-GaAs layer 106 from the surface of the GaAs layer 108 layer.

Next, the p-$Al_{0.55}Ga_{0.45}As$ layer is grown on the entire surface of the n-GaAs layer 108 and the stripe-shaped groove 109 by LPE method so as to form the third cladding layer 110 having a flat surface. The p-GaAs contact layer 111 is formed on the third cladding layer 110 by LPE method. Thereafter, the n-electrode 112 and the p-electrode 113 are formed on the back face of the n-GaAs substrate 101 and the p-GaAs contact layer 111, respectively.

After the resonator end faces are formed by the cleavage of wafer and the like, the $Al_2O_3$ film and the multi layer film which consists of $Al_2O_3$ film and Si film are formed on the light emitting end face and on the end face on the side opposite thereto, respectively. Then, a laser chip is cleaved from the wafer by a predetermined process. The laser chip (semiconductor laser element) is mounted in a package, for example, by using a soldering material, thereby completing an optical device.

Next, the functional effect will be described.

Figure 2:
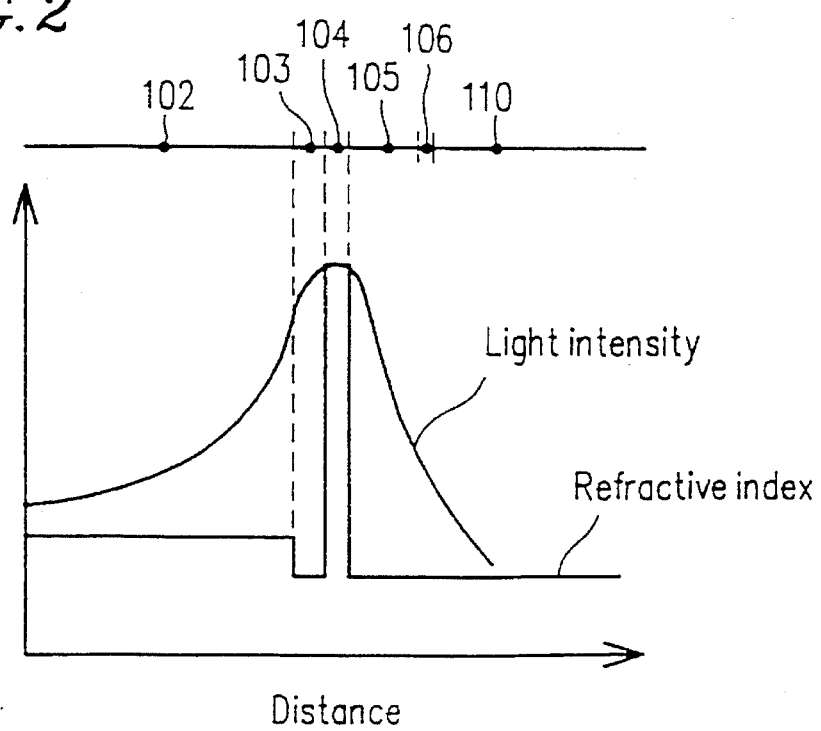
FIG. 2 is a graph showing the refractive index profile and the light intensity profile in a thickness direction inside a stripe-shaped portion of the semiconductor laser element according to the first example.

FIG. 2 shows the refractive index profile and the light intensity profile in the thickness direction in the stripe-shaped groove 109 of the laser element having the structure of Example 1. The profile of the light shows that the light greatly exudes into the n-first cladding layer 102 due to the difference in the refractive indices between the first and second cladding layers 102 and 105 while being confined in the active layer 104 due to the effect of the n-low refractive index layer 103 on the side of the n-first cladding layer 102. In such a case, a half-width $\theta\perp$ of the radiation angle in the vertical direction of the emitted laser light is 25°.

Figure 15:
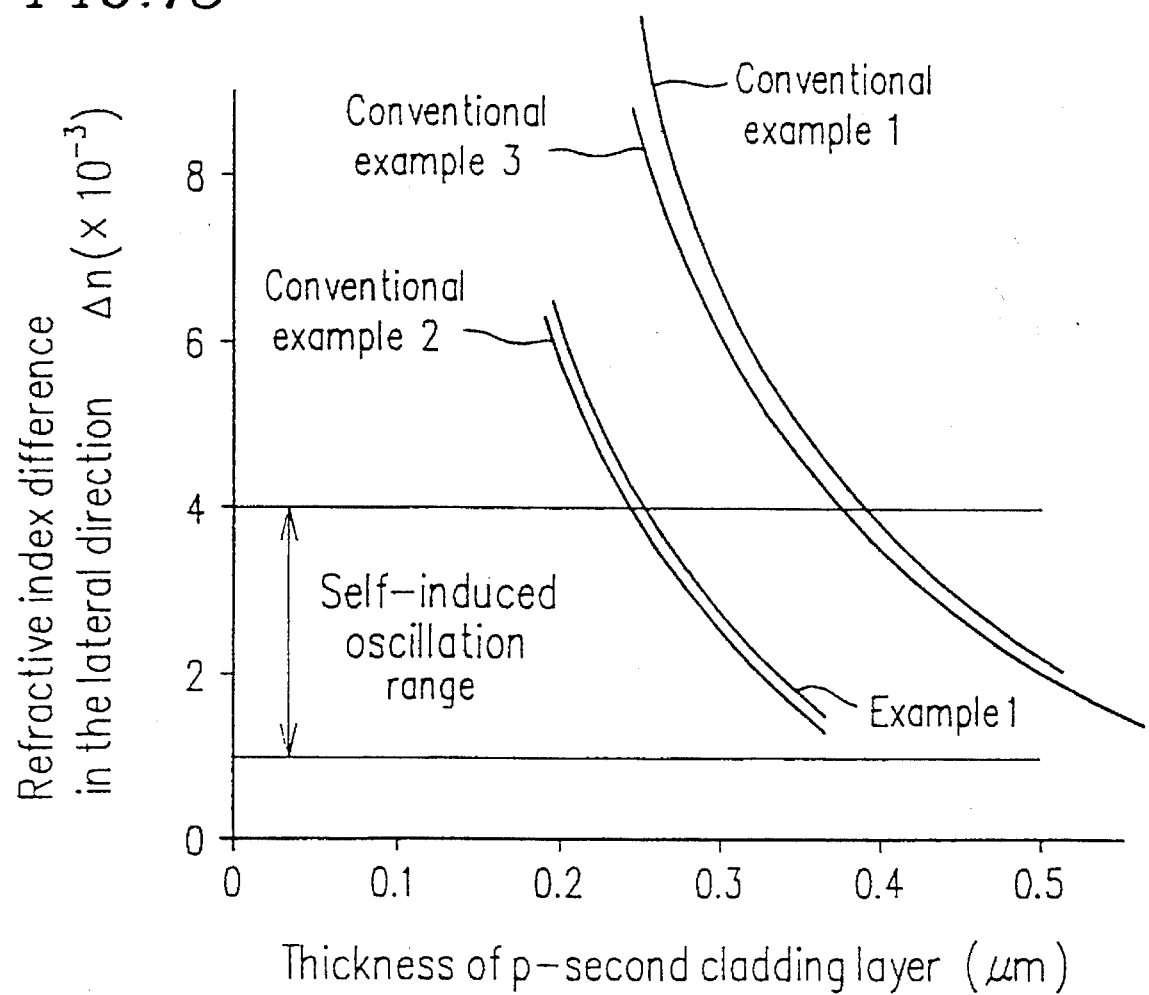
FIG. 15 is a graph showing the relationship between the thickness of a p-second cladding layer of a semiconductor laser element and the refractive index difference in the horizontal direction.
Figure 16:
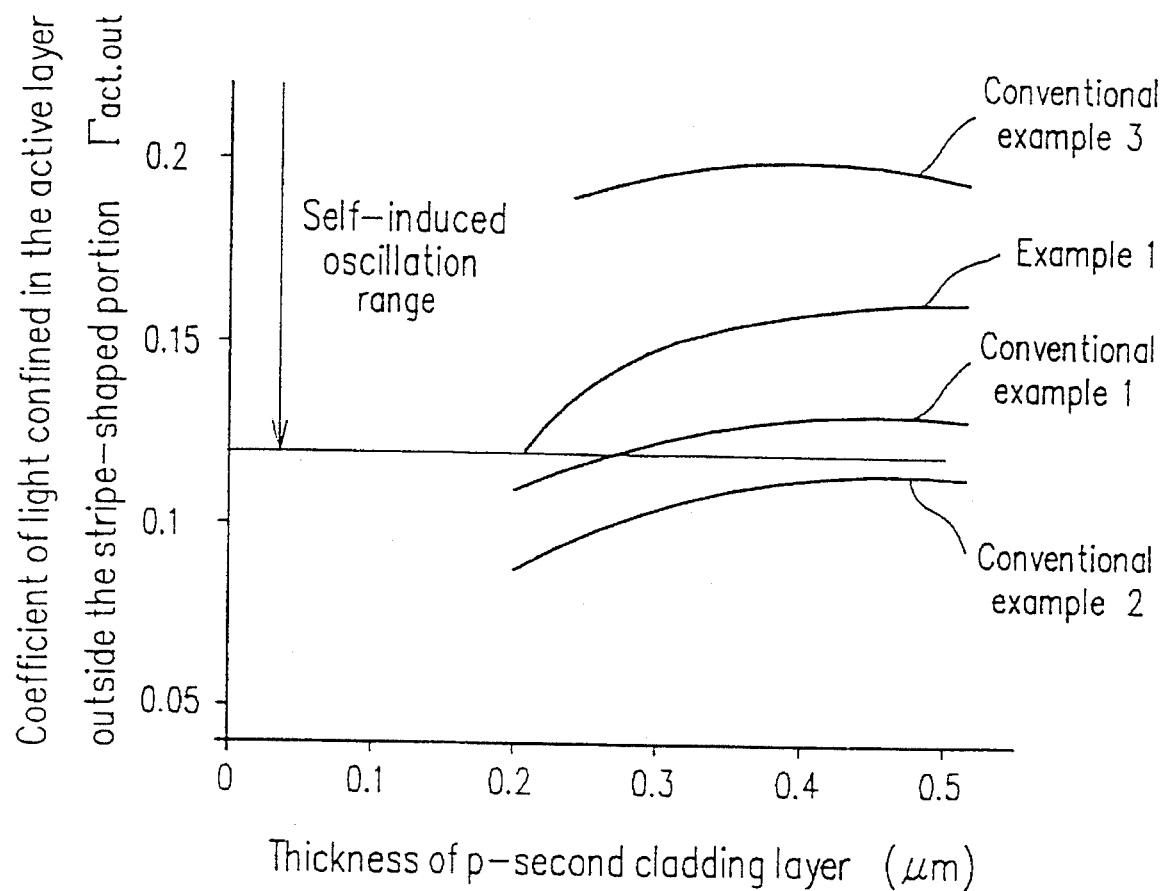
FIG. 16 is a graph showing the relationship between the thickness of the p-second cladding layer of the semiconductor laser element and the light confining coefficient Γact.out of an active layer outside the stripe-shaped portion.

In the element of Example 1, the thickness of the p-second cladding layer 105 is 0.3 μm, and as shown in FIG. 15 the equivalent refractive index difference $\Delta n$ corresponding to the thickness is $2.5\times 10^{-3}$. As is obtained from FIG. 16, the coefficient Γact.out corresponding to the thickness is 0.15, and therefore the equivalent refractive index difference $\Delta n$ and the coefficient Γact.out can be set at values within the range allowing the self-induced oscillation, respectively.

Figure 17:
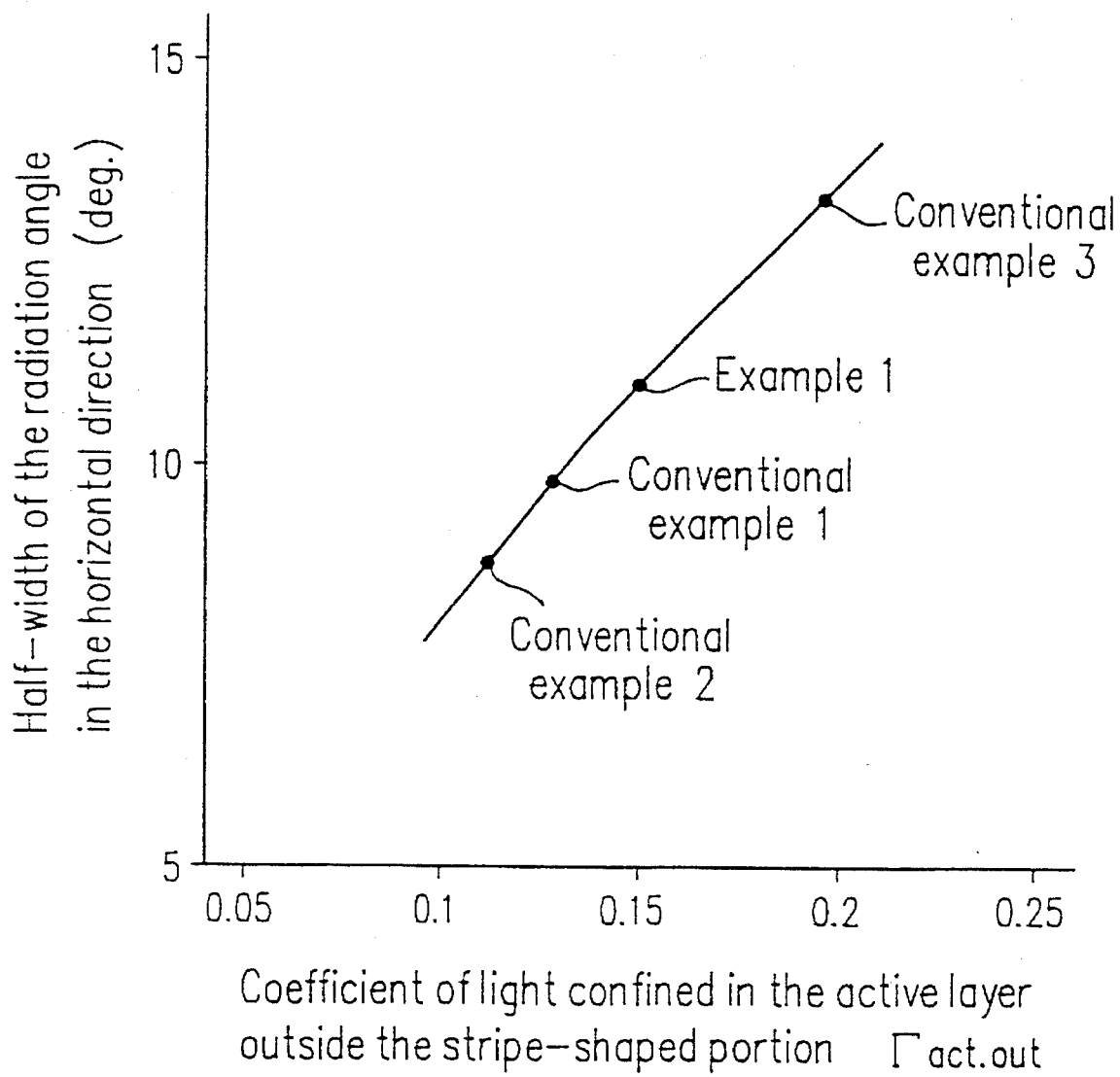
FIG. 17 is a graph showing the relationship between the light confining coefficient Γact.out outside the stripe-shaped portion and the half-width of a radiation angle in the horizontal direction.
Figure 18:
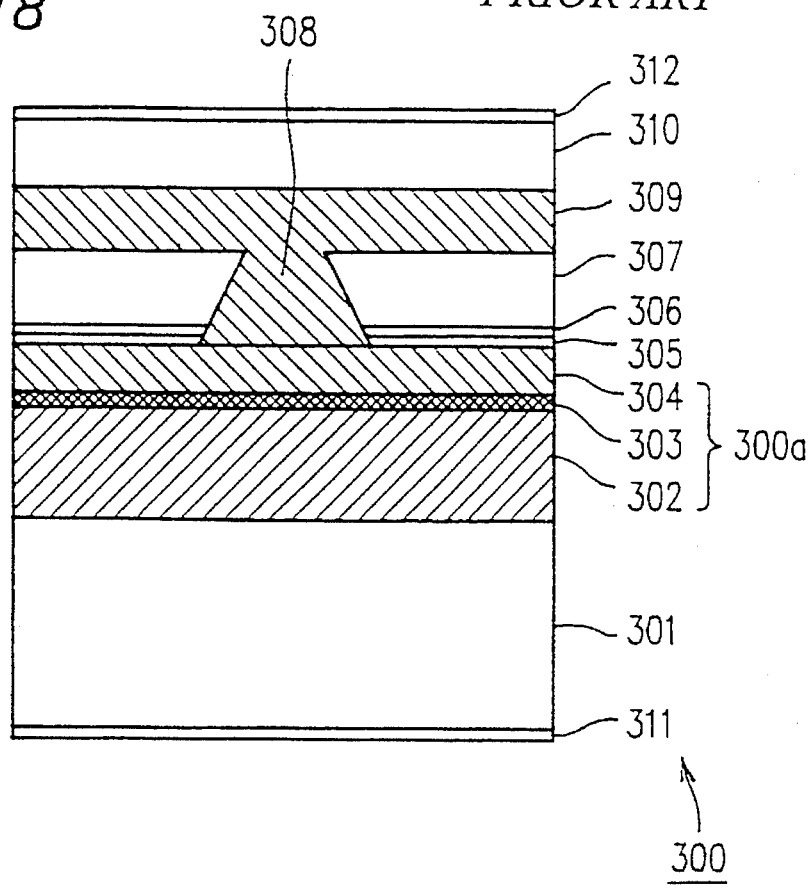
FIG. 18 is a cross-sectional view showing another example of a structure of a conventional semiconductor laser element (Conventional Example 2).
Figure 19:
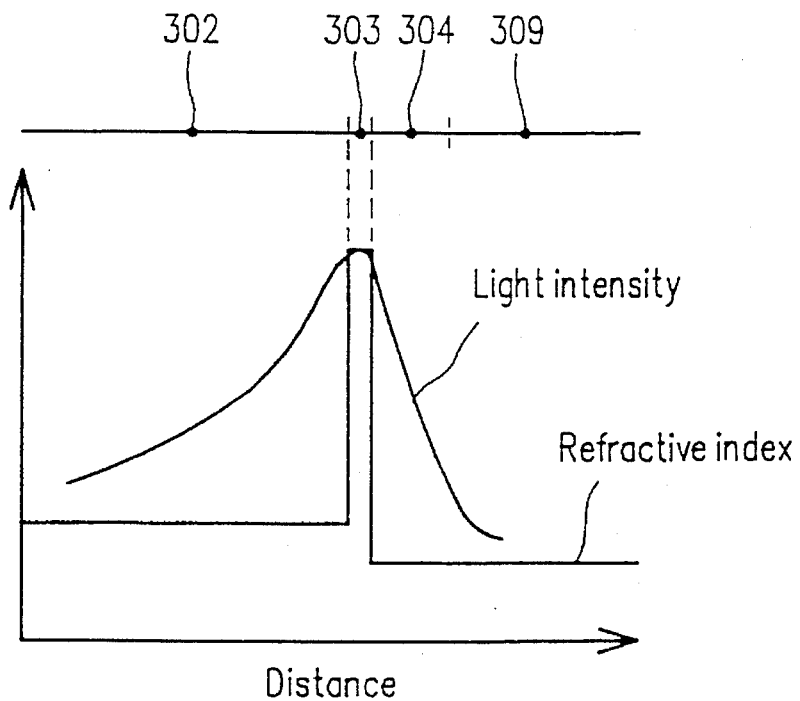
FIG. 19 is a graph showing the refractive index profile and the light intensity profile in the thickness direction inside a stripe-shaped portion of the semiconductor laser element according to Conventional Example 2.

Moreover, since the coefficient Γact.out can be set at a relatively large value, the half width $\theta<$ of the radiation angle in the horizontal direction can be set at about 11.0° as shown in FIG. 17. As a result, it is possible to set the ellipticity ($\theta\perp/\theta<$) of the radiated light (emitted laser light) at 2.5 or less.

Figure 22:
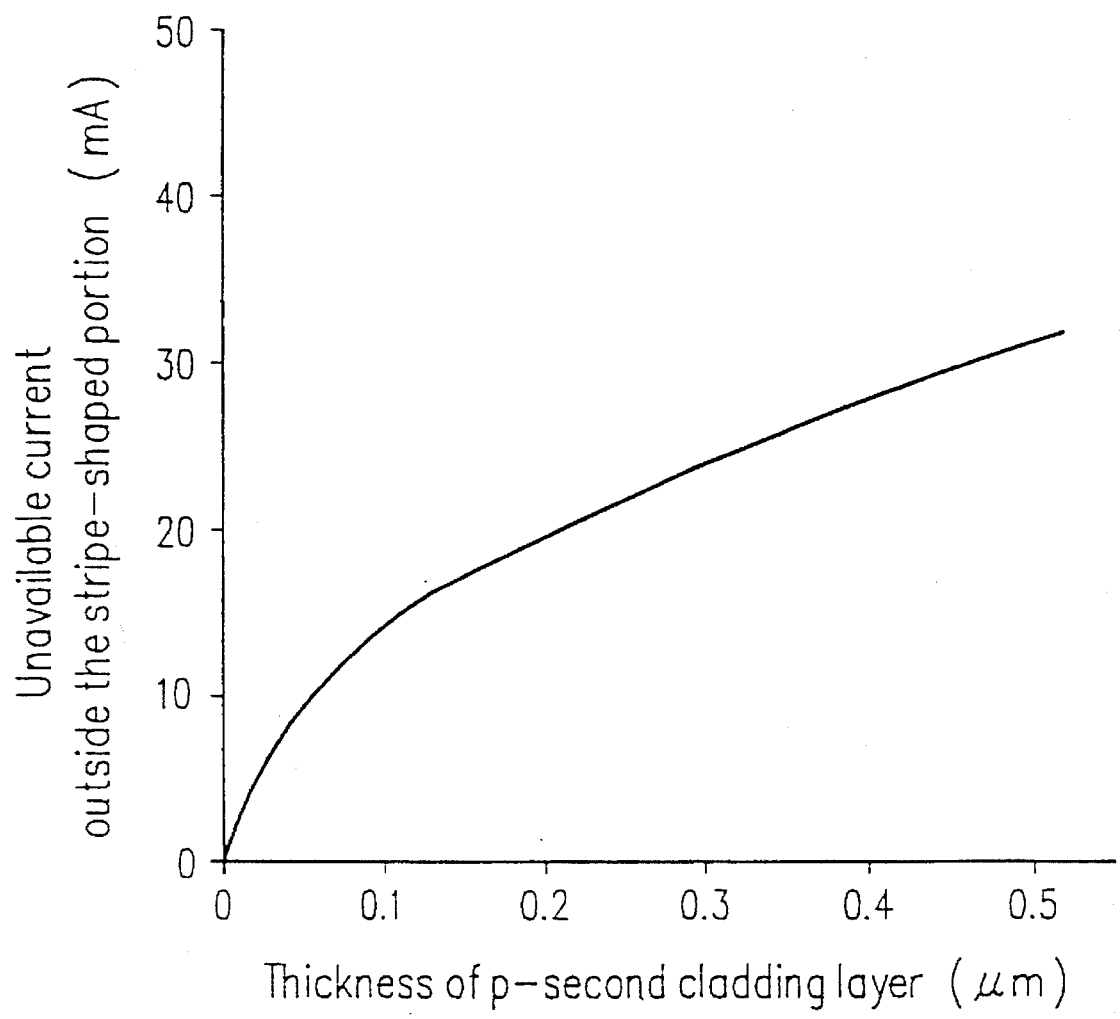
FIG. 22 is a graph showing the relationship between the thickness of the p-second cladding layer of the semiconductor laser element and the unavailable current in the region outside of the stripe-shaped portion.
Figure 23:
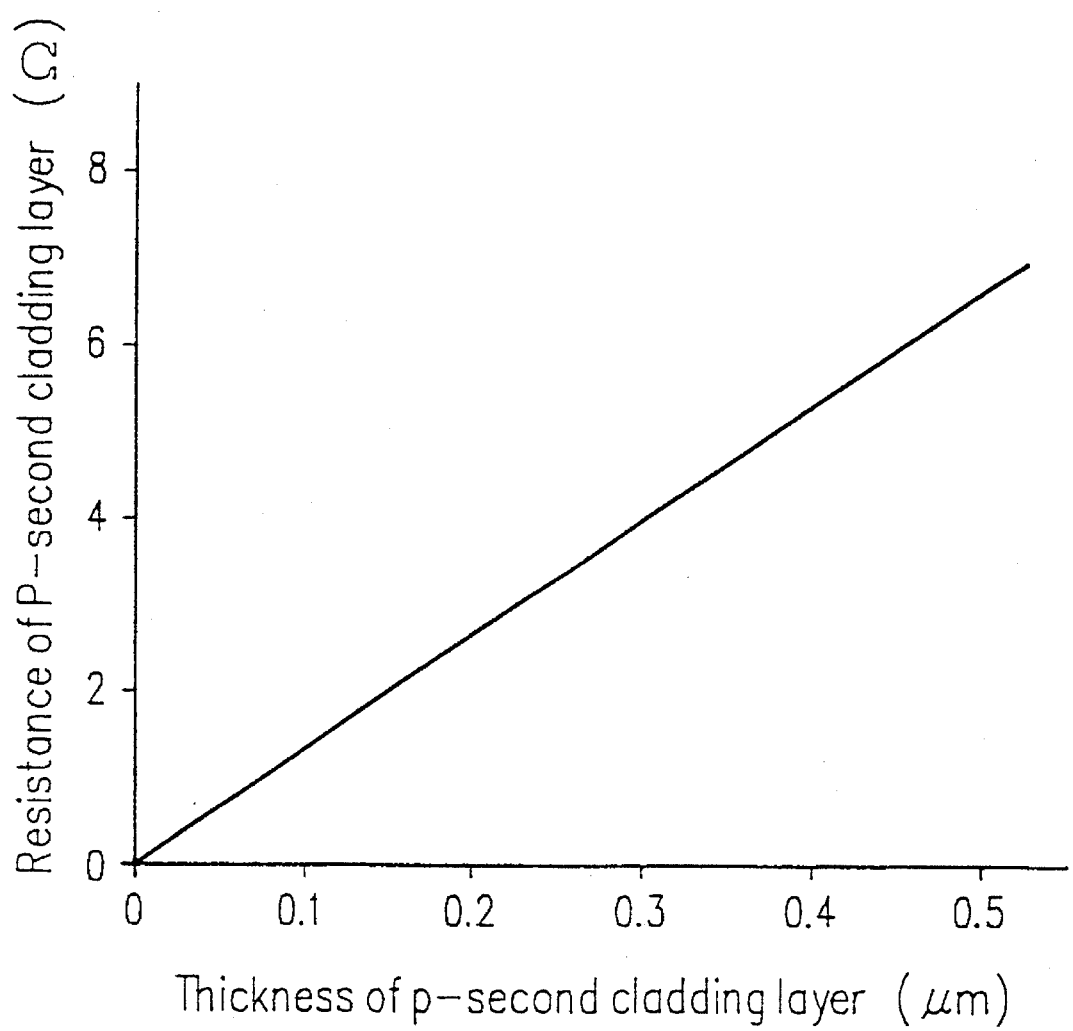
FIG. 23 is a graph showing the relationship between the thickness of the p-second cladding layer of the semiconductor laser element and the resistance in the p-second cladding layer.

Moreover, since the thickness of the p-second cladding layer 105 is 0.3 μm, the unavailable current and the resistance in the p-second cladding layer are small as shown in FIGS. 22 and 23. Therefore, the semiconductor laser element needs a low driving current and driving voltage.

As described above, in the laser element 100 having the structure of Example 1, all the performances (1), (2) and (3) required for the high-power laser element described above can be satisfied.

In Example 1, the case where the refractive index of the n-low refractive index layer 103 is the same as that of the p-second cladding layer 105 is described. However, the similar effect can be obtained even in the case where the refractive index of the n-low refractive index layer 103 is lower than that of the p-second cladding layer 105 and in the case where the refractive index of the n-low refractive index layer 103 is larger than that of the p-second cladding layer 105.

EXAMPLE 2

Figure 3:
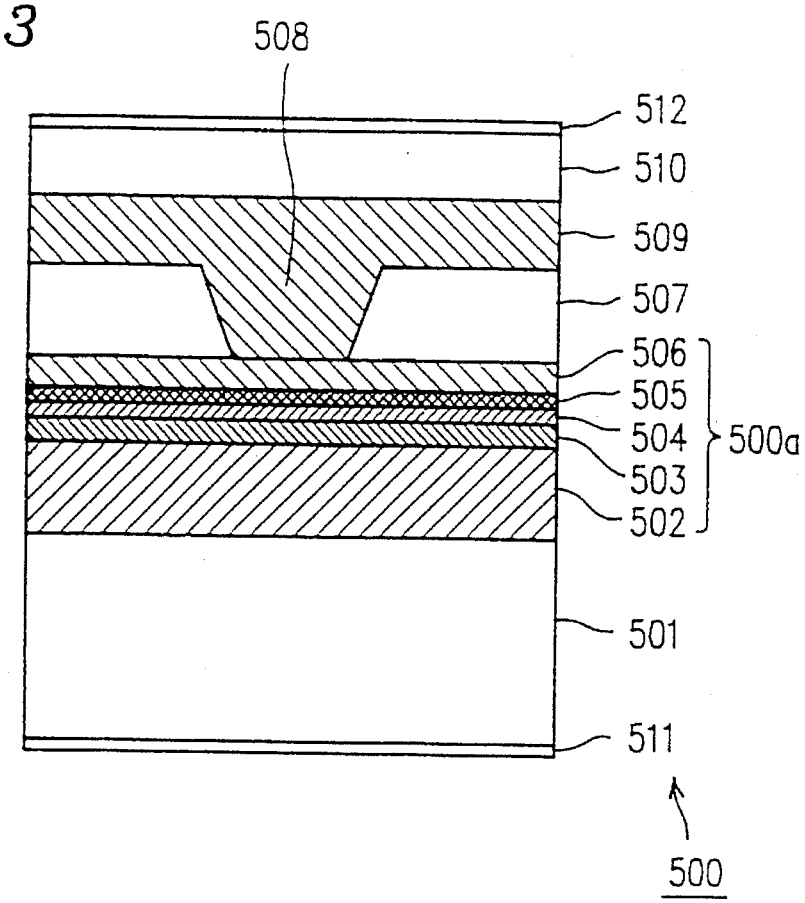
FIG. 3 is a cross-sectional view showing a structure of a semiconductor laser element according to a second example of the present invention.

FIG. 3 is a cross-sectional view of a semiconductor laser element according to a second example of the present invention. The reference numeral 500 denotes a semiconductor laser element according to the second example of the present invention and this laser element 500 adopts the structure of the semiconductor laser element of Example 1 further including an intermediate layer interposed between an active layer and a low refractive index layer. In the structure of Example 2, the epitaxial growth promoting layer and the etching stop layer are not used.

In the semiconductor laser element 500, an n-GaAs substrate is used as a substrate 501. A first cladding layer 502 and a second cladding layer 506 consist of an n-$Al_{0.5}Ga_{0.5}As$ layer having a thickness of 1.9 μm and a p-$Al_{0.55}Ga_{0.45}As$ layer having a thickness of 0.20 μm, respectively. An active layer 505, a low refractive index layer 503 and an intermediate layer 504 consist of an undoped $Al_{0.13}Ga_{0.87}As$ layer having a thickness of 0.070 μm, an n-$Al_{0.55}Ga_{0.45}As$ layer having a thickness of 0.1 μm, and an n-$Al_{0.5}Ga_{0.5}As$ layer having a thickness of 0.1 μm, respectively.

The first and second cladding layers 502 and 506, the active layer 505, the intermediate layer 504 and the low refractive index layer 503 constitutes a semiconductor laminated structure 500a for emitting the laser light. On the second cladding layer 506, an n-$Al_{0.65}Ga_{0.35}As$ current light confining layer 507 of 1.0 μm in thickness is formed.

On a predetermined region of the second cladding layer 506, a stripe-shaped groove 508 having a width of 3.5 μm reaching the surface of the second cladding layer 506 from the surface of the n-current light confining layer 507 is formed. On the stripe-shaped portion 508 and the n-current light confining layer 507, a third cladding layer 509 of p-$Al_{0.55}Ga_{0.45}As$ having a thickness of 2.0 μm is formed. A p-electrode 512 is formed on a p-GaAs contact layer 510 having a thickness of 5.0 μm which is formed on the third cladding layer 509. On the back face of the substrate 510, an n-electrode 511 is formed.

The length of the resonator of the element 500 is 375 μm. An $Al_2O_3$ film and an Si film are formed on a light emitting end face and an end face on the side opposite to the light emitting end face so as to have reflectances of 12% and 75%, respectively.

The fabrication method of the semiconductor laser element of the second example is different from that of the first example in that each semiconductor layer is formed by the MOCVD method, that the active layer 505 is formed after the intermediate layer 504 is formed on the low refractive index layer 503, and that the etching stop layer and the epitaxial growth promoting layer are not formed.

Next, the functional effect will be described.

Figure 4:
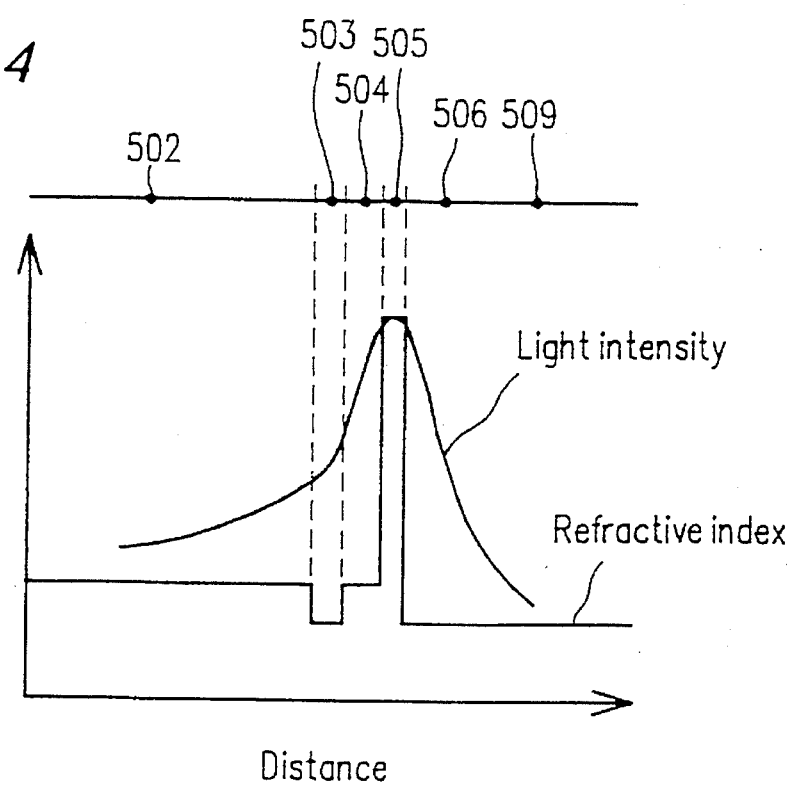
FIG. 4 is a graph showing the refractive index profile and the light intensity profile in the thickness direction inside a stripe-shaped portion of the semiconductor laser element according to the second example.

FIG. 4 shows the refractive index profile and the light intensity profile in the thickness direction in the stripe-shaped groove 508 of the laser element having the structure of Example 2. The profile of the light shows that the light greatly exudes into the n-first cladding layer 502 due to the difference in the refractive indices between the first and second cladding layers 502 and 506 while being confined in the active layer 505 due to the effect of the n-low refractive index layer 503. In such a case, a half-width $\theta$ of the radiation angle in the vertical direction of the emitted laser light is 26°.

In the element of Example 2, the thickness of the p-second cladding layer 506 is 0.3 μm, and the equivalent refractive index difference $\Delta n$ for the thickness is $2.5 \times 10^{-3}$ as shown in FIG. 15 mentioned above. As is obtained from FIG. 16, the coefficient Γact.out corresponding to the thickness is 0.16, and therefore the equivalent refractive index difference $\Delta n$ and the coefficient Γact.out can be set at values within the range where the self-induced oscillation is allowed, respectively.

Moreover, since the coefficient Γact.out can be set at a relatively large value, the half width $\theta<$ of the radiation angle in the horizontal direction can be set at about 11.0° (11.5°) as shown in FIG. 17. As a result, it is possible to set the ellipticity ($\theta\perp/\theta<$) of the emitted light at 2.5 or less.

Moreover, since the thickness of the p-second cladding layer 506 is 0.2 μm, the unavailable current and the resistance in the p-second cladding layer 506 are small as shown in FIGS. 22 and 23. Therefore, the semiconductor laser element needs a low driving current and driving voltage.

As described above, in the laser element 500 having the structure of Example 2, all the performances (1), (2) and (3) required for the high-power laser element described above can be satisfied.

EXAMPLE 3

Figure 5:
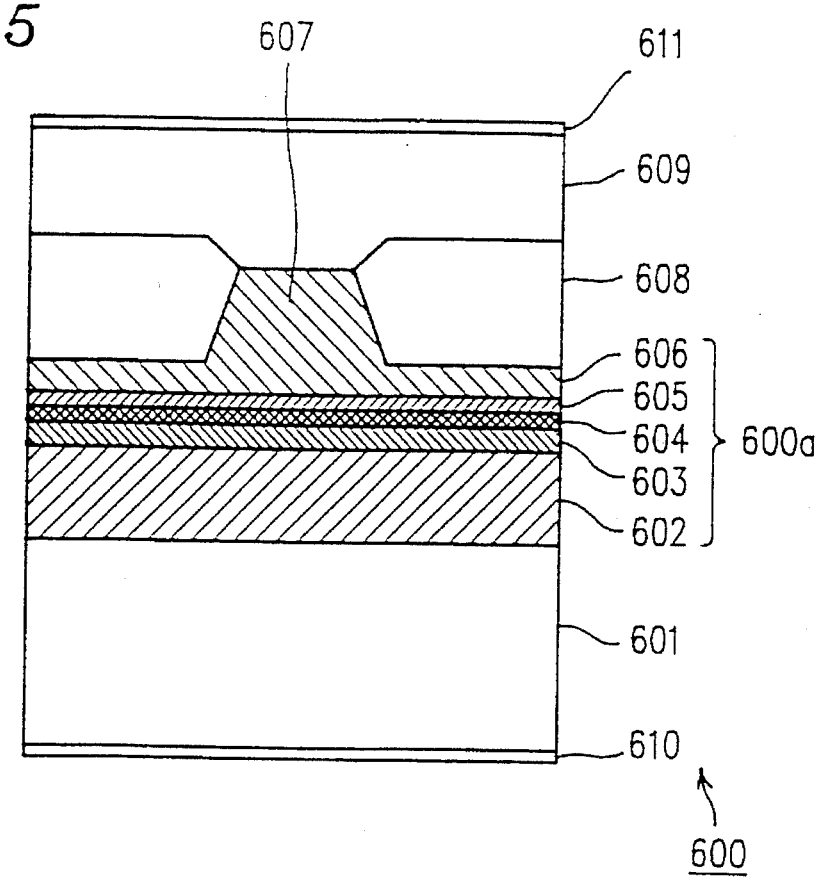
FIG. 5 is a cross-sectional view showing a structure of a semiconductor laser element according to a third example of the present invention.

FIG. 5 is a cross-sectional view of a semiconductor laser element according to a third example of the present invention. The reference numeral 600 denotes a semiconductor laser element having a ridge-stripe shaped structure of Example 3 and the laser element 600 adopts the structure of the semiconductor laser element including an intermediate layer 605 interposed between an active layer 604 and a p-second cladding layer 606.

In the semiconductor laser element 600, an n-GaAs substrate is used as a substrate 601. On the substrate 601, a semiconductor laminated structure 600a for emitting the laser light is provided. A first cladding layer 602, a low refractive index layer 603, a quantum-well type active layer 604, the intermediate layer 605, and the second cladding layer 606 are successively formed on the substrate 601 so as to constitute the semiconductor laminated structure 600a.

The first cladding layer 602 and the low refractive index layer 603 consist of an $n-Al_{0.5}Ga_{0.5}As$ layer having a thickness of 1.9 μm and an $n-Al_{0.55}Ga_{0.45}As$ layer having a thickness of 0.15 μm, respectively. The quantum-well type active layer 604 are formed by alternately laminating five undoped $Al_{0.3}Ga_{0.7}As$ guide layers having a thickness of 0.004 μm and four undoped $Al_{0.1}Ga_{0.9}As$ quantum-well layers having a thickness of 0.01 μm. Moreover, the intermediate layer 605 consists of a $p-Al_{0.55}Ga_{0.45}As$ layer having a thickness of 0.15 μm. The second cladding layer 606 consists of a $p-Al_{0.6}Ga_{0.4}As$ layer and has a thickness of 1.5 μm in ridge-stripe shaped portion 607 and has a thickness of 0.25 μm in the other portion. The refractive index of the first cladding layer 602 is larger than that of the second cladding layer 606.

On both sides of the ridge-stripe shaped portion 607 of the second cladding layer 606, a current light confining layer 608 which consists of an n-GaAs layer having a thickness of 1.0 μm is formed. The ridge-stripe shaped portion 607 and the current light confining layer 608 constitute a current light confining means.

On the ridge-stripe shaped region 607 and the current light confining layer 608, a contact layer 609 which consists of a p-GaAs layer having a thickness of 3 μm is formed. A p-electrode 611 is formed on the contact layer 609, and an n-electrode 610 is formed on the back face of the substrate.

The length of the resonator of the element is 500 μm. An $Al_2O_3$ film and an Si film are formed on a light emitting end face and an end face on the side opposite to the light emitting end face so as to have the reflective indices of 10% and 75%, respectively.

Next, a method for fabricating the semiconductor laser element will be described.

On the n-GaAs substrate 601, the first cladding layer 602, the low refractive index layer 603, the quantum-well type active layer 604, the intermediate layer 605 and the second cladding layer 606 are successively formed by MOCVD method so as to have predetermined thicknesses, respectively. The quantum-well type active layer 604 is formed in the following process. After the undoped-$Al_{0.3}Ga_{0.7}As$ guide layer having a thickness of 0.004 μm is formed on the low refractive index layer 603, four undoped $A_{0.1}Ga_{0.9}As$ quantum-well layers having a thickness of 0.01 μm and four undoped $Al_{0.3}Ga_{0.7}As$ guide layers having a thickness of 0.004 μm are alternately deposited thereon.

After the second cladding layer 606 is formed, a stripe-shaped SiN layer of 3 μm in width is formed thereon. Then, the second cladding layer 606 is selectively etched to a predetermined depth using the stripe-shaped SiN film as a mask, thereby forming the ridge-stripe shaped portion 607. Thereafter, an n-GaAs layer is selectively grown by the MOCVD method using the stripe-shaped SiN film as a mask so as to fill the both sides of the ridge-stripe shaped portion 607, thereby forming the current light confining layer 608 on the both sides of the ridge-stripe shaped portion 607.

Moreover, after removing the SiN film, the p-GaAs contact layer 609 is formed on the entire surface of the n-GaAs current light confining layer 608 by the MOCVD method. Then, a p-electrode 611 is formed on the p-GaAs contact layer 609, and an n-electrode 610 is formed on the back face of the substrate.

After the resonator end faces are formed by cleavage of wafer and the like, the $SiO_2$ film and the multilayer film which consists of the $Al_2O_3$ film and the Si film are formed on a light emitting end face and an end face on the side opposite to the light emitting end face, respectively. Then, a laser chip is cleaved from the wafer by a predetermined process. The laser chip (semiconductor laser element) is mounted in a package, for example, by using a soldering material, thereby completing an optical device.

Next, the functional effect will be described.

Figure 6:
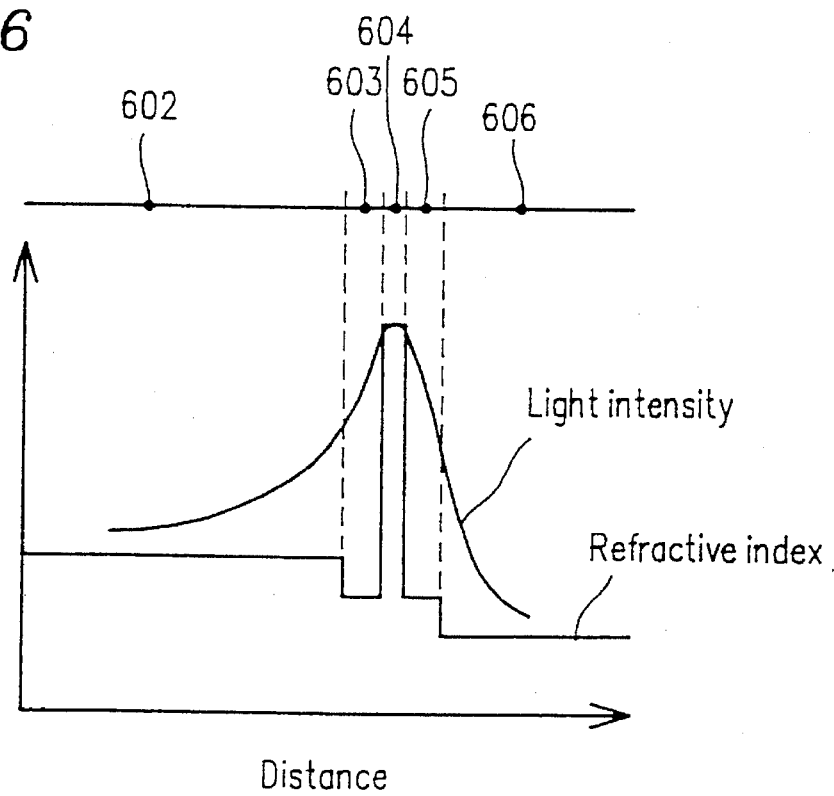
FIG. 6 is a graph showing the refractive index profile and the light intensity profile in the thickness direction inside a stripe-shaped portion of the semiconductor laser element according to the third example.

FIG. 6 shows the refractive index profile and the light intensity profile in the thickness direction in the ridge-stripe shaped portion 607 of the laser element of Example 3. The profile of the light shows that the light greatly exudes into the n-first cladding layer 602 due to the difference in the refractive indices between the first and second cladding layers 602 and 607 while being confined in the active layer 604 due to the effect of the n-low refractive index layer 603 adjacent to the active layer 604. In such a case, a half-width $\theta\perp$ of the radiation angle in the vertical direction of the emitted laser light is 24°.

In the element of Example 3, in the case where the thickness of the p-second cladding layer 606 is 0.25 μm, the equivalent refractive index difference n is $4.0\times10^{-3}$. Moreover, the coefficient $\Gamma$act.out is 0.17, and therefore the equivalent refractive index difference $\Delta$n and the coefficient $\Gamma$act.out can be set at values within the range where the self-induced oscillation is allowed, respectively. Moreover, since the coefficient $\Gamma$act.out can be set at a relatively large value, the half width $\theta<$ of the radiation angle in the horizontal direction can be set at 12.0° as shown in FIG. 17. As a result, it is possible to set the ellipticity $\theta\perp/\theta<$ of the radiated light (emitted laser light) at 2.5 or less.

Moreover, since it is possible to set the thickness of the p-second cladding layer 606 at a small value, i.e., 0.25 μm, the unavailable current and the resistance in the p-second cladding layer 606 are small. Therefore, the semiconductor laser element needs a low driving current and driving voltage.

As described above, in the laser element 600 having the structure of Example 3, all the performances (1), (2) and (3) required for the high-power laser element described above can be satisfied.

A similar effect can be obtained in the case where the refractive indices of the n-low refractive index layer 603 on the n-first cladding layer 602 side and the p-intermediate layer 605 on the p-second cladding layer 606 side are different from that of Example 3, respectively, as long as the structure described in the claims of the present invention is satisfied.

EXAMPLE 4

Figure 7:
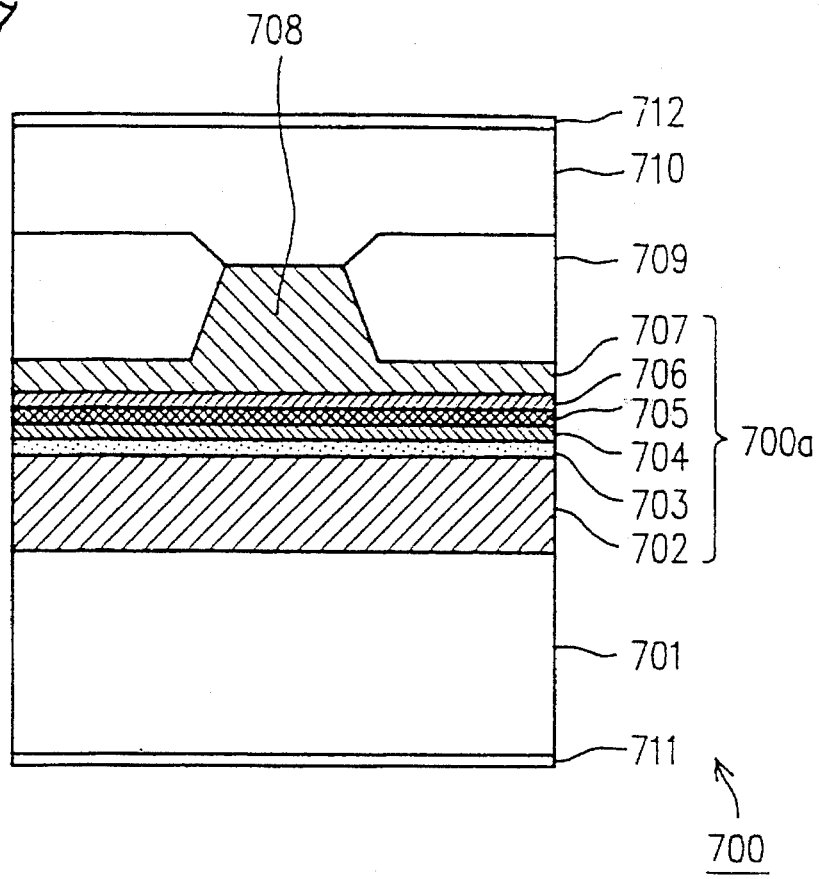
FIG. 7 is a cross-sectional view showing a structure of a semiconductor laser element according to a fourth example of the present invention.

FIG. 7 is a cross-sectional view of a semiconductor laser element according to a fourth example of the present invention. The reference numeral 700 denotes a semiconductor laser element, which adopts the structure of the semiconductor laser element according to Example 3 including an intermediate layer 704 interposed between a low refractive index layer 703 and an active layer 705. The active layer is not of the quantum-well type but consists of a single undoped semiconductor layer.

In the semiconductor laser element 700, an n-GaAs substrate 701 is used as a substrate 701. A first cladding layer 702 consists of an n-$(Al_{0.5}Ga_{0.5})_{0.5}In_{0.5}P$ layer having a thickness of 1.9 μm. A low refractive index layer 703 consists of an n-$(Al_{0.6}Ga_{0.4})_{0.5}In_{0.5}P$ layer having a thickness of 0.1 μm. The first intermediate layer 704 consists of an n-$(Al_{0.5}Ga_{0.5})_{0.5}In_{0.5}P$ layer having a thickness of 0.1 μm. The active layer 705 consists of an undoped $Ga_{0.5}In_{0.5}P$ layer having a thickness of 0.07 μm. A second intermediate layer 706 consists of a p-$(Al_{0.5}Ga_{0.5})_{0.5}In_{0.5}P$ layer having a thickness of 0.1 μm. A second cladding layer 707 consists of a p-$(Al_{0.6}Ga_{0.4})_{0.5}In_{0.5}P$ having a thickness of 1.5 μm in the ridge-stripe shaped portion 708 and a thickness of 0.25 μm in the other portion.

The first and second cladding layers 702 and 707, the active layer 705, the low refractive index layer 703, and the first and second intermediate layers 704 and 706 constitute the semiconductor laminated structure 700a for emitting the laser light.

On both sides of the ridge-stripe shaped portion 708 of the second cladding layer 707, a current light confining layer 709 which consists of an n-GaAs layer having a thickness of 1.0 μm is formed. On the entire surface of the current light confining layer 709, a contact layer 710 which consists of a p-GaAs layer having a thickness of 3 μm is formed. The reference numeral 711 denotes an n-electrode formed on the back face of the substrate and the reference numeral 712 denotes a p-electrode formed on the contact layer 710.

The length of the resonator of the element is 500 μm. An $SiO_2$ film and an Si film are formed on a light emitting end face and an end face on the side opposite to the light emitting end face so as to have the refractive indices of 12% and 75%, respectively.

The fabrication method of the semiconductor laser element 700 is the same as that of the semiconductor laser element 600 of Example 3, except that the single undoped $Ga_{0.5}In_{0.5}P$ layer is formed as an active layer.

Next, the functional effect will be described.

Figure 8:
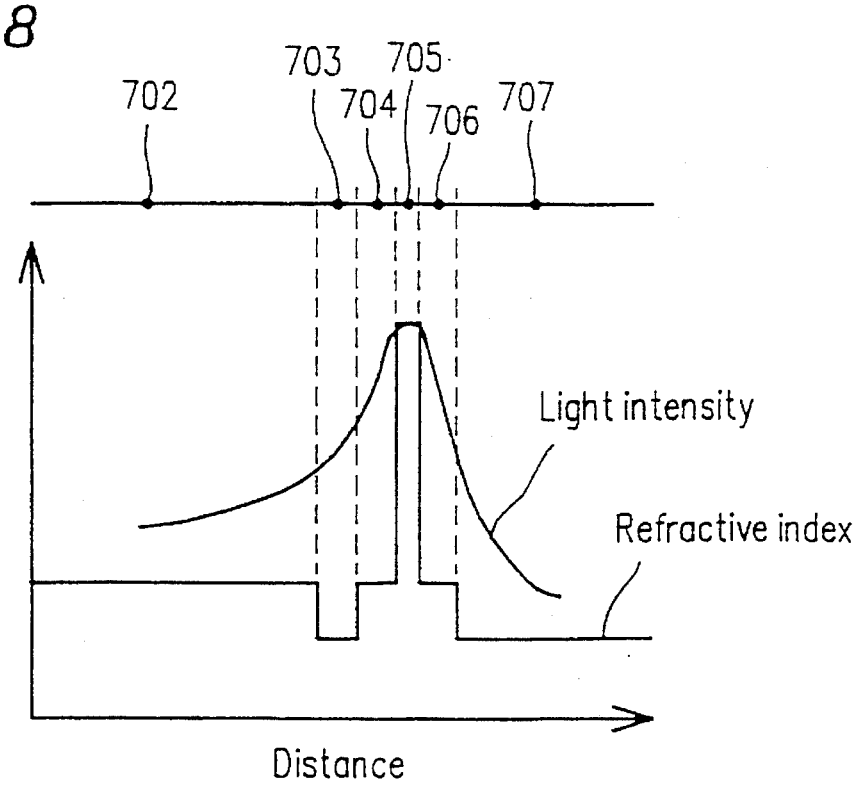
FIG. 8 is a graph showing the refractive index profile and the light intensity profile in the thickness direction inside a stripe-shaped portion of the semiconductor laser element according to the fourth example.

FIG. 8 shows the refractive index profile and the light intensity profile in the thickness direction in the ridge-stripe shaped portion 708 of the laser element of Example 4. The profile of the light shows that the light greatly exudes into the n-first cladding layer 702 due to the difference in the refractive indices between the first and second cladding layers 702 and 707 while being confined in the active layer 705 due to the effect of the n-low refractive index layer 703 at a position predetermined distance away from the active layer 705. In such a case, a half-width $\theta\perp$ of the radiation angle in the vertical direction of the emitted laser light is 25°.

In the element of Example 4, in the case where the thickness of the p-second cladding layer 707 is 0.25 μm, the equivalent refractive index difference $\Delta$n corresponding to the thickness is $4.0\times10^{-3}$. Moreover, the obtained coefficient $\Gamma$act.out is 0.15, and therefore the equivalent refractive index difference $\Delta$n and the coefficient $\Gamma$act.out can be set at values within the range allowing the self-induced oscillation, respectively.

Moreover, since the coefficient $\Gamma$act.out can be set at a relatively large value, the half width $\theta<$ of the radiation angle in the horizontal direction can be set at 11.0° as shown in FIG. 17. As a result, it is possible to set the ellipticity $\theta\perp/\theta<$ of the radiated light (emitted laser light) at 2.5 or less.

Furthermore, since it is possible to set the thickness of the p-second cladding layer 707 at a small value as in Conventional Example 2, the semiconductor laser element needs a low driving current and driving voltage.

As described above, in the laser element 700 having the structure of Example 4, all the performances (1), (2) and (3) required for the high-power laser element described above can be satisfied.

A similar effect can be obtained in the case where the refractive indices of the low refractive index layer 703 and the intermediate layer 704 on the n-first cladding layer 702 side and the intermediate layer 706 on the p-second cladding layer 707 side are set at values which are different from those of Example 4, as long as the structure described in the claims of the present invention is satisfied.

EXAMPLE 5

Figure 9:
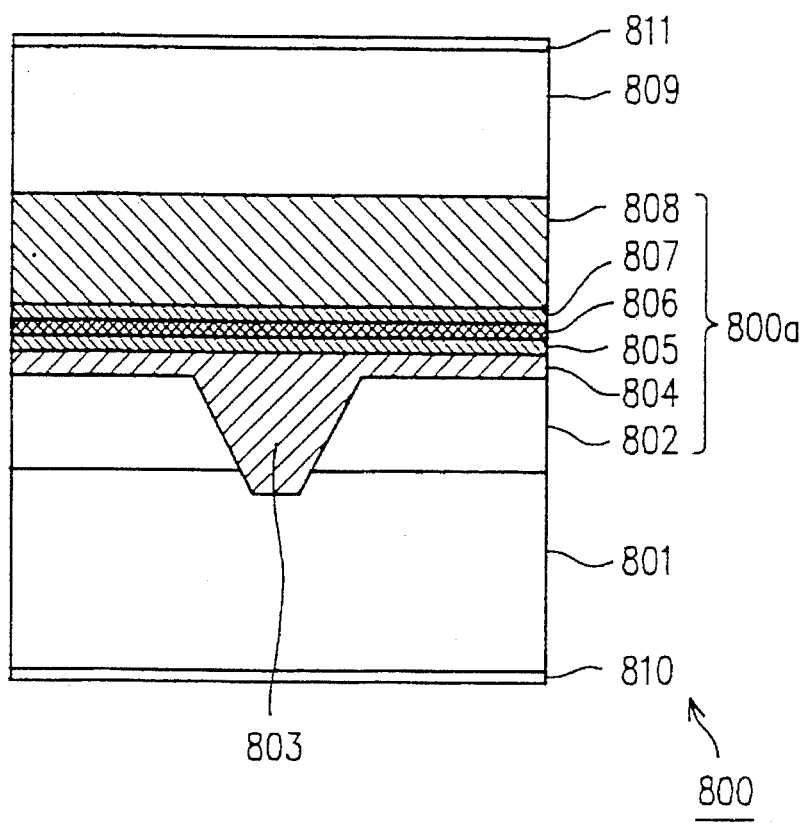
FIG. 9 is a cross-sectional view showing a structure of a semiconductor laser element according to a fifth example of the present invention.

FIG. 9 is a cross-sectional view of a semiconductor laser element according to a fifth example of the present invention.

In this figure, the reference numeral 800 denotes a semiconductor laser element of Example 5. In the semiconductor laser element 800, a p-GaAs substrate is used as a substrate 801. A light absorbing layer (current light confining layer) is provided on the substrate side of the active layer.

More specifically, the current light confining layer 802 having a thickness of 1.0 µm which consists of n-GaAs is provided on the substrate 801. A stripe-shaped groove 803 a little deeper than the thickness of the current light confining layer 802 is formed on the middle portion of the substrate 801. On the current light confining layer 802 and the stripe-shaped groove 803, a p-$Al_{0.5}Ga_{0.5}$ layer is formed so as to have a thickness of 0.2 µm on both sides of the stripe-shaped groove, and serves as a first cladding layer 804.

On the first cladding layer 804, a p-$Al_{0.55}Ga_{0.45}As$ intermediate layer 805 having a thickness of 0.1 µm, a p-$Al_{0.13}Ga_{0.087}As$ active layer 806 having a thickness of 0.07 µm, and an n-$Al_{0.55}Ga_{0.45}As$ low refractive index layer 807 having a thickness of 0.15 µm are deposited in this order. On the low refractive index layer 807, an n-$Al_{0.45}Ga_{0.055}As$ second cladding layer 808 having a thickness of 1.5 µm and an n-GaAs contact layer 809 having a thickness of 50 µm are successively formed. In this example, the refractive index of the second cladding layer 808 is higher than that of the first cladding layer 804.

The reference numerals 810 and 811 denote a p electrode formed on the back face of the p-GaAs substrate 801 and an n-electrode formed on the n-GaAs contact layer 809.

The fabrication method of the laser element of Example 5 will be described.

After the current light confining layer 802 is formed on the substrate 801 by LPE method, the stripe-shaped groove 803 is formed on the middle portion of the current light confining layer 802. Thereafter, the first cladding layer 804, the intermediate layer 805, the active layer 806, the low refractive index layer 807, the second cladding layer 808, and the contact layer 809 are successively formed by LPE method. Then, the p-electrode 810 and the n-electrode 811 are formed on the back face of the p-GaAs substrate 801 and the contact layer 809, respectively. The resonator end faces are formed by the cleavage of wafer and the like. An $Al_2O_3$ film and a multilayer film which consists of $Al_2O_3$ film and Si film are formed on the light emitting end face and the end face on the side opposite thereto so as to have reflectances of 12% and 90%, respectively. The length of the resonator of the laser element 800 is 375 µm.

Next, the functional effect will be described.

Figure 10:
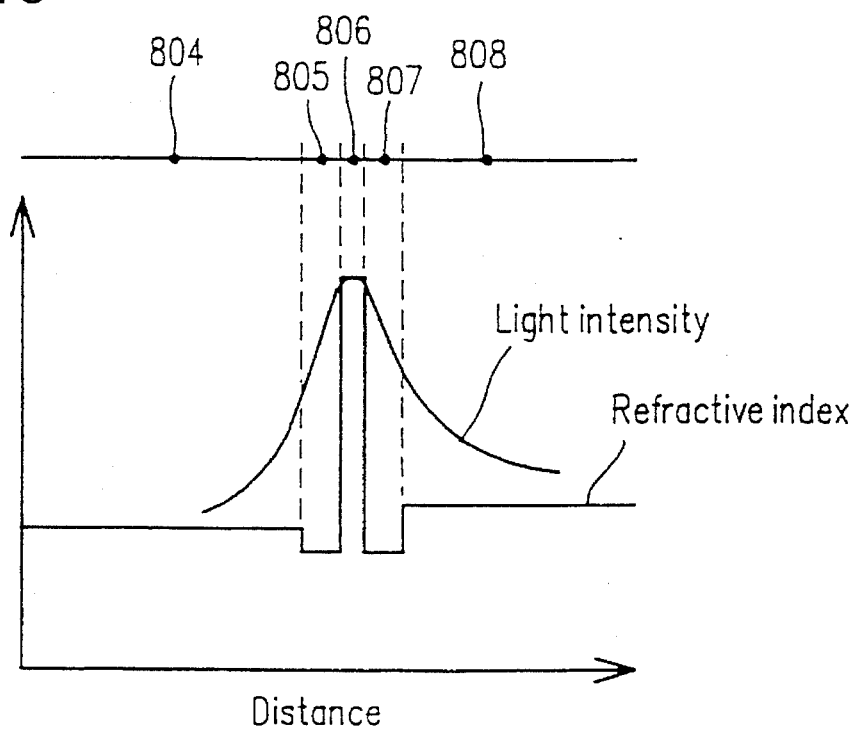
FIG. 10 is a graph showing the refractive index profile and the light intensity profile in the thickness direction inside a stripe-shaped portion of the semiconductor laser element according to the fifth example.

FIG. 10 shows the refractive index profile and the light intensity profile in the thickness direction in the stripe shaped groove 803 of the laser element of Example 5. The profile of the light shows that the light greatly exudes into the n-second cladding layer 808 due to the difference in the refractive indices between the first and second cladding layers 804 and 808 while being confined in the active layer 806 due to the effect of the n-low refractive index layer 807 and the intermediate layer 805. In such a case, a half-width $\theta\perp$ of the radiation angle in the vertical direction of the emitted laser light is 27°.

In the laser element 800 of Example 5, in the case where the thickness of the p-first cladding layer 804 is 0.3 µm, the equivalent refractive index difference $\Delta n$ corresponding to the thickness is obtained to be $2.5\times10^{-3}$. Moreover, the obtained coefficient $\Gamma act.out$ is 0.16. Therefore the equivalent refractive index difference $\Delta n$ and the coefficient $\Gamma act.out$ can be set at values within the ranges allowing the self-induced oscillation, respectively.

Moreover, since the coefficient $\Gamma act.out$ can be set at a relatively large value, the half width $\theta<$ of the radiation angle in the horizontal direction can be set at 11.5° as shown in FIG. 17. As a result, it is possible to set the ellipticity $\theta\perp/\theta<$ of the radiated light (emitted laser light) at 2.5 or less.

Furthermore, since it is possible for the p-first cladding layer 804 to have a small thickness, i.e., about 0.2 µm outside the stripe-shaped portion, the semiconductor laser element requires a low driving current and driving voltage.

As described above, in the laser element 800 of Example 5, all the performances (1), (2) and (3) required for the high-power laser element described above can be satisfied.

EXAMPLE 6

Figure 11:
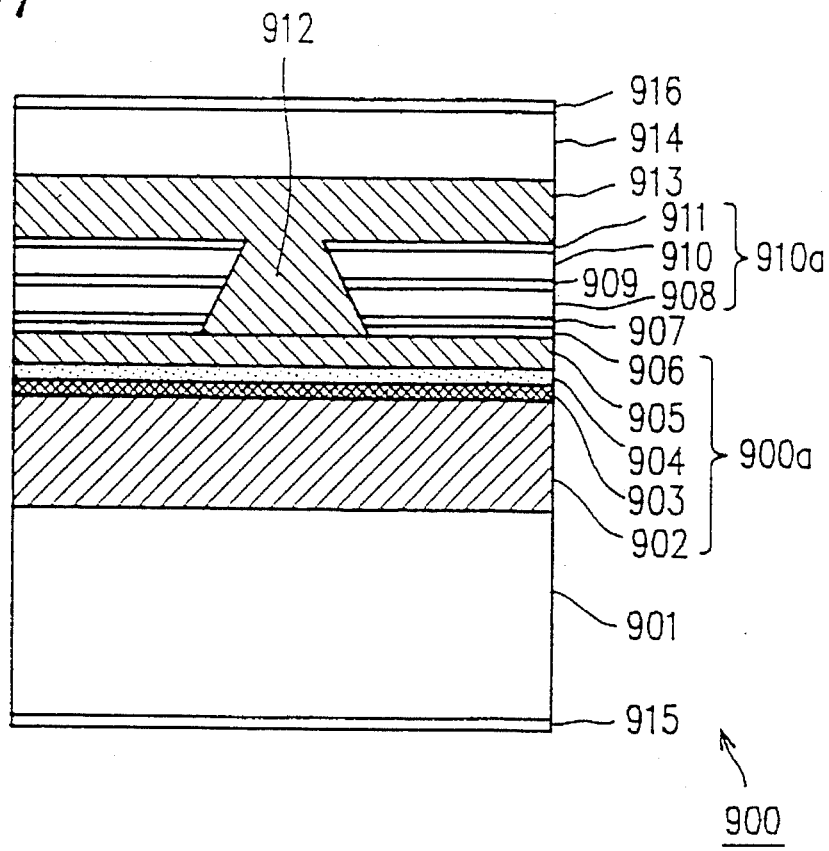
FIG. 11 is a cross-sectional view showing a structure of a semiconductor laser element according to a sixth example of the present invention.
Figure 13:
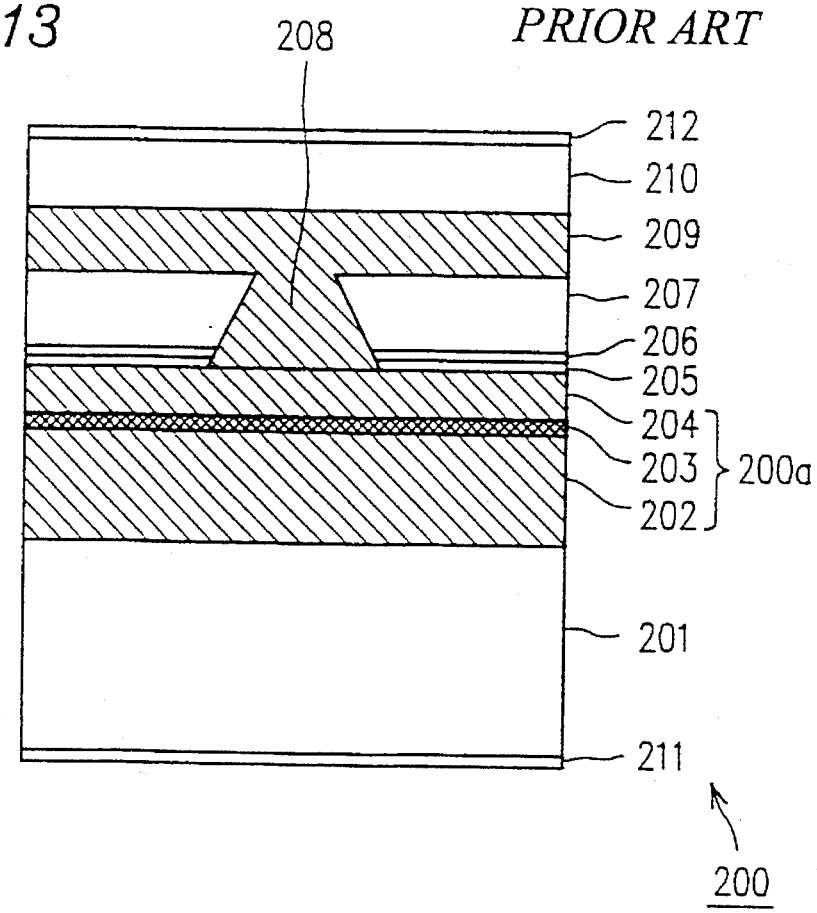
FIG. 13 is a cross-sectional view showing an example of a structure of a conventional semiconductor laser element (Conventional Example 1).
Figure 14:
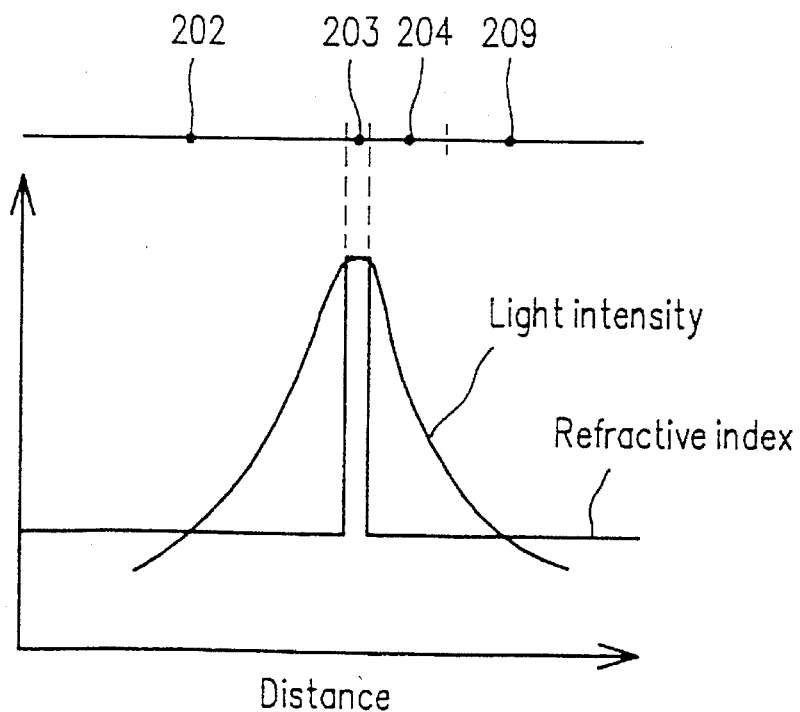
FIG. 14 is a graph showing the refractive index profile and the light intensity profile in the thickness direction inside a stripe-shaped portion of the semiconductor laser element according to Conventional Example 1.

FIG. 11 is a cross-sectional view of a semiconductor laser element according to a sixth example of the present invention. In this figure, the reference numeral 900 denotes a semiconductor laser element of Example 6. The semiconductor laser element 900 adopts the semiconductor laminated structure of the conventional semiconductor laser element shown in FIG. 13 including the first cladding layer having a higher refractive index than that of the second cladding layer and a high refractive index layer interposed between the active layer and the second cladding layer.

More specifically, the semiconductor laser element 900 includes the semiconductor laminated structure 900a which consists of a first cladding layer 902, an active layer 903, the high refractive index layer 904 and the second cladding layer 905 successively formed on an n-GaAs substrate 901.

The first cladding layer 902 and the second cladding layer 905 consist of an n-$Al_{0.5}Ga_{0.5}As$ layer having a thickness of 2.0 µm and a p-$Al_{0.55}Ga_{0.45}As$ layer having a thickness of 0.2 µm, respectively. The active layer 903 and the high refractive index layer 904 consist of an undoped $Al_{0.5}Ga_{0.5}As$ layer having a thickness of 0.065 µm and a p-$Al_{0.5}Ga_{0.5}As$ layer having a thickness of 0.1 µm, respectively.

On the second cladding layer 905, a p-GaAs epitaxial growth promoting layer 906 having a thickness of 0.01 µm and a p-$Al_{0.6}Ga_{0.4}As$ etching stop layer 907 having a thickness of 0.02 µm and a current light confining layer 910a are successively formed. On the middle portion of the second cladding layer 905, a stripe-shaped groove 912 penetrating the current light confining layer 910a, the etching stop layer 907, and the epitaxial growth promoting layer 906 to reach the surface of the second cladding layer 905 is formed.

The current light confining layer 910a consists of an n-$Al_{0.2}Ga_{0.8}As$ first light transmitting layer 908 having a thickness of 0.2 µm, an n-GaAs light absorbing layer 909 having a thickness of 0.1 µm, an n-$Al_{0.2}Ga_{0.8}As$ second light transmitting layer 910 having a thickness of 0.2 µm, and an n-$Al_{0.5}Ga_{0.5}As$ epitaxial growth support layer 911 having a thickness of 0.05 µm deposited successively on the etching stop layer 907.

On the current light confining layer 910a and the stripe-shaped groove 912, a p-$Al_{0.55}Ga_{0.45}As$ third cladding layer 913 having a thickness of 2.0 µm and a p-GaAs contact layer 914 having a thickness of 5.0 µm are formed.

The reference numerals 915 and 916 denote an n-electrode formed on the back face of the n-GaAs substrate 901 and a p-electrode formed on the p-GaAs contact layer 914. The length of the resonator of the laser element 900 is 250 μm. An $Al_2O_3$ film and an Si film are formed on a light emitting end face and an end face on the side opposite thereto so as to have reflectances of 7% and 90%, respectively.

The fabrication method of the laser element of Example 6 will be described.

On the n-GaAs substrate 901, the first cladding layer 902, the active layer 903, the high refractive index layer 904 and the second cladding layer 905 are successively formed by MBE method so as to constitute the semiconductor laminated structure 900a. Subsequently, the epitaxial growth promoting layer 906 and the etching stop layer 907 are formed on the second cladding layer 905 in this order by MBE method. Then, the first light transmitting layer 908, the light absorbing layer 909, the second light transmitting layer 910, and the epitaxial growth support layer 911 are successively formed on the etching stop layer 907.

Thereafter, the stripe-shaped groove 912 reaching the p-GaAs epitaxial growth promoting layer 906 from the epitaxial growth support layer 911 is formed. Successively, the p-$Al_{0.55}Ga_{0.45}$ third cladding layer 913 is formed by LPE method so as to have a thickness of 2.0 μm outside the stripe-shaped groove. The third cladding layer is grown so as to fill the stripe-shaped groove 912 while removing the p-GaAs epitaxial growth promoting layer 906. With this process, the current light confining layer 910a having the stripe-shaped groove 912 is formed.

The contact layer 914 having a thickness of 5.0 μm is grown on the third cladding layer 913 by LPE method. An n-electrode 915 and a p-electrode 916 are formed on the back face of the n-GaAs substrate 901 and on the surface of the p-GaAs contact layer 914, respectively.

Next, the functional effect will be described.

Figure 12:
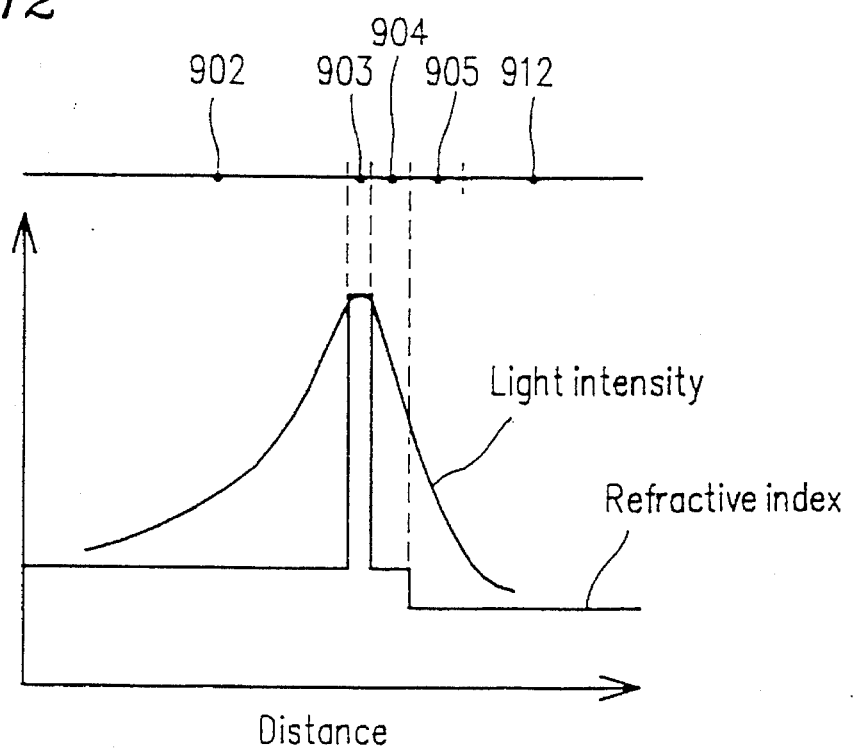
FIG. 12 is a graph showing the refractive index profile and the light intensity profile in the thickness direction inside a stripe-shaped portion of the semiconductor laser element according to the sixth example.

FIG. 12 shows the refractive index profile and the light intensity profile in the thickness direction inside the stripe-shaped groove 912 of the laser element of Example 6. The light less exudes into the side of the light absorbing layer because the refractive index of the n-first cladding layer 902 of side of the n-GaAs substrate 901 is larger than that of the p-second cladding layer 905 on the side of light absorbing layer. Furthermore, since the p-high refractive index layer 904 having a high refractive index is interposed between the p-second cladding layer 905 and the active layer 903, the light intensity increases in the vicinity of the active layer 903 of the second cladding layer 905 side. In this case, the rate of the light being distributed in the active layer is increased as compared with the case where the high refractive index layer 904 is not placed. As a result, the profile of the light intensity in the thickness direction is such that the light is exuded into the n-GaAs substrate 901 rather than into the light absorbing layer while being confined in the active layer 903. In such a case, a half-width $\theta\perp$ of the radiation angle in the vertical direction of the emitted laser light is 25°.

In the laser element 900 of Example 6, in the case where the thickness of the p-second cladding layer 905 is 0.3 μm, the equivalent refractive index difference Δn corresponding to the thickness is $2.5\times10^{-3}$. Moreover, the obtained coefficient Γact.out is 0.15. Therefore the equivalent refractive index difference Δn and the coefficient Γact.out can be set at values within the range where allowing the self-induced oscillation, respectively.

Moreover, since the coefficient Γact.out can be set at a relatively large value, the half width θ< of the radiation angle in the horizontal direction can be set at 11.0° as shown in FIG. 17. As a result, it is possible to set the ellipticity $\theta\perp/\theta<$ of the radiated light (emitted laser light) at 2.5 or less.

Furthermore, since it is possible for the p-second cladding layer 905 to have a small thickness, the semiconductor laser element requires low driving current and driving voltage.

As described above, in the laser element 900 of Example 6, all the performances (1), (2) and (3) required for the high-power laser element described above can be satisfied.

EXAMPLE 7

Figure 24:
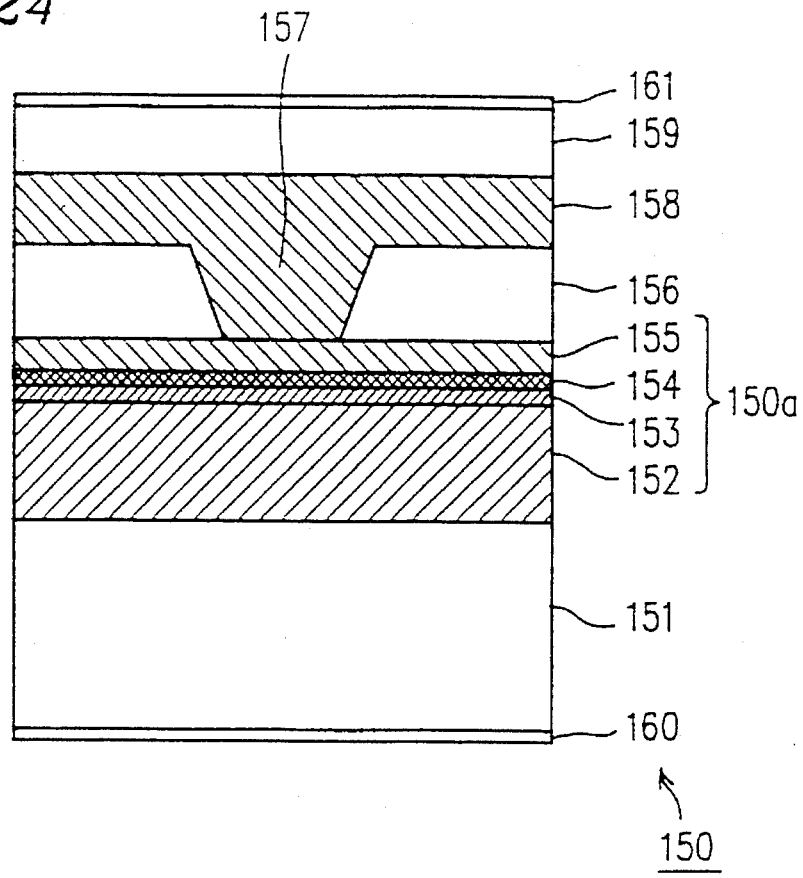
FIG. 24 is a cross-sectional view showing the structure of a semiconductor laser element according to a seventh example of the present invention.

FIG. 24 is a cross-sectional view of a low-power semiconductor laser element according to a seventh example of the present invention. In this figure, the reference numeral 150 denotes a low-power semiconductor laser element of Example 7. In the semiconductor laser element 150, the semiconductor laminated structure 500a in the laser element of Example 2 is substituted by a semiconductor laminated structure 150a including a low refractive index first cladding layer (hereinafter, referred simply as low refractive index layer) 153, an active layer 154, and a second cladding layer 155 formed successively on a first cladding layer 152.

More specifically, the semiconductor laminated structure 150a is formed on an n-GaAs substrate 151 as shown in FIG. 24. The first cladding layer 152 and the low refractive index layer 153 consist of an n-$Al_{0.53}Ga_{0.47}$As layer having a thickness of 1.0 μm and an n-$Al_{0.6}Ga_{0.4}$As layer having a thickness of 0.3 μm, respectively. The active layer 154 and the second cladding layer 155 consist of an undoped $Al_{0.14}Ga_{0.86}$As active layer having a thickness of 0.08 μm and a p-$Al_{0.6}Ga_{0.4}$As layer having a thickness of 0.25 μm, respectively.

On the semiconductor laminated structure 150a, an n-GaAs current light confining layer 156 having a thickness of 0.6 μm with a stripe-shaped groove 157 formed in the middle portion thereof is formed. On the current light confining layer 156, a p-$Al_{0.6}Ga_{0.4}$As third cladding layer 158 having a thickness of 2.0 μm and a p-GaAs contact layer 159 having a thickness of 5.0 μm are successively formed.

The reference numerals 161 and 160 denote a p-electrode formed on the contact layer 159 and an n-electrode formed on the back face of the n-GaAs substrate 151.

The length of the resonator of the laser element 150 is 200 μm. An $Al_2O_3$ film is formed on an light emitting end face so as to have a reflectance of 30%.

Next, the fabrication method of the laser element of Example 7 will be described.

In the fabrication method of the semiconductor laser element of Example 7, each semiconductor layer is formed by the MOCVD method as in the fabrication method of the semiconductor laser element of Example 2.

On the n-GaAs substrate 151, the first cladding layer 152, the low refractive index layer 153, the active layer 154, the second cladding layer 155 and the current light confining layer 156 are successively formed by the MOCVD method so as to have the above predetermined thicknesses, respectively.

Next, the stripe-shaped groove 157 reaching the second cladding layer 155 from the surface of the current light confining layer 156 is formed. Thereafter, the third cladding layer 158 is formed on the current light confining layer 156 so as to fill the stripe-shaped groove 157. The contact layer 159 is formed on the third cladding layer 158.

Then, the n-electrode 160 and the p-electrode 161 are formed. An $Al_2O_3$ film is formed on a light emitting end face of the resonator end faces which are formed by cleavage of wafer so that the light emitting end face has a reflectance of 30%.

Next, the functional effect will be described.

Figure 25:
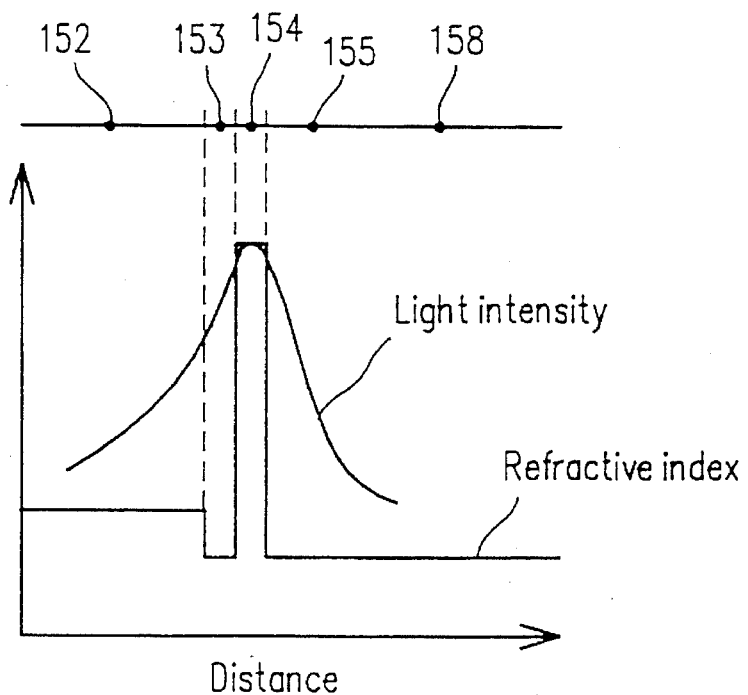
FIG. 25 is a graph showing the refractive index profile and the light intensity profile in the thickness direction inside a stripe-shaped portion of the semiconductor laser element according to the seventh example.

FIG. 25 shows the refractive index profile and the light intensity profile in the thickness direction in the stripe-shaped groove 157 of the laser element 150 having the structure of Example 7. The rate of the light confined in the active layer 154 to be a peak in the active layer 154 is high since the n-low refractive index layer 153 having a lower refractive index than that of the n-first cladding layer 152 is formed on the n-first cladding layer 152 side of the active layer 154. Furthermore, since the first cladding layer 152 includes the portion having a low refractive index, an interface, at which the refractive index becomes large, is formed in the path through which the light travels from the active layer to the substrate side. As a result, the amount of light exuding from the active layer to the first cladding layer is increased in the first cladding layer as a whole. Thus, the light is restrained from exuding into the p-second cladding layer.

Since the amount of the light exuding into the current light confining layer 156 is reduced, it is possible to set the thickness of the p-second cladding layer at a small value. Furthermore, it is possible to increase the rate of light confined in the active layer by providing the low refractive index layer 153 so that the low refractive index layer 153 is adjacent to the active layer 154.

Figure 38:
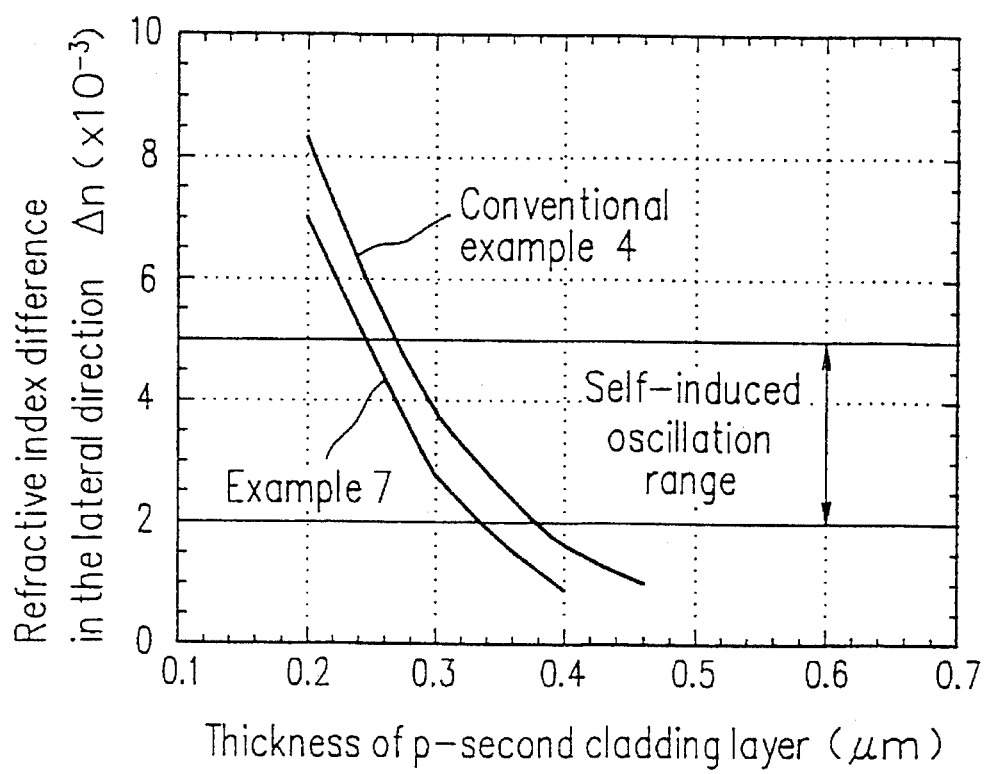
FIG. 38 is a graph showing the relationship between the refractive index difference in the horizontal direction and the thickness of the p-second cladding layer for the comparison of Conventional Example 4 and Example 7.

FIG. 38 shows the relationship between the thickness of the p-second cladding layer of Example 7 and the equivalent refractive index difference $\Delta n$ and also shows that of Conventional Example 4 for comparison. In Example 7, the thickness of the p-second cladding layer, by which the same equivalent refractive index as that of Conventional Example 4 is obtained, can be set at small value as compared with Conventional Example 4. In the case where the p-cladding layer has a thickness of 0.25 μm, the equivalent refractive index difference $\Delta n$ is $4.6 \times 10^{-3}$. Furthermore, the coefficient $\Gamma$act.out of Example 7 is 0.28, which is larger than that obtained in Conventional Example 4. Thus, since the ratio $\Gamma$act.out/$\Delta n$ is above 50, i.e., 61, the self-induced oscillation intensity can be increased and therefore the noise can be reduced.

In Example 7, since the thickness of the p-second cladding layer can be set at a small value, it is possible to reduce the unavailable current and the resistance of the element. Accordingly, it is possible to lower the driving current and the driving voltage required for the laser element. Thus, it is possible to drive the laser element at the output of 3 mW with the driving current of 35 mA and the driving voltage of 1.8 V in this example. Furthermore, since it is possible to increase the amount of the light confined in the active layer, the structure of the laser element of Example 7 is effective in reducing the oscillation threshold current. Thus, the structure contributes to the reduction of driving current.

Although the case where the refractive index of the n-low refractive index layer 153 is the same as that of the p-second cladding layer 155 is described in this example, the same effect can be obtained even in the cases where the refractive indices of the layers 153 and 155 are different from each other.

EXAMPLE 8

Figure 26:
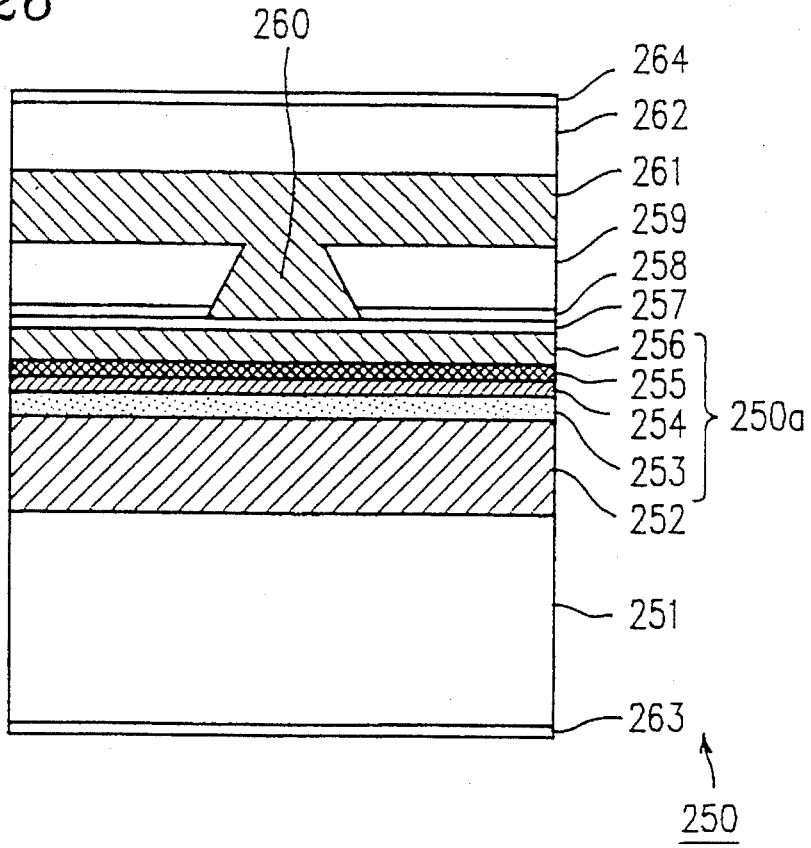
FIG. 26 is a cross-sectional view showing a structure of a semiconductor laser element according to an eighth example of the present invention.

FIG. 26 is a cross-sectional view of a semiconductor laser element according to an eighth example of the present invention. In this figure, the reference numeral 250 denotes a semiconductor laser element of Example 8. The semiconductor laser element 250 adopts the structure of the semiconductor laser element 100 of Example 1 further including an intermediate layer interposed between the active layer and the low refractive index layer on the first cladding layer side.

More specifically, an n-GaAs substrate is used as a substrate 251 in the semiconductor laser element 250. A first cladding layer 252 consists of an n-$Al_{0.5}Ga_{0.5}As$ layer having a thickness of 1.5 μm, and a low refractive index first cladding layer (hereinafter, referred simply as low refractive index layer) 253 consists of an n-$Al_{0.55}Ga_{0.45}As$ layer having a thickness of 0.2 μm. The intermediate first cladding layer (hereinafter, referred simply as intermediate layer) 254 and the active layer 255 consist of an n-$Al_{0.5}Ga_{0.5}As$ layer having a thickness of 0.1 μm and an undoped $Al_{0.14}Ga_{0.86}As$ layer having a thickness of 0.06 μm, respectively. The second cladding layer 256 consists of a p-$Al_{0.55}Ga_{0.45}As$ layer having a thickness of 0.30 μm. The first cladding layer 252, the low refractive index layer 253, the intermediate layer 254, the active layer 255, and the second cladding layer 256 constitute a semiconductor laminated structure 250a for emitting the laser light.

On the second cladding layer 256, a p-GaAs epitaxial growth promoting layer 257 having a thickness of 0.003 μm, a p-$Ag_{0.6}Ga_{0.4}As$ etching stop layer 258 having a thickness of 0.02 μm, and an n-GaAs current light confining layer 259 having a thickness of 1.0 μm are successively formed on the second cladding layer 256.

On the middle portion of the second cladding layer 256, a stripe-shaped groove 260 having a width of 4.0 μm penetrating the n-GaAs current confining layer 259 and the p-etching stop layer 258 to reach the p-GaAs epitaxial growth promoting layer 257.

On the n-GaAs current light confining layer 259, a p-$Al_{0.55}Ga_{0.45}As$ third cladding layer 261 having a thickness of 2.0 μm is formed so as to fill the strip-shaped groove 260. A p-GaAs contact layer 262 having a thickness of 5.0 μm is formed on the third cladding layer 261.

The reference numerals 263 and 264 denote an n-electrode formed on the back face of the substrate 251 and a p-electrode formed on the contact layer 262, respectively.

The length of the resonator of the laser element is 375 μm. An $Al_2O_3$ film and a multilayer film which consists of an $Al_2O_3$ film and an Si film are formed on a light emitting end face and on an end face on the side opposite to the light emitting end face so as to have reflectances of 12% and 75%, respectively Next, the fabrication method of the laser element of Example 8 will be described.

The fabrication method of the semiconductor laser element of Example 8 is almost the same as that of Example 1. However, an MBE method and an LPE method are employed in this example, while the MOCVD method and the LPE method are employed in Example 1.

The first cladding layer 252, the low refractive index layer 253, the intermediate layer 254, the active layer 255 the second cladding layer 256, the epitaxial growth promoting layer 257, the etching stop layer 258, and the current light confining layer 259 are successively formed on the n-GaAs substrate 251 by the MBE method.

Then, the stripe-shape groove 260 is formed so as to reach the epitaxial growth promoting layer 257 from the surface of the current light confining layer 259. Thereafter, the third cladding layer 261 is formed on the current light confining layer 259 so as to fill the stripe-shaped groove 260. The contact layer 262 is formed on the third cladding layer 261.

After a p-electrode 264 and an n-electrode 263 are formed, an $Al_2O_3$ film is formed on a light emitting end face of the resonator end faces formed by cleavage of wafer so as to have a reflectance of 30%.

Next, the functional effect will be described.

Figure 27:
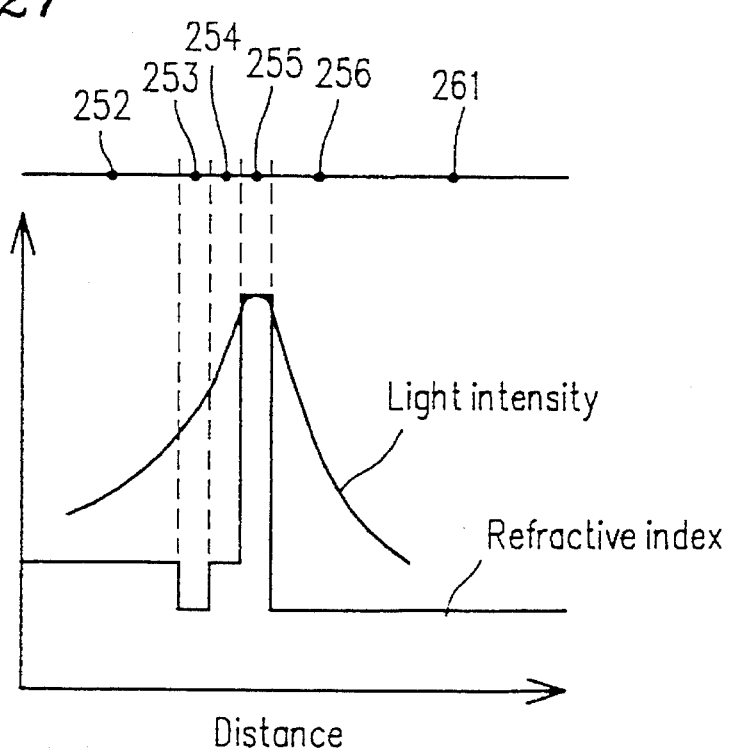
FIG. 27 is a graph showing the refractive index profile and the light intensity profile in the thickness direction inside a stripe-shaped portion of the semiconductor laser element according to the eighth example.

FIG. 27 shows the refractive index profile and the light intensity profile in the thickness direction in the stripe-shaped groove 260 of the laser element 250 having the structure of Example 8. The rate of the light confined in the active layer 255 to be a peak in the active layer 255 and in the vicinity thereof increases since the n-low refractive index layer 253 and the intermediate layer 254 are successively formed on the n-first cladding layer 252 side of the active layer 255. Furthermore, since on the first cladding layer 252 side of the active layer, the portion having a low refractive index than that of the first cladding layer is disposed, the amount of light exuding to the n-first cladding layer is increased. As a result, the light is restrained from exuding into the p-second cladding layer.

Since the amount of the light exuding into the current light confining layer 259 is reduced, it is possible to set the thickness of the p-second cladding layer at a small value. Furthermore, it is possible to increase the rate of light confined in the active layer by providing the low refractive index layer 253 is adjacent to the active layer 255.

Figure 39:
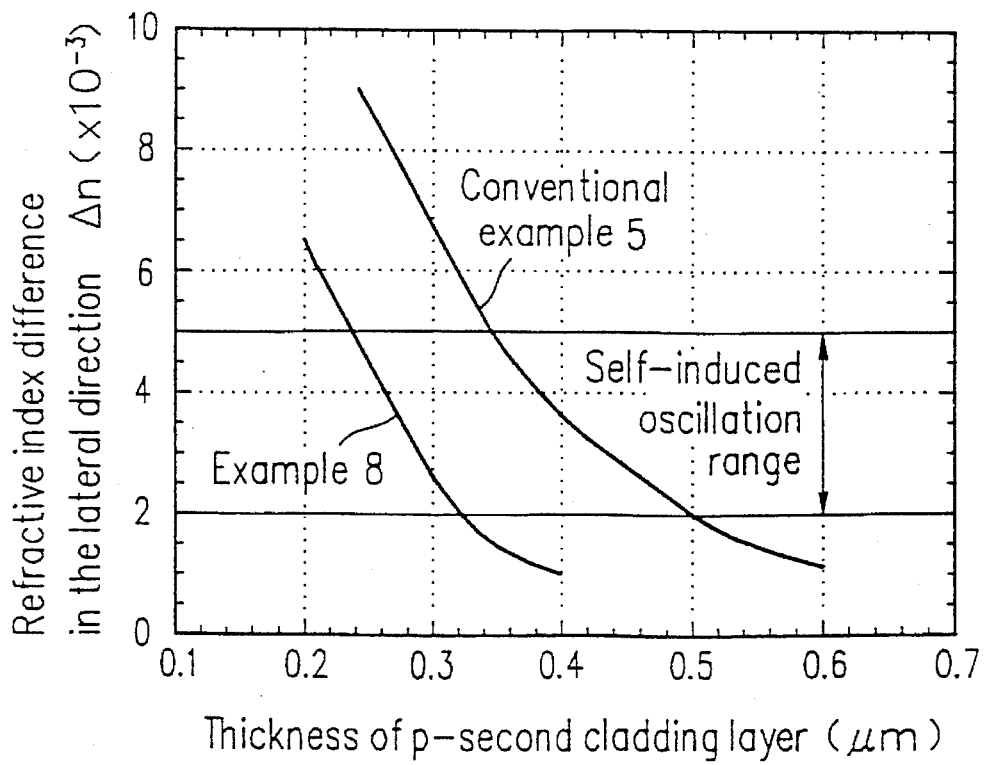
FIG. 39 is a graph showing the relationship between the refractive index difference in the horizontal direction and the thickness of the p-second cladding layer for the comparison of Conventional Example 5 and Example 8.

FIG. 39 shows the relationship between the thickness of the p-second cladding layer of Example 8 and the equivalent refractive index difference Δn and also shows Conventional Example 5 for comparison. In Example 8, the thickness of the p-second cladding layer, by which the same equivalent refractive index is obtained, can be set at a small value as compared with Conventional Example 5. In the case where the p-cladding layer has a thickness of 0.30 μm, the equivalent refractive index difference Δn is $2.7 \times 10^{-3}$. Furthermore, the coefficient Γact.out of Example 8 is obtained to be 0.14, which is larger than that obtained in Conventional Example 5.

Thus, since the ratio Γact.out/Δn is more than 50, i.e., 52, the self-induced oscillation intensity can be increased and therefore the noise can be sufficiently reduced.

In Example 8, since the thickness of the p-second cladding layer can be set at a small value, it is possible to reduce the unavailable current and the resistance of element. Accordingly, it is possible to lower the driving current and the driving voltage required for the laser element. Moreover, it is possible to drive the laser element at the output of 30 mW with the driving current of 100 mA and the driving voltage of 1.8 V in this example.

Although the case where the refractive index of the n-low refractive index layer 253 is the same as that of the p-second cladding layer 256 is described in this example, the same effect can be obtained even in the cases where the refractive indices of the layers 253 and 256 are different from each other.

EXAMPLE 9

Figure 28:
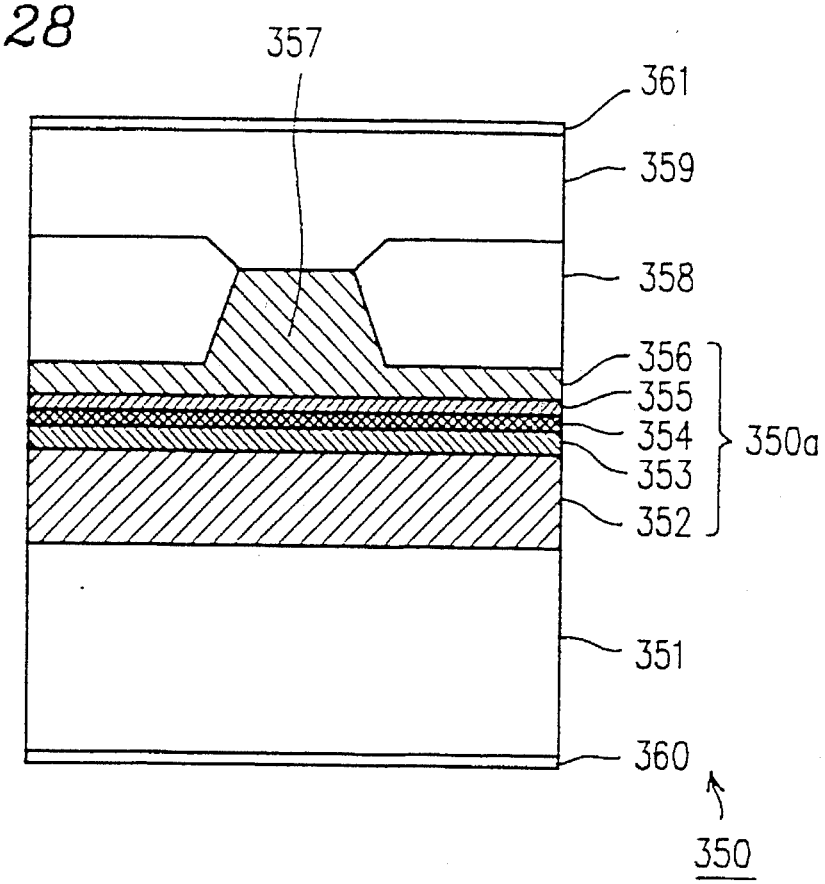
FIG. 28 is a cross-sectional view showing a structure of a semiconductor laser element according to a ninth example of the present invention.

FIG. 28 is a cross-sectional view of a semiconductor laser element according to a ninth example of the present invention. In this figure, the reference numeral 350 denotes a semiconductor laser element of Example 9. The semiconductor laser element 350 adopts the structure of the semiconductor laser element including the low refractive index layer shown in Example 7 interposed between the active layer and the first cladding layer and the high refractive index layer interposed between the active layer and the p-second cladding layer. The laser element 350 has the same structure as that of the semiconductor laser element 600 according to Example 3, except for each semiconductor layer has a thickness slightly different from that of the semiconductor layer in Example 3.

More specifically, a semiconductor laminated structure 350a including a first cladding layer 352, a low refractive index first cladding layer 353, an active layer 354, a high refractive index second cladding layer 355, and a second cladding layer 356 deposited in this order is formed on an n-GaAs substrate 351.

The first cladding layer 352 consists of an $n-Al_{0.5}Ga_{0.5}As$ layer having a thickness of 1.9 μm, and the low refractive index first cladding layer (hereinafter, referred to simply as low refractive index layer) 353 consists of an $n-Al_{0.55}Ga_{0.45}As$ layer having a thickness of 0.2 μm. The active layer 354 is a quantum-well type active layer formed by alternately depositing five undoped $Al_{0.3}Ga_{0.7}As$ layers having a thickness of 0.004 μm and four undoped $Al_{0.1}Ga_{0.9}As$ quantum-well layers having a thickness of 0.01 μm.

The high refractive index second cladding layer (hereinafter, referred to simply as high refractive index layer) 355 consists of a $p-Al_{0.55}Ga_{0.45}As$ layer having a thickness of 0.2 μm. The second cladding layer 356 consists of a $p-Al_{0.6}Ga_{0.4}As$ layer having a thickness of 1.5 μm with a ridge-stripe shaped potion 357 formed in the middle portion thereof.

On the both sides of the ridge-stripe shaped portion 357 of the second cladding layer 356 an n-GaAs current light confining layer 358 having a thickness of 1.0 μm is formed. A p-GaAs contact layer 359 having a thickness of 3.0 μm is formed on the current light confining layer 358.

The reference numerals 360 and 361 denote an n-electrode formed on the back face of the substrate 351 and a p-electrode formed on the contact layer 359, respectively.

The length of the resonator of the laser element is 500 μm. An $SiO_2$ film and a multilayer film which consists of an $Al_2O_3$ film an Si film are formed on a light emitting end face and on an end face on the side opposite to the light emitting end face so as to have reflectances of 12% and 90%, respectively.

Next, the fabrication method of the laser element of Example 9 will be described.

The first cladding layer 352, the low refractive index layer 353, the quantum-well type active layer 354, the high refractive index layer 355, and the second cladding layer 356 are successively formed on the n-GaAs substrate 351 by the MOCVD method so as to have predetermined thicknesses, respectively.

Thereafter, a stripe-shaped SiN film having a width of 3 μm is formed on the p-second cladding layer 356. Then, the p-second cladding layer 356 is etched using the SiN film as a mask, thereby forming the ridge-stripe shaped portion 357. The thickness of the high refractive index layer 355 and the second cladding layer 356 other than the ridge-stripe shaped region 357 is 0.25 μm.

Subsequently, the n-GaAs current light confining layer 358 is selectively grown by the MOCVD method using the stripe-shaped SiN film as a mask so as to fill both sides of the ridge-stripe shaped portion 357. After the SiN film is removed, the p-GaAs contact layer 359 is formed on the entire surface of the n-GaAs current light confining layer 358 by the MOCVD method. Then, the n-electrode 360 and the p-electrode 361 are formed on the back face of the n-GaAs substrate 351 and on the surface of the p-GaAs contact layer 359, respectively.

Thereafter, the cleavage of wafer and the like is performed so that the resonator of the element has a length of 500 μm, thereby forming the resonator end faces. An SiO$_2$ film and a multilayer film which consists of an Al$_2$O$_3$ film and an Si film are formed on a light emitting end face and an end face on the side opposite to the light emitting end face so as to have reflectances of 12% and 90%, respectively.

Next, the functional effect will be described.

Figure 29:
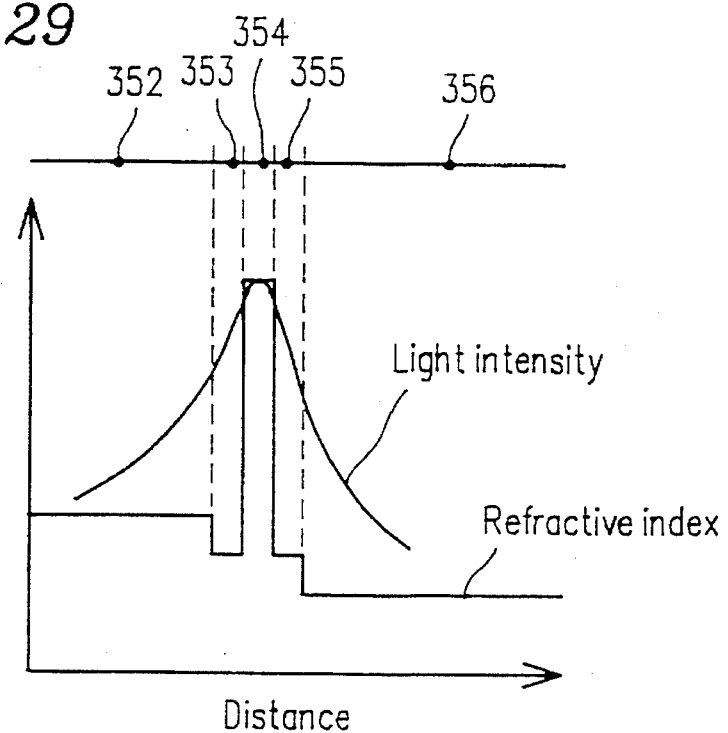
FIG. 29 is a graph showing the refractive index profile and the light intensity profile in the thickness direction inside a stripe-shaped portion of the semiconductor laser element according to the ninth example.

FIG. 29 shows the refractive index profile and the light intensity profile in the thickness direction inside the ridge-stripe shaped portion 357 of the laser element 350 having the structure of Example 9. The rate of the light confined in the active layer 354 to be a peak in the active layer 354 is increased since the n-low refractive index layer 353 having a lower refractive index than that of the first cladding layer 352 is placed on the n-first cladding layer 352 side of the active layer 354. Furthermore, since the first cladding layer 352 includes the portion having a low refractive index, an interface, at which the refractive index becomes large, is formed in the path through which the light passes from the active layer to the substrate. Thus, the amount of light exuding from the active layer 354 to the n-first cladding layer 352 is increased in the first cladding layer as a whole. As a result, the light is restrained from exuding into the p-second cladding layer 356.

Since the amount of the light exuding into the current light confining layer 358 is reduced, it is possible to set the thickness of the p-second cladding layer 356 at a small value. Furthermore, it is possible to increase the rate of light confined in the active layer by providing the low refractive index layer 353 adjacent to the active layer 354.

Since the thickness of the p-second cladding layer 356 can be set at a small value in Example 9, it is possible to reduce the unavailable current and the resistance of element. Accordingly, it is possible to lower the driving current and the driving voltage. Moreover, it is possible to drive the laser element at the output of 30 mW with the driving current of 90 mA and the driving voltage of 1.8 V in this example.

Although the case where the refractive index of the n-low refractive index layer 353 is the same as that of the p-high refractive index layer 355 is described in this example, the same effect can be obtained even in the cases where the refractive indices of the layers 353 and 355 are different from each other.

EXAMPLE 10

Figure 30:
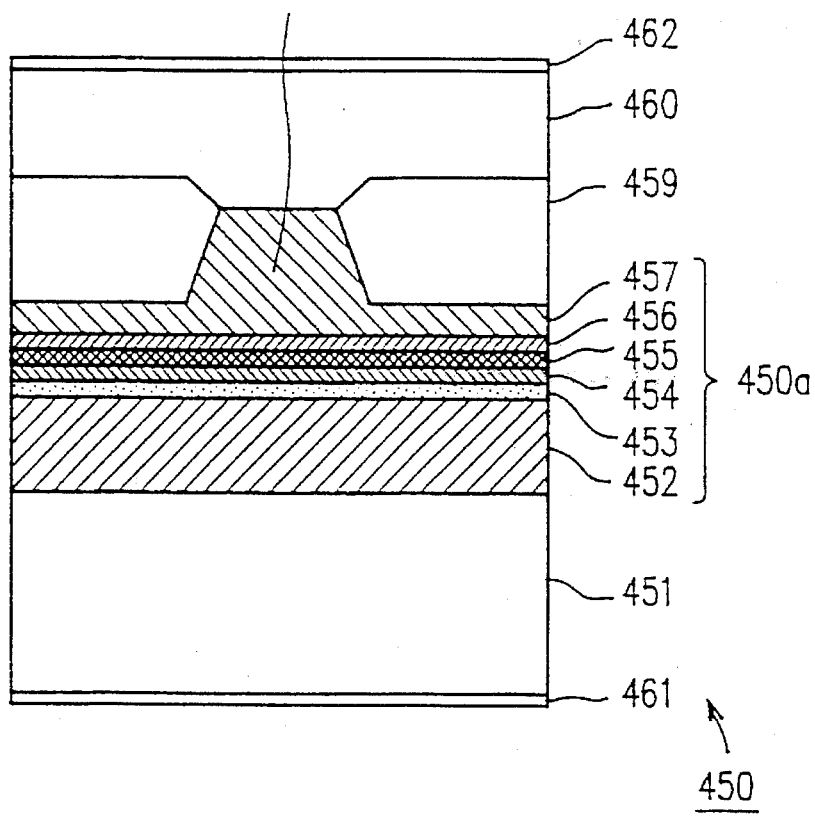
FIG. 30 is a cross-sectional view showing a structure of a semiconductor laser element according to a tenth example of the present invention.

FIG. 30 is a cross-sectional view of a high-power semiconductor laser element according to a tenth example of the present invention. In this figure, the reference numeral 450 denotes a semiconductor laser element of Example 10. The semiconductor laser element 450 adopts the structure of the semiconductor laser element including the low refractive index layer and the intermediate layer shown in Example 8 on the n-first cladding layer side of the active layer and the high refractive index layer shown in Example 9 on the p-second cladding layer side of the active layer.

More specifically, a semiconductor laminated structure 450a including a first cladding layer 452, a low refractive index layer 453, an intermediate first cladding layer (hereinafter, referred to simply as intermediate layer) 454, a strained active layer 455, a high refractive index second cladding layer (hereinafter, referred to as high refractive index layer) 456, and a second cladding layer 457 deposited in this order is formed on an n-GaAs substrate 451.

The first cladding layer 452 consists of an n-(Al$_{0.55}$Ga$_{0.45}$)$_{0.5}$In$_{0.5}$P layer having a thickness of 1.9 μm, and the low refractive index layer 453 consists of an n-(Al$_{0.6}$Ga$_{0.4}$)$_{0.5}$In$_{0.5}$P layer having a thickness of 0.1 μm. The intermediate layer 454 consists of an n-(Al$_{0.55}$Ga$_{0.45}$)$_{0.5}$In$_{0.5}$P layer having a thickness of 0.1 μm. The strained active layer 455 consists of an undoped Ga$_{0.5}$In$_{0.5}$P layer having a thickness of 0.02 μm.

The high refractive index layer 456 consists of a p-(Al$_{0.5}$Ga$_{0.5}$)$_{0.5}$In$_{0.5}$P layer having a thickness of 0.1 μm, and the second cladding layer 457 consists of a p-(Al$_{0.55}$Ga$_{0.45}$)$_{0.5}$In$_{0.5}$P layer having a thickness of 1.5 μm.

The second cladding layer 457 has a ridge-stripe shaped portion 458 in the middle portion thereof. On the both sides of the ridge-stripe shaped portion 458 of the second cladding layer 457, an n-GaAs current light confining layer 459 having a thickness of 0.6 μm is formed. A p-GaAs contact layer 460 having a thickness of 3.0 μm is formed on the current light confining layer 459 and the ridge-stripe shaped portion 458.

The reference numerals 461 and 462 denote an n-electrode formed on the back face of the substrate 451 and a p-electrode formed on the contact layer 460, respectively.

The length of the resonator of the laser element is 500 μm. An Al$_2$O$_3$ film and a multilayer film which consists of an Al$_2$O$_3$ film an Si film are formed on a light emitting end face and on an end face on the side opposite to the light emitting end face so as to have reflectances of 12% and 90%, respectively.

Next, the fabrication method of the laser element of Example 10 will be described.

The first cladding layer 452, the low refractive index layer 453, the intermediate layer 454, the strained active layer 455, the high refractive index layer 456, and the second cladding layer 457 are successively formed on the n-GaAs substrate 451 by the MOCVD method so as to have predetermined thicknesses, respectively.

Thereafter, a stripe-shaped SiN film having a width of 3 μm is formed on the second cladding layer 457. Then, the p-second cladding layer 457 is etched using the SiN film as a mask, thereby forming the ridge-stripe shaped portion 458. The thickness of the high refractive index layer 456 and the second cladding layer 457 other than the ridge-stripe shaped region 458 is 0.25 μm.

Subsequently, the n-GaAs current light confining layer 459 is selectively grown by the MOCVD method using the stripe-shaped SiN film as a mask so as to fill the both sides of ridge-stripe shaped portion 458. After the SiN film is removed, the p-GaAs contact layer 460 is formed on the entire surface of the n-GaAs current light confining layer 459 by the MOCVD method.

Then, the n-electrode 461 and the p-electrode 462 are formed on the back face of the n-GaAs substrate 451 and on the surface of the p-GaAs contact layer 460.

After forming the resonator end faces by cleavage of the wafer and the like, an Al$_2$O$_3$ film and a multilayer film which consists of an Al$_2$O$_3$ film and an Si film are formed on a light emitting end face and an end face on the side opposite to the light emitting end face so as to have reflectances of 12% and 90%, respectively.

Next, the functional effect will be described.

Figure 31:
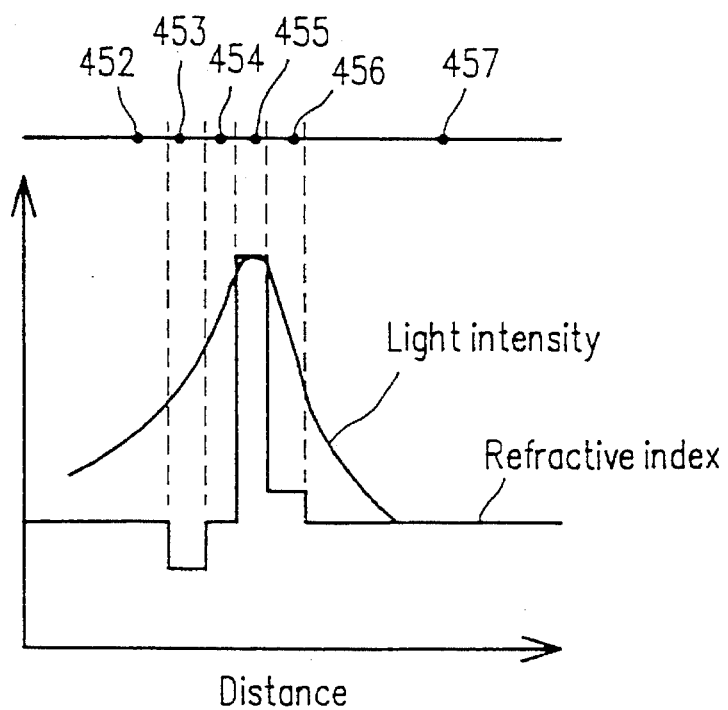
FIG. 31 is a graph showing the refractive index profile and the light intensity profile in the thickness direction inside a stripe-shaped portion of the semiconductor laser element according to the tenth example.

FIG. 31 shows the refractive index profile the light intensity profile in the thickness direction inside the ridge-stripe shaped portion 458 of the laser element 450 having the structure of Example 10. The rate of the light confined in the active layer 455 to be a peak in the active layer 455 is high since the n-low refractive index layer 453 is placed on the n-first cladding layer 452 side of the active layer 455. Furthermore, since the portion having a low refractive index is disposed on the first cladding layer 452 side of the active layer, an interface, at which the refractive index becomes large, is formed in the path through with the light passes from the active layer to the substrate. Thus, the amount of light exuding from the active layer 455 to the n-first cladding layer 452 is increased in the first cladding layer as a whole. As a result, the light is restrained from exuding into the p-second cladding layer 457.

Since the amount of the light exuding into the current light confining layer 459 is reduced, it is possible to set the thickness of the p-second cladding layer 457 at a small value. Furthermore, it is possible to increase the rate of light confined in the active layer by placing the low refractive index layer 453 adjacent to the active layer 455.

Since the thickness of the p-second cladding layer 457 can be set at small value in Example 10, it is possible to reduce the unavailable current and the resistance of element. Accordingly, it is possible to lower the driving current and the driving voltage. Moreover, it is possible to drive the laser element at the output of 30 mW with the driving current of 90 mA, and the driving voltage of 2.0 V in this example.

Although the case where the refractive index of the n-intermediate layer 454 is the same as that of the p-second cladding layer 457 is described in this example, the same effect can be obtained even in the cases where the refractive indices of the layers 454 and 457 are different from each other.

EXAMPLE 11

Figure 32:
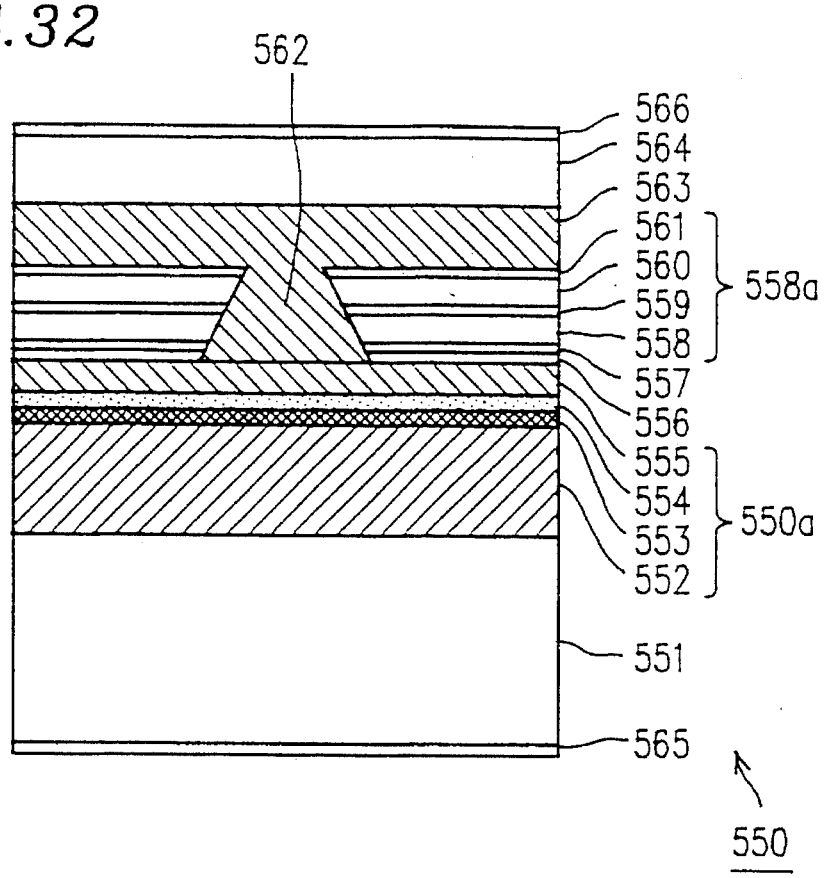
FIG. 32 is a cross-sectional view showing a structure of a semiconductor laser element according to an eleventh example of the present invention.

FIG. 32 is a cross-sectional view of a low-power semiconductor laser element according to an eleventh example of the present invention. In this figure, the reference numeral 550 denotes a low-power semiconductor laser element of Example 11. Although the semiconductor laser element 550 adopts the same structure as that of the semiconductor laser element 900 of Example 6, the thickness of each semiconductor layer constituting the semiconductor laser element 550 is a slightly different from that of Example 6. Components 551 to 562 constituting the semiconductor laser element 550 correspond the components 901 to 912 of the semiconductor laser element 900 of Example 6.

An n-GaAs substrate 551 is used in the semiconductor laser element 500, as shown in FIG. 32. A first cladding layer 552 consists of an n-$Al_{0.5}Ga_{0.5}As$ layer having a thickness of 1.0 μm, and an active layer 553 consists of an undoped $Al_{0.14}Ga_{0.86}As$ layer having a thickness of 0.08 μm.

A high refractive index second cladding layer (hereinafter, referred to simply as high refractive index layer) 554 consists of a p-$Al_{0.5}Ga_{0.5}As$ layer having a thickness of 0.2 μm. The second cladding layer 555 consists of a p-$Al_{0.55}Ga_{0.45}As$ layer having a thickness of 0.25 μm.

A semiconductor laminated structure 550a for emitting the laser element is constituted by the first cladding layer 552, the active layer 553, the high refractive index layer 554, and the second cladding layer 555 deposited in this order.

On the second cladding layer 555, a p-GaAs epitaxial growth promoting layer 556 having a thickness of 0.005 μm and a p-$Al_{0.6}Ga_{0.4}As$ etching stop layer 557 having a thickness of 0.02 μm, and a current light confining layer 558a are formed in this order. The current light confining layer 558a consists of an n-$Al_{0.2}Ga_{0.8}As$ first light transmitting layer 558 having a thickness of 0.2 μm, an n-GaAs light absorbing layer 559 having a thickness of 0.1 μm, an n-$Al_{0.2}Ga_{0.8}As$ second light transmitting layer 560 having a thickness of 0.2 μm, and an n-GaAsAs epitaxial growth support layer 561 having a thickness of 0.05 μm successively formed on the etching stop layer 557.

A stripe-shaped groove 562 reaching the second cladding layer 556 from the surface of the current light confining layer 558a is formed in this semiconductor laser element 550.

A p-$Al_{0.55}Ga_{0.45}As$ third cladding layer 563 having a thickness of 2.0 μm is formed on the stripe-shaped groove 562 and the current light confining layer 558a. An n-GaAs contact layer 564 having a thickness of 5.0 μm is formed on the third cladding layer 563.

The reference numerals 565 and 567 denote an n-electrode formed on the back face of the substrate 551 and a p-electrode formed on the contact layer 564, respectively. The length of the resonator of the laser element is 200 μm. An SiN film is formed on a light emitting end face so as to have a reflectance of 30%.

Next, the fabrication method of the laser element of Example 11 will be described.

First, the first cladding layer 552, the active layer 553, the high refractive index layer 554, and the second cladding layer 555 are successively formed on the n-GaAs substrate 551 by the MOCVD method so as to have predetermined thicknesses, respectively, thereby constituting the semiconductor laminated structure 550a. Thereafter, the epitaxial growth promoting layer 556 and the etching stop layer 557 are successively formed on the semiconductor laminated structure 550a. Furthermore, the first light transmitting layer 558, the light absorbing layer 559, the second light transmitting layer 560, and the epitaxial growth support layer 561 are successively formed as the current light confining layer 558a on the etching stop layer 557.

Subsequently, the current light confining layer 558a and the etching stop layer 557 are selectively etched, thereby forming the stripe-shaped groove 562. The third cladding layer 563 is grown by the LPE method so as to fill the stripe-shaped groove 562 while removing the epitaxial growth promoting layer 556. The contact layer 564 is formed on the third cladding layer 563.

Then, an n-electrode 565 and a p-electrode 566 are formed on the back face of the n-GaAs substrate 551 and on the surface of the contact layer 564.

After forming the resonator end faces by cleavage of the wafer and the like, an SiN film is formed on a light emitting end face so as to have a reflectance of 30%.

Next, the functional effect will be described.

Figure 33:
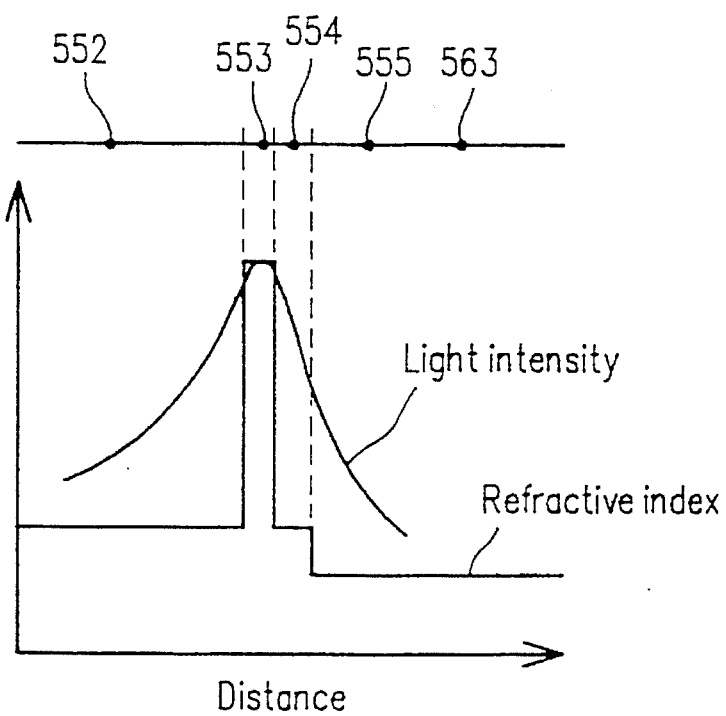
FIG. 33 is a graph showing the refractive index profile and the light intensity profile in the thickness direction inside a stripe-shaped portion of the semiconductor laser element according to the eleventh example.

FIG. 33 shows the refractive index profile and the light intensity profile in the thickness direction inside the ridge-stripe shaped portion 562 of the laser element 550 having the structure of Example 11. Since the p-high refractive index layer 554 is placed on the p-second cladding layer 555 side of the active layer 553, the light intensity increases in the vicinity of the active layer 553 of the second cladding layer side. As a result, the rate of the light confined in the active layer 553 to be a peak in the active layer 553 is high as compared with the case where the high refractive index is not placed. Since an interface, at which the refractive index becomes small, is formed in the path through which the light travels from the active layer 553 to the current light confining layer 558a, the light is restrained from exuding into the p-second cladding layer 555.

Since the amount of the light exuding from the first light confining layer 558 into the second light transmitting layer 560 is reduced, it is possible to set the thickness of the p-second cladding layer 555 at a small value. Furthermore, it is possible to increase the rate of light confined in the active layer 553 by placing the p-second cladding layer 555 having a low refractive index adjacent to the active layer 553.

Since the thickness of the p-second cladding layer 555 can be set at a small value in Example 11, it is possible to reduce the unavailable current and the resistance of the element. Accordingly, it is possible to lower the driving current and the driving voltage. Moreover, it is possible to drive the laser element at the output of 3 mW with the driving current of 25 mA and the driving voltage of 1.75 V in this example.

Although the case where the refractive index of the p-high refractive index layer 554 is the same as that of the n-first cladding layer 552 is described in this example, the same effect can be obtained in cases where the refractive indices of the layers 554 and 552 are different from each other.

EXAMPLE 12

Figure 34:
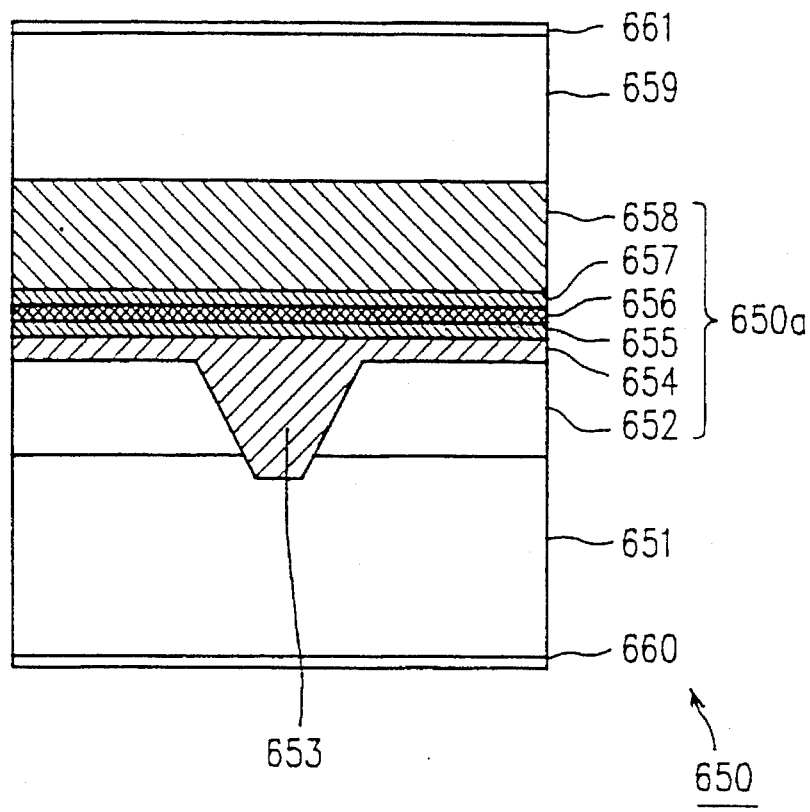
FIG. 34 is a cross-sectional view showing a structure of a semiconductor laser element according to a twelfth example of the present invention.

FIG. 34 is a cross-sectional view of a low-power semiconductor laser element according to a twelfth example of the present invention. In this figure, the reference numeral 650 denotes a low-power semiconductor laser element of Example 12 having a current light confining layer on the substrate side as in the semiconductor laser element 800 of Example 5.

An p-GaAs substrate 651 is used in the semi-conductor laser element 650, as shown in FIG. 34. An n-GaAs current light confining layer 652 having a thickness of 1.0 μm is deposited on the p-GaAs substrate 651. A stripe-shaped groove 653 having a width of 4 μm is formed in the middle portion of the current light confining layer 652 so as to reach the substrate 651. On the entire surfaces of stripe-shaped groove 653 and the current light confining layer 652, a second cladding layer 654, a high refractive index second cladding layer (hereinafter, referred to as p-high refractive index layer) 655, an intermediate second cladding layer (hereinafter, referred simply as intermediate layer) 656, an active layer 657, and a first cladding layer 658 are successively formed.

A second cladding layer 654 consists of a p-$Al_{0.55}Ga_{0.45}As$ layer having a thickness of 0.2 μm outside the stripe-shaped groove 653, and a high refractive index layer 655 consists of a p-$Al_{0.5}Ga_{0.5}As$ layer having a thickness of 0.1 μm. The intermediate layer 656 consists of a p-$Al_{0.55}Ga_{0.45}As$ layer having a thickness of 0.1 μm. The active layer 657 consists of a p-$Al_{0.14}Ga_{0.86}As$ layer having a thickness of 0.08 μm. the first cladding layer 658 consists of an n-$Al_{0.5}Ga_{0.5}As$ layer having a thickness of 1.5 μm.

On the first cladding layer 658, an n-GaAs contact layer 659 having a thickness of 5.0 μm is formed, The reference numerals 661 and 660 denote an n-electrode formed on the surface of the contact layer 659 and a p-electrode formed on the back face of the substrate 651, respectively.

The length of the resonator of the laser element is 200 μm. An SiN film is formed on a light emitting end face so as to have a reflectance of 30%.

Next, the fabrication method of the laser element of Example 12 will be described.

The n-GaAs current light confining layer 652 is formed on the p-GaAs substrate 651 by the LPE method. Then, the strip-shaped groove 653 is formed in the predetermined region of the current light confining layer 652 so as to reach the substrate 651. Thereafter, the second cladding layer 654 is formed on the current light confining layer 652 by the LPE method so as to fill the stripe-shaped groove 653. The high refractive index layer 655, the intermediate layer 656, the active layer 657, the first cladding layer 658 and the contact layer 659 are successively formed on the second cladding layer 654.

Then, the n-electrode 661 and the p-electrode 660 are formed on surface of the contact layer 659 and the back face of the p-GaAs substrate 651. After forming the resonator end faces by cleavage of the wafer and the like, an SiN film is formed on a light emitting end face so as to have a reflectance of 30%.

Next, the functional effect will be described.

Figure 35:
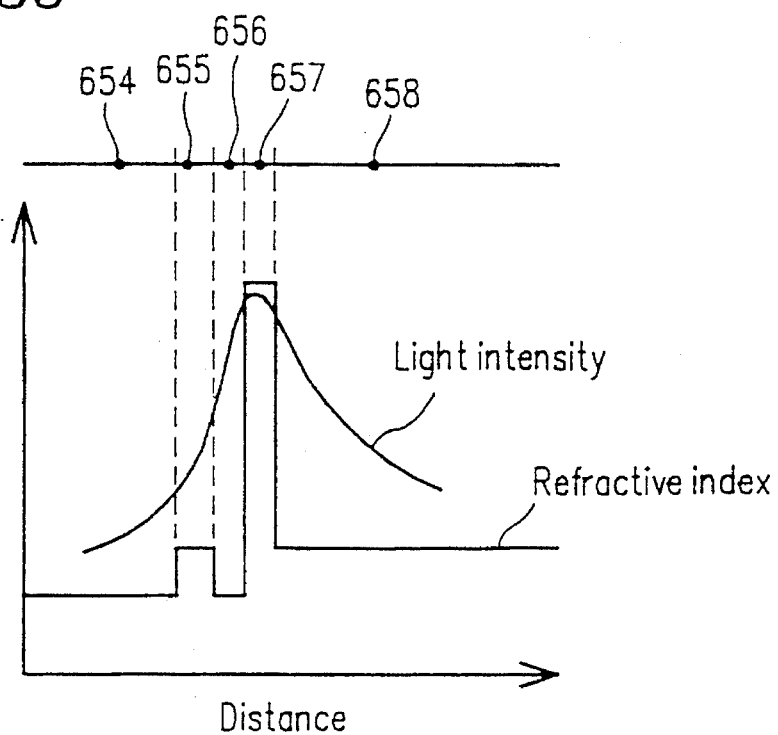
FIG. 35 is a graph showing the refractive index profile and the light intensity profile in the thickness direction inside a stripe-shaped portion of the semiconductor laser element according to the twelfth example.

FIG. 35 shows the refractive index profile and the light intensity profile in the thickness direction inside the stripe-shaped groove 653 of the laser element 650 having the structure of Example 12. Since the p-high refractive index layer 655 is placed on the p-second cladding layer 654 side of the active layer 657, the light intensity increases in the vicinity of the active layer 657 of the second cladding layer side. Moreover, since an interface, at which the refractive index becomes small, is formed in the path through which the light travels from the active layer 657 to the current light confining layer 652, the light is restrained from exuding into the p-second cladding layer 645 side.

Since the amount of the light exuding into the first light confining layer 652 is reduced, it is possible to set the thickness of the p-second cladding layer 645 at a small value. Furthermore, it is possible to increase the rate of light confined in the active layer 657 by placing the intermediate layer 656 so as to be adjacent to the active layer 657.

Since the thickness of the p-second cladding layer 645 can be set at small value in Example 12, it is possible to reduce the unavailable current and the resistance of the element. Accordingly, it is possible to lower the driving current and the driving voltage. Moreover, it is possible to drive the laser element at the output of 3 mW with the driving current of 25 mA, and the driving voltage of 1.8 V in this example.

Although the case where the refractive index of the p-high refractive index layer 655 is the same as that of the n-first cladding layer 658 is described in this example, the same effect can be obtained even in the cases where the refractive indices of the layers 655 and 658 are different from each other. Moreover, the case where the refractive indices of the low refractive index layer, the intermediate layer, and the high refractive index layer change in stages is described in the above examples, the present invention is also applicable to the case where the refractive indices gradually change.

The present invention is not limited to the above examples and also applicable to the cases where the different thicknesses of semiconductor layers or the different mixed crystal ratios are employed as long as they have the effect of the present invention.

Furthermore, the layer structures and the materials other than those described in the above examples can be employed as long as they have the effect of the present invention.

Although the MOCVD method, MBE method, and LPE method are shown as the growth methods, other methods such as an MOMBE method and an ALE method can also be used.

As is evident from the foregoing description, according to the present invention, the refractive index of a first cladding layer, i.e., a cladding layer of the substrate side is set so as to be larger than that of a second cladding layer, i.e., a cladding layer of the current light confining layer side, light is restrained from exuding into the current light confining layer. Therefore, the equivalent refractive index difference can be set at a small value within the range assuring the self-induced oscillation of laser light without increasing the thickness of the second cladding layer.

A low refractive index layer having a refractive index lower than that of the first cladding layer is interposed between the first cladding layer and the active layer, and the rate of the light distributed in the active layer is restrained from being lowered by setting the refractive index of the first cladding layer at a larger value than that of the second cladding layer. Therefore, with this restraint, it is possible to set the rate of the light confined in the active layer outside the stripe-shaped groove at a value within the range where the self-induced oscillation is allowed and a half width of the radiation angle in the horizontal direction is 11° or more.

As a result, since the equivalent refractive index difference and the coefficient Γact.out are within the range where the self-induced oscillation is allowed, the self-induced oscillation can be performed for certain.

Moreover, since the thickness of the second cladding layer is kept at a small value, the unavailable power and the resistance in the cladding layer are small. Therefore, the laser element which needs small driving current, driving voltage and consumption power can be realized.

Furthermore, since the half width of the radiation angle in the horizontal direction is 11° or more and therefore the ellipticity of the emitted light can be kept at 2.5 or less, the optical coupling efficiency with a collimator lens and the like can be prevented from being lowered.

Furthermore, according to the method for adjusting the self-induced oscillation of the semiconductor laser element, the refractive index of the first cladding layer (the cladding layer of the substrate side) is set so as to be larger than that of the second cladding layer (the cladding layer of the current light confining layer side), and the light is restrained from exuding into the current light confining layer. Therefore, it is possible to set the equivalent refractive index difference inside and outside the stripe-shaped groove at a small value within the range where the self-induced oscillation of laser light is possible without increasing the thickness of the second cladding layer. Moreover, since a high refractive index layer having a higher refractive index than that of the second cladding layer is interposed between the second cladding layer and the active layer, the light intensity increases in the vicinity of the active layer of the second cladding layer side. As a result, the rate of the light distributed in the active layer is increased as compared with the case where the high refractive index layer is not placed between the second cladding layer and the active layer, thereby restraining the rate of the light confined in the active layer from being lowered by setting the refractive index of the first cladding layer at a value larger than that of the second cladding layer.

As in the same manner described above, it is possible to set the rate of the light confined in the active layer outside the stripe-shaped groove at a value within the range where the self-induced oscillation is allowed and a half width of radiation angle in the horizontal direction is 11° or more.

Furthermore, according to the semiconductor laser element of the present invention, the equivalent refractive index difference Δn between inside and outside of the stripe-shaped groove and the rate (Γact.out) of light confined in the active layer outside the stripe-shaped groove are set at values in the predetermined ranges, respectively, thereby adjusting the intensity of self-induced oscillation. Therefore, the structure of an element, in which the self-induced oscillation is possible, can be realized for certain and with ease without need to increase the thickness of the second cladding layer as well as keeping the ellipticity of the emitted laser light at a small value.

Furthermore, according to the semiconductor element of the present invention, the refractive index of at least part of the first cladding layer (i.e., the cladding layer of the substrate side) in the vicinity of the active layer is set so as to be smaller than that of the other region of the first cladding layer. Since an interface, at which the refractive index becomes large, is formed in an optical path through which the light travels from the active layer toward the substrate side, the exudation of the light from the active layer into the first cladding layer is promoted. Thus, the amount of the light exuding into the first cladding layer is increased, thereby restraining the light from exuding into the current light confining layer of the second cladding layer side.

Moreover, the rate of the light confined in the active layer is effectively restrained from being lowered by providing the low refractive index layer in the vicinity of the active layer.

Therefore, it is possible to reduce the equivalent refractive index difference Δn as well as to restrain the rate of the light confined in the active layer Γact.out from being lowered without setting the thickness of the p-second cladding layer at an extremely large value.

With this structure, it is possible to prevent the increase in the unavailable current and the resistance of the element caused with the increase in the thickness of the second cladding layer as well as lower the noise by the self-induced oscillation. As a result, a self-induced oscillation type laser with low noise which consumes little power with reduced driving current and driving voltage can be realized.

Furthermore, according to the semiconductor element of the present invention, the refractive index of at least part of the second cladding layer (i.e., the cladding layer of the current light confining layer side) in the vicinity of the active layer is set so as to be larger than that of the other region of the second cladding layer. Therefore, since an interface, at which the refractive index becomes small, is formed in an optical path through which the light travels from the active layer toward the current light confining layer side, the light is restrained from exuding from the active layer into the current light confining layer.

Moreover, in the element of the present invention, since the low refractive index region is included in the second cladding layer except for the above high refractive index region, the rate of the light confined in the active layer is restrained from being lowered.

Accordingly, it is possible to prevent the increase in the unavailable current and the resistance of element caused by the increase in the thickness of the second cladding layer as well as to reduce the noise by self-induced oscillation. Therefore, it is possible to realize the self-induced oscillation type laser with low noise which does not consume much power by reducing the driving current and the driving voltage.

Furthermore, according to the method for adjusting the self-induced oscillation of the semiconductor laser element, the difference (Δn) between the equivalent refractive indices inside and outside the stripe-shaped groove and the rate (Γact.out) of the light confined in the active layer are set at values in predetermined ranges, respectively, and the ratio Γact.out/Δn is set at a value larger than a predetermined value, thereby adjusting the intensity of self-induced oscillation. Therefore, it is possible to realize the structure of the element, in which the self-induced oscillation with high intensity is possible for certain, and with ease without increasing the thickness of the second cladding layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the refractive index of the first cladding layer is larger than that of the second cladding layer in the semiconductor laminated structure, and the semiconductor laminated structure includes at least one semiconductor layer of the second-conductivity type having a higher refractive index than that of the second cladding layer, disposed between the second cladding layer and the active layer; and wherein a difference in equivalent refractive indices in a thickness direction between inside and outside the opening is set to be within a range of $1 \times 10^{-3}$ to $4 \times 10^{-3}$, and a rate of light confined in the active layer in the thickness direction outside the opening is set to be within a range of 0.12 to 0.3.

2. A method for adjusting self-induced oscillation intensity of a semiconductor laser, said semiconductor laser comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the refractive index of the first cladding layer is larger than that of the second cladding layer in the semiconductor laminated structure, and the semiconductor laminated structure includes at least one semiconductor layer of the second-conductivity type having a higher refractive index than that of the second cladding layer, disposed between the second cladding layer and the active layer; and wherein a difference in equivalent refractive indices in a thickness direction between inside and outside the opening is set to be within a range of $1 \times 10^{-3}$ to $4 \times 10^{-3}$, and a rate of light confined in the active layer in the thickness direction outside the opening is set to be within a range of 0.12 to 0.3.

wherein the adjustment is conducted by setting the difference in equivalent refractive indices in the thickness direction between inside and outside the opening and the rate of light confined in the active layer in the thickness direction outside the opening at values within the predetermined ranges, respectively.

3. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the refractive index of the first cladding layer is larger than that of the second cladding layer in the semiconductor laminated structure, and the semiconductor laminated structure includes at least one semiconductor layer of the first-conductivity type having a lower refractive index than that of the first cladding layer, disposed between the first cladding layer and the active layer and includes at least one semiconductor layer of the second-conductivity type having a higher refractive index than that of the second cladding layer, disposed between the second cladding layer and the active layer.

4. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current confining layer having an opening, formed on a surface of the second cladding layer on a side opposite to the active layer, for confining a laser driving current and the laser light in a region of the active layer corresponding to the opening, wherein the refractive index of the first cladding layer is larger than that of the second cladding layer in the semiconductor laminated structure, the semiconductor laminated structure includes at least one semiconductor layer of the first-conductivity type having a lower refractive index than that of the first cladding layer, disposed between the first cladding layer and the active layer, and an intermediate layer having a refractive index which is higher than that of the semiconductor layer of the first-conductivity type and is lower than that of the active layer is interposed between the active layer and the semiconductor layer of the first-conductivity type.

5. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current confining layer having an opening, formed on a surface of the second cladding layer on a side opposite to the active layer corresponding to the opening, for confining a laser driving current and the laser light in a region of the active layer corresponding to the opening, wherein the refractive index of the first cladding layer is larger than that of the second cladding layer in the semiconductor laminated structure, the semiconductor laminated structure includes at least one semiconductor layer of the first-conductivity type having a lower refractive index than that of the first cladding layer, disposed between the first cladding layer and the active layer, a difference in equivalent refractive indices in a thickness direction between inside and outside the opening is set to be within a range of $1 \times 10^{-3}$ to $4 \times 10^{-3}$, and a rate of light confined in the active layer in the thickness direction outside the opening is set to be within a range of 0.12 to 0.3.

6. A method for adjusting self-induced oscillation intensity of the semiconductor laser according to claim 5, comprising the steps of setting the difference in equivalent refractive indices in the thickness direction between inside and outside the opening within the range and setting the rate of light confined in the active layer in the thickness direction outside the opening at values within the range.

7. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the first cladding layer includes a region having a refractive index lower than that of a remaining region of the first cladding layer, a difference ($\Delta n$) in equivalent refractive indices in a thickness direction between inside and outside the opening is set to be within a range of $2 \times 10^{-3}$ to $5 \times 10^{-3}$, a rate ($\Gamma$act.out) of light confined in the active layer in the thickness direction outside the opening is set to be within a range of 0.1 to 0.4, and a ratio $\Gamma$act.out/$\Delta n$ is set at a value of 50 or more.

8. A method for adjusting self-induced oscillation intensity of the semiconductor laser according to claim 7, comprising the steps of setting the difference ($\Delta n$) in equivalent refractive indices in the thickness direction between inside and outside the opening within the range, setting the rate ($\Gamma$act.out) of light confined in the active layer in the thickness direction outside the opening at values within the range, and setting the ratio $\Gamma$act.out/$\Delta n$ at the value or more.

9. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the second cladding layer includes a region having a refractive index higher than that of a remaining region of the second cladding layer, a difference ($\Delta n$) in equivalent refractive indices in a thickness direction between inside and outside the opening is set to be within a range of $2 \times 10^{-3}$, to $5 \times 10^{-3}$, a rate ($\Gamma$act.out) of light confined in the active layer in the thickness direction outside the opening is set to be within a range of 0.1 to 0.4, and a ratio $\Gamma$act.out/$\Delta n$ is set at a value of 50 or more.

10. A method for adjusting self-induced oscillation intensity of the semiconductor laser according to claim 9, comprising the steps of setting the difference ($\Delta n$) in equivalent refractive indices in the thickness direction between inside and outside the opening within the range, setting the rate ($\Gamma$act.out) of light confined in the active layer in the thickness direction outside the opening at values within the range, and setting the ratio $\Gamma$act.out/$\Delta n$ at the value or more.

11. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current confining layer having an opening, formed on a surface of the second cladding layer on a side opposite to the active layer, for confining a laser driving current and the laser light in a region of the active layer corresponding to the opening, wherein the semiconductor laminated structure includes a semiconductor layer of the first-conductivity type having a lower refractive index than that of the first cladding layer, disposed between the first cladding layer and the active layer, a refractive index of the second cladding layer is equal to or lower than that of the semiconductor layer, and wherein a refractive index is substantially constant in a thickness direction between the active layer and the current light confining means.

12. A semiconductor laser element according to claim 11, wherein a difference in equivalent refractive indices in a thickness direction between inside and outside the opening is set to be within a range of $1 \times 10^{-3}$ to $4 \times 10^{-3}$ and a rate of light confined in the active layer in the thickness direction outside the opening is set to be within a range of 0.12 to 0.3.

13. A method for adjusting self-induced oscillation intensity of the semiconductor laser according to claim 12, wherein the adjustment is conducted by setting the difference in equivalent refractive indices in the thickness direction between inside and outside the opening and the rate of light confined in the active layer in the thickness direction outside the opening at values within the predetermined ranges, respectively.

14. A semiconductor laser element according to claim 11, wherein a difference (An) in equivalent refractive indices in a thickness direction between inside and outside the opening is set to be within a range of $2\times10^{-3}$ to $5\times10^{-3}$ a rate ($\Gamma$act.out) of light confined in the active layer in the thickness direction outside the opening is set to be within a range of 0.1 to 0.4, and a ratio $\Gamma$act.out/$\Delta$n is set at 50 or more.

15. A method of adjusting self-induced oscillation intensity of the semiconductor laser according to claim 14, wherein the adjustment is conducted by setting the difference ($\Delta$n) in equivalent refractive indices in the thickness direction between inside and outside the opening and the rate ($\Gamma$act.out) of light confined in the active layer in the thickness direction outside the opening at values within the predetermined ranges, respectively, and setting the ratio $\Gamma$act.out/$\Delta$n at a predetermined value or more.

16. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current confining layer having an opening, formed on a surface of the second cladding layer on a side opposite to the active layer, for confining a laser driving current and the laser light in a region of the active layer corresponding to the opening, wherein the semiconductor laminated structure includes a semiconductor layer of the first-conductivity type having a lower refractive index than that of the first cladding layer, disposed between the first cladding layer and the active layer, and an intermediate layer of the second-conductivity type having a refractive index equal to or lower than that of the semiconductor layer; a refractive index of the second cladding layer is lower than that of the intermediate layer.

17. A semiconductor laser element according to claim 16, wherein a difference in equivalent refractive indices in a thickness direction between inside and outside the opening is set to be within a range of $1\times10^{-3}$ to $4\times10^{-3}$ and a rate of light confined in the active layer in the thickness direction outside the opening is set to be within a range of 0.12 to 0.3.

18. A method for adjusting self-induced oscillation intensity of the semiconductor laser according to claim 17, wherein the adjustment is conducted by setting the difference in equivalent refractive indices in the thickness direction between inside and outside the opening and the rate of light confined in the active layer in the thickness direction outside the opening at values within the predetermined ranges, respectively.

19. A semiconductor laser element according to claim 16, wherein a difference (An) in equivalent refractive indices in a thickness direction between inside and outside the opening is set to be within a range of $2\times10^{-3}$ to $5\times10^{-3}$, a rate ($\Gamma$act.out) of light confined in the active layer in the thickness direction outside the opening is set to be within a range of 0.1 to 0.4, and a ratio $\Gamma$act.out/$\Delta$n is set at 50 or more.

20. A method of adjusting self-induced oscillation intensity of the semiconductor laser according to claim 19, wherein the adjustment is conducted by setting the difference ($\Delta$n) in equivalent refractive indices in the thickness direction between inside and outside the opening and the rate ($\Gamma$act.out) of light confined in the active layer in the thickness direction outside the opening at values within the predetermined ranges, respectively, and setting the ratio $\Gamma$act.out/$\Delta$n at a predetermined value or more.

21. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current confining layer having an opening, formed on a surface of the second cladding layer on a side opposite to the active layer, for confining a laser driving current and the laser light in a region of the active layer corresponding to the opening, wherein the semiconductor laminated structure includes a semiconductor layer of the first-conductivity type having a lower refractive index than that of the first cladding layer, disposed adjacent to the first cladding layer, and an intermediate layer of the first-conductivity type having a refractive index higher than that of the semiconductor layer, disposed between the semiconductor layer and the active layer, a refractive index of the second cladding layer is equal to or lower than that of the intermediate layer.

22. A semiconductor laser element according to claim 21, wherein a difference in equivalent refractive indices in a thickness direction between inside and outside the opening is set to be within a range of $1\times10^{-3}$ to $4\times10^{-3}$ and a rate of light confined in the active layer in the thickness direction outside the opening is set to be within a range of 0.12 to 0.3.

23. A method of adjusting self-induced oscillation intensity of the semiconductor laser according to claim 22, wherein the adjustment is conducted by setting the difference in equivalent refractive indices in the thickness direction between inside and outside the opening and the rate of light confined in the active layer in the thickness direction outside the opening at values within the predetermined ranges, respectively.

24. A semiconductor laser element according to claim 21, wherein a difference ($\Delta$n) in equivalent refractive indices in a thickness direction between inside and outside the opening is set to be within a range of $2\times10^{-3}$ to $5\times10^{-3}$, a rate ($\Gamma$act.out) of light confined in the active layer in the thickness direction outside the opening is set to be within a range of 0.1 to 0.4, and a ratio $\Gamma$act.out/$\Delta$n is set at 50 or more.

25. A method for adjusting self-induced oscillation intensity of the semiconductor laser according to claim 24, wherein the adjustment is conducted by setting the difference ($\Delta$n) in equivalent refractive indices in the thickness direction between inside and outside the opening and the rate ($\Gamma$act.out) of light confined in the active layer in the thickness direction outside the opening at values within the predetermined ranges, respectively, and setting the ratio $\Gamma$act.out/$\Delta$n at a predetermined value or more.

26. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the semiconductor laminated structure includes a semiconductor layer of the first-conductivity type having a lower refractive index than that of the first cladding layer, disposed adjacent to the first cladding layer, a first intermediate layer of the first-conductivity type having a refractive index higher than that of the semiconductor layer, disposed between the semiconductor layer and the active layer, and a second intermediate layer of the second-conductivity type having a refractive index equal to or lower than that of the first intermediate layer, disposed between the second cladding layer and the active layer, a refractive index of the second cladding layer is lower than that of the second intermediate layer.

27. A semiconductor laser element according to claim 26, wherein a difference in equivalent refractive indices in a thickness direction between inside and outside the opening is set to be within a range of $1\times10^{-3}$ to $4\times10^{-3}$ and a rate of light confined in the active layer in the thickness direction outside the opening is set to be within a range of 0.12 to 0.3.

28. A method for adjusting self-induced oscillation intensity of the semiconductor laser according to claim 27, wherein the adjustment is conducted by setting the difference in equivalent refractive indices in the thickness direction between inside and outside the opening and the rate of light confined in the active layer in the thickness direction outside the opening at values within the predetermined ranges, respectively.

29. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer, a current light confining means including a current confining layer having an opening, formed on a surface of the second cladding layer on a side opposite to the active layer, for confining a laser driving current and the laser light in a region of the active layer corresponding to the opening; and a substrate disposed on the first cladding layer, wherein the semiconductor laminated structure includes a semiconductor layer of the second-conductivity type having a higher refractive index than that of the second cladding layer, disposed between the second cladding layer and the active layer, a refractive index of the first cladding layer is equal to or higher than that of the semiconductor layer, and wherein a refractive index is substantially constant in a thickness direction between the active layer and the substrate.

30. A semiconductor laser element according to claim 29, wherein a difference in equivalent refractive indices in a thickness direction between inside and outside the opening is set to be within a range of $1\times10^{-3}$ to $4\times10^{-3}$, and a rate of light confined in the active layer in the thickness direction outside the opening is set to be within a range of 0.12 to 0.3.

31. A method for adjusting self-induced oscillation intensity of the semiconductor laser according to claim 30, wherein the adjustment is conducted by setting the difference in equivalent refractive indices in the thickness direction between inside and outside the opening and the rate of light confined in the active layer in the thickness direction outside the opening at values within the predetermined ranges, respectively.

32. A semiconductor laser element according to claim 29, wherein a difference ($\Delta$n) in equivalent refractive indices in a thickness direction between inside and outside the opening is set to be within a range of $2\times10^{-3}$ to $5\times10^{-3}$, a rate ($\Gamma$act.out) of light confined in the active layer in the thickness direction outside the opening is set to be within a range of 0.1 to 0.4, and a ratio $\Gamma$act.out/$\Delta$n is set at 50 or more.

33. A method of adjusting self-induced oscillation intensity of the semiconductor laser according to claim 32, wherein the adjustment is conducted by setting the difference ($\Delta$n) in equivalent refractive indices in the thickness direction between inside and outside the opening and the rate ($\Gamma$act.out) of light confined in the active layer in the thickness direction outside the opening at values within the predetermined ranges, respectively, and setting the ratio $\Gamma$act.out/$\Delta$n at a predetermined value or more.

34. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current light confining layer having an opening, formed on a surface of the second cladding layer on a side opposite to the active layer, for confining a laser driving current and the laser light in a region of the active layer corresponding to the opening, wherein the semiconductor laminated structure includes a semiconductor layer of the second-conductivity type having a higher refractive index than that of the second cladding layer, disposed adjacent to the second cladding layer, and an intermediate layer of the second-conductivity type having a refractive index lower than that of the semiconductor layer, disposed between the semiconductor layer and the active layer, a refractive index of the first cladding layer is higher than that of the second cladding layer.

35. A semiconductor laser element according to claim 34, wherein a difference ($\Delta$n) in equivalent refractive indices in a thickness direction between inside and outside the opening is set to be within a range of $2\times10^{-3}$ to $5\times10^{-3}$, a rate ($\Gamma$act.out) of light confined in the active layer in the thickness direction outside the opening is set to be within a range of 0.1 to 0.4, and a ratio $\Gamma$act.out/$\Delta$n is set at 50 or more.

36. A method of adjusting self-induced oscillation intensity of the semiconductor laser according to claim 35, wherein the adjustment is conducted by setting the difference ($\Delta$n) in equivalent refractive indices in the thickness direction between inside and outside the opening and the rate ($\Gamma$act.out) of light confined in the active layer in the thickness direction outside the opening at values within the predetermined ranges, respectively, and setting the ratio $\Gamma$act.out/$\Delta$n at a predetermined value or more.

37. A semiconductor laser element comprising:

a semiconductor laminated structure for emitting a laser light, including an active layer interposed between a first cladding layer of a first-conductivity type and a second cladding layer of a second-conductivity type, the first cladding layer and the second cladding layer having lower refractive indices than that of the active layer; and a current light confining means including a current confining layer having an opening and an etching stop layer, formed on a surface of the second cladding layer on a side opposite to the active layer, for confining a laser driving current and the laser light in a region of the active layer corresponding to the opening, wherein the semiconductor laminated structure includes a semiconductor layer of the first-conductivity type having a lower refractive index than that of the first cladding layer, disposed between the first cladding layer and the active layer, a refractive index of the second cladding layer is equal to or lower than that of the semiconductor layer, and wherein a refractive index is substantially constant in a thickness direction between the active layer and the current light confining means.

38. A semiconductor laser element according to claim 37, wherein a difference in equivalent refractive indices in a thickness direction between inside and outside the opening is set to be within a range of $1 \times 10^{-3}$ to $4 \times 10^{-3}$, and a rate of light confined in the active layer in the thickness direction outside the opening is set to be within a range of 0.12 to 0.3.

39. A method for adjusting self-induced oscillation intensity of the semiconductor laser according to claim 38, wherein the adjustment is conducted by setting the difference in equivalent refractive indices in the thickness direction between inside and outside the opening and the rate of light confined in the active layer in the thickness direction outside the opening at values within the predetermined ranges, respectively.

40. A semiconductor laser element according to claim 37, wherein a difference ($\Delta n$) in equivalent refractive indices in a thickness direction between inside and outside the opening is set to be within a range of $2 \times 10^{-3}$ to $5 \times 10^{-3}$, a rate ($\Gamma act.out$) of light confined in the active layer in the thickness direction outside the opening is set to be within a range of 0.1 to 0.4, and a ratio $\Gamma act.out/\Delta n$ is set at 50 or more.

41. A method for adjusting self-induced oscillation intensity of the semiconductor laser according to claim 40, wherein the adjustment is conducted by setting the difference ($\Delta n$) in equivalent refractive indices in the thickness direction between inside and outside the opening and the rate ($\Gamma act.out$) of light confined in the active layer in the thickness direction outside the opening at values within the predetermined ranges, respectively, and setting the ratio $\Gamma act.out/\Delta n$ at a predetermined value or more.

42. A semiconductor laser element according to claim 37, wherein the etching stop layer is disposed such that precise formation of the opening is achieved.

* * * * *

UNITED STATES PATENT AND TRADEMARK OFFICE

CERTIFICATE OF CORRECTION

PATENT NO. : 5,592,502

DATED : January 7, 1997

INVENTOR(S) : Matsumoto et al.

It is certified that error appears in the above-identified patent and that said Letters Patent is hereby corrected as shown below:

In column 47, lines 8 and 60, change "(An)" to -- (Δn) --.

Signed and Sealed this

First Day of April, 1997

*Attest:*

BRUCE LEHMAN

*Attesting Officer*   Commissioner of Patents and Trademarks